United States Patent
Oka et al.

(10) Patent No.: US 11,843,881 B2
(45) Date of Patent: *Dec. 12, 2023

(54) IMAGING APPARATUS AND IMAGING METHOD, CAMERA MODULE, AND ELECTRONIC APPARATUS CAPABLE OF DETECTING A FAILURE IN A STRUCTURE IN WHICH SUBSTRATES ARE STACKED

(71) Applicant: Sony Semiconductor Solutions Corporation, Kanagawa (JP)

(72) Inventors: Takumi Oka, Kanagawa (JP); Atsushi Suzuki, Kanagawa (JP); Naoki Kawazu, Kanagawa (JP)

(73) Assignee: Sony Semiconductor Solutions Corporation, Kanagawa (JP)

(*) Notice: Subject to any disclaimer, the term of this patent is extended or adjusted under 35 U.S.C. 154(b) by 0 days.

This patent is subject to a terminal disclaimer.

(21) Appl. No.: 18/153,017

(22) Filed: Jan. 11, 2023

(65) Prior Publication Data

US 2023/0164455 A1     May 25, 2023

Related U.S. Application Data

(63) Continuation of application No. 17/129,553, filed on Dec. 21, 2020, now Pat. No. 11,588,990, which is a
(Continued)

(30) Foreign Application Priority Data

May 31, 2016    (JP) .................................. 2016-109196

(51) Int. Cl.
*H04N 25/70*      (2023.01)
*H01L 27/146*     (2006.01)
(Continued)

(52) U.S. Cl.
CPC ....... *H04N 25/70* (2023.01); *H01L 27/14618* (2013.01); *H01L 27/14634* (2013.01);
(Continued)

(58) Field of Classification Search
CPC .... H04N 25/70; H04N 25/683; H04N 25/766; H04N 25/79; H04N 25/75;
(Continued)

(56) References Cited

U.S. PATENT DOCUMENTS 7,679,658 B2    3/2010    Sakurai et al.
8,538,095 B2    9/2013    Fedele
(Continued)

FOREIGN PATENT DOCUMENTS

CN        1748315 A     3/2006
CN     101488497 A     7/2009
(Continued)

OTHER PUBLICATIONS

Chinese Office Action dated Apr. 25, 2021 in connection with Chinese Application No. 201910716721.5 and English translation thereof.
(Continued)

*Primary Examiner* — Cynthia Segura
*Assistant Examiner* — Angel L Garces-Rivera
(74) *Attorney, Agent, or Firm* — Wolf, Greenfield & Sacks, P.C.

(57) ABSTRACT

The present disclosure relates to an imaging apparatus and an imaging method, a camera module, and an electronic apparatus that are capable of detecting a failure in an imaging device having a structure in which a plurality of substrates are stacked.

The timing at which a row drive unit provided in a second substrate outputs a control signal for controlling accumulation and reading of pixel signals in a pixel array provided in
(Continued)

a first substrate is compared with the timing at which the control signal output from the row drive unit is detected after passing through the pixel array. Depending on whether or not the timings coincides with each other, a failure is detected. The present disclosure can be applied to an imaging apparatus mounted on a vehicle.

20 Claims, 53 Drawing Sheets

Related U.S. Application Data continuation of application No. 16/890,800, filed on Jun. 2, 2020, now Pat. No. 11,089,248, which is a continuation of application No. 16/795,446, filed on Feb. 19, 2020, now Pat. No. 11,082,651, which is a continuation of application No. 16/302,906, filed as application No. PCT/JP2017/020369 on May 31, 2017, now Pat. No. 10,659,707.

(51) Int. Cl.
 H04N 25/79 (2023.01)
 H04N 25/683 (2023.01)
 H04N 25/766 (2023.01)
 H04N 25/75 (2023.01)
(52) U.S. Cl.
 CPC ..... *H01L 27/14636* (2013.01); *H04N 25/683* (2023.01); *H04N 25/766* (2023.01); *H04N 25/79* (2023.01); *H04N 25/75* (2023.01)
(58) Field of Classification Search
 CPC ......... H01L 27/14618; H01L 27/14634; H01L 27/14636
 See application file for complete search history.

(56) References Cited

U.S. PATENT DOCUMENTS

| | | | |
|---|---|---|---|
| 8,711,262 | B2 | 4/2014 | Nakano et al. |
| 8,953,047 | B2 | 2/2015 | Martinussen |
| 9,007,078 | B2 | 4/2015 | Hsieh et al. |
| 9,584,800 | B2 | 2/2017 | Beck et al. |
| 10,659,707 | B2 | 5/2020 | Oka et al. |
| 11,082,651 | B2 * | 8/2021 | Oka ..................... H04N 25/683 |
| 11,089,248 | B2 | 8/2021 | Oka et al. |
| 2004/0255096 | A1 | 12/2004 | Norman |
| 2008/0284876 | A1 | 11/2008 | Makino |
| 2009/0140127 | A1 | 6/2009 | Lee et al. |
| 2010/0245647 | A1 | 9/2010 | Honda et al. |
| 2013/0027565 | A1 | 1/2013 | Solhusvik et al. |
| 2013/0293724 | A1 | 11/2013 | Martinussen |
| 2013/0308029 | A1 | 11/2013 | Yaghmai |
| 2015/0163403 | A1 | 6/2015 | Wakabayashi |
| 2015/0245019 | A1 | 8/2015 | Engelbrecht et al. |
| 2015/0288907 | A1 | 10/2015 | Vampola et al. |
| 2016/0112700 | A1 | 4/2016 | Fei et al. |
| 2017/0162625 | A1 | 6/2017 | Takayanagi et al. |
| 2019/0149758 | A1 | 5/2019 | Nakamura |
| 2019/0297287 | A1 | 9/2019 | Oka et al. |
| 2020/0186733 | A1 | 6/2020 | Oka et al. |
| 2020/0296309 | A1 | 9/2020 | Oka et al. |
| 2021/0112213 | A1 | 4/2021 | Oka et al. |

FOREIGN PATENT DOCUMENTS

| | | |
|---|---|---|
| CN | 101848344 A | 9/2010 |
| CN | 102782839 A | 11/2012 |
| CN | 103579271 A | 2/2014 |
| CN | 103700633 A | 4/2014 |
| CN | 104429057 A | 3/2015 |
| CN | 104637901 A | 5/2015 |
| CN | 104956663 A | 9/2015 |
| CN | 105210363 A | 12/2015 |
| CN | 105379251 A | 3/2016 |
| CN | 105519096 A | 4/2016 |
| CN | 106559489 A | 4/2017 |
| EP | 1881699 A1 | 1/2008 |
| EP | 2 234 387 A1 | 9/2010 |
| EP | 2 871 835 A1 | 5/2015 |
| JP | 2002-296330 A | 10/2002 |
| JP | 2003-347535 A | 12/2003 |
| JP | 2005-093487 A | 4/2005 |
| JP | 2008-109266 A | 5/2008 |
| JP | 2009-118427 A | 5/2009 |
| JP | 2009477207 A | 8/2009 |
| JP | 2009-284470 A | 12/2009 |
| JP | 2010-245368 A | 10/2010 |
| JP | 2013-165399 A | 8/2013 |
| JP | 2014-017834 A | 1/2014 |
| JP | 2015-185604 A | 10/2015 |
| WO | WO 2015/159728 A1 | 10/2015 |

OTHER PUBLICATIONS

Extended European Search Report dated Jul. 4, 2019 in connection with European Application No. 17806771.6.
Extended European Search Report dated Jul. 16, 2020 in connection with European Application No. 20175010.6.
Extended European Search Report dated Sep. 1, 2020 in connection with European Application No. 20185008.8.
International Preliminary Report on Patentability and English Translation thereof dated Dec. 13, 2018 in connection with International Application No. PCT/JP2017/020369.
International Search Report and Written Opinion and English Translation thereof dated Jul. 25, 2017 in connection with International Application No. PCT/JP2017/020369.
Korean Office Action dated Jul. 11, 2020 in connection with Korean Application No. 10-2020-7015938 and English translation thereof.
U.S. Appl. No. 16/302,906, filed Nov. 19, 2018, Oka et al.
U.S. Appl. No. 16/795,446, filed Feb. 19, 2020, Oka et al.
U.S. Appl. No. 16/890,800, filed Jun. 2, 2020, Oka et al.
U.S. Appl. No. 17/129,553, filed Dec. 21, 2020, Oka et al.

* cited by examiner

IMAGING APPARATUS AND IMAGING METHOD, CAMERA MODULE, AND ELECTRONIC APPARATUS CAPABLE OF DETECTING A FAILURE IN A STRUCTURE IN WHICH SUBSTRATES ARE STACKED

CROSS-REFERENCE TO RELATED APPLICATIONS

The present application claims the benefit under 35 U.S.C. § 120 as a continuation application of U.S. application Ser. No. 17/129,553, filed on Dec. 21, 2020, now U.S. Pat. No. 11,588,990, which claims the benefit under 35 U.S.C. § 120 as a continuation application of U.S. application Ser. No. 16/890,800, filed on Jun. 2, 2020, now U.S. Pat. No. 11,089,248, which claims the benefit under 35 U.S.C. § 120 as a continuation application of U.S. application Ser. No. 16/795,446, filed on Feb. 19, 2020, now U.S. Pat. No. 11,082,651, which claims the benefit under 35 U.S.C. § 120 as a continuation application of U.S. application Ser. No. 16/302,906, filed on Nov. 19, 2018, now U.S. Pat. No. 10,659,707, which claims the benefit under 35 U.S.C. § 371 as a U.S. National Stage Entry of International Application No. PCT/JP2017/020369, filed in the Japanese Patent Office as a Receiving Office on May 31, 2017, which claims priority to Japanese Patent Application Number JP2016-109196, filed in the Japanese Patent Office on May 31, 2016, each of which applications is hereby incorporated by reference in its entirety.

TECHNICAL FIELD

The present disclosure relates to an imaging apparatus and an imaging method, a camera module, and an electronic apparatus, and more particularly, to an imaging apparatus and an imaging method, a camera module, and an electronic apparatus that are capable of detecting a failure in a device having a structure in which a plurality of substrates are stacked.

BACKGROUND ART

Imaging devices that capture images have become smaller in size, and are now being used for various purposes.

In recent years, vehicles with driving support functions have become common. With the driving support functions, a scenery in front of the vehicle is captured, and the lane on which the vehicle is running, the vehicle running in front of the vehicle, a pedestrian rushing toward the lane, and the like are recognized in accordance with the captured image. Danger can be avoided in this manner.

In an imaging device as one of such functions, however, erroneous detection is performed when there is a failure. As a result, appropriate driving support cannot be provided. Therefore, there is a possibility that danger might not be avoided with the driving support.

For this reason, an imaging device for vehicles is required to have a function to detect a failure during operation of an analog circuit, according to ISO 26262 (an international standard for functional safety of electrical and/or electronic systems in production automobiles).

While there is such a requirement, a technique for detecting a failure related to disconnection of a horizontal signal line in an imaging device has been suggested (see Patent Documents 1 and 2).

CITATION LIST

Patent Document

Patent Document 1: Japanese Patent Application Laid-Open No. 2009-118427
Patent Document 2: Japanese Patent Application Laid-Open No. 2009-284470

SUMMARY OF THE INVENTION

Problems to be Solved by the Invention

Meanwhile, in the imaging apparatuses that have become common in recent years, a first substrate including photodiodes that generate pixel signals corresponding to the amounts of incident light, and a second substrate including a signal processing unit or the like that performs signal processing on the pixel signals generated by the photodiodes are stacked, and are electrically connected.

With the above mentioned technique for detecting a failure, however, it is not possible to detect a failure in an imaging apparatus having a structure in which a plurality of substrates are stacked.

The present disclosure is made in view of such circumstances, and particularly, aims to enable detection of failures in an imaging apparatus having a structure in which a plurality of substrates are stacked.

Solutions to Problems

An imaging apparatus according to a first aspect of the present disclosure is an imaging apparatus that includes: a first substrate including a pixel and a pixel control line; and a second substrate, the first substrate and the second substrate being stacked on each other. In the imaging apparatus, the second substrate includes a row drive unit and a failure detector. One end of the pixel control line is connected to the row drive unit via a first connection electrode, and the other end of the pixel control line is connected to the failure detector via a second connection electrode. The row drive unit supplies a control signal for controlling operation of the pixel to the pixel control line via the first connection electrode. The failure detector detects a failure in accordance with the control signal supplied via the first connection electrode, the pixel control line, and the second connection electrode.

The first connection electrode and the second connection electrode may be formed with through electrodes penetrating through the first substrate and the second substrate, and the first substrate and the second substrate may be stacked and be electrically connected by the through electrodes.

The pixels may be arranged in an array. The imaging apparatus may further include a control unit that outputs address information about a current target among the pixels and information about timing at which the pixel specified by the address information is controlled. The failure detector may include: a row drive unit that supplies a control signal for controlling operation of the pixel, the row drive unit being specified by the address information output from the control unit; a detector that detects the control signal for controlling operation of the pixel and outputs a detection signal, the control signal being supplied from the row drive unit specified by the address information output from the control unit; and a pulse output failure detector that detects a failure in a pulse output of the control signal, depending on whether or not the detection signal is output when the control signal for controlling operation of the pixel specified by the address information output from the control unit is detected by the detector at the timing at which the pixel specified by the address information is controlled.

The detector may include a switching gate that detects the control signal for controlling operation of the pixel, the switching gate being specified by the address information output from the control unit, and the detector may supply electric power only to the switching gate specified by the address information output from the control unit. When having detected the control signal for controlling operation of the pixel, the switching gate may output a Hi signal to a bus set for each corresponding control signal. The pulse output failure detector may include a plurality of holding units that hold a value for each control signal, the value depending on a signal output to the bus set for each control signal and a signal indicating the timing at which the pixel specified by the address information is controlled, and detects a failure in a pulse output of the control signal, in accordance with the value held by the holding units.

The plurality of holding units may hold a value for each control signal, the value depending on a signal output to the bus set for each control signal and a fixed signal indicating that the pixel specified by the address information is in a controlled state. The pulse output failure detector may detect a failure in a pulse output of the control signal, in accordance with the value held by the holding units.

The row drive unit and the first substrate may be connected by the first connection electrode formed with a through electrode, and the detector and the first substrate may be electrically connected by the second connection electrode formed with another through electrode different from the through electrode.

The control unit may output the address information about the current target among the pixels to the row drive unit and the detector. The row drive unit may output selection information about an address of the row drive unit, the selection information corresponding to the address information. The detector may output selection information about an address of the detector, the selection information corresponding to the address information. The failure detector may include an address select function failure detector that compares the selection information about the address of the row drive unit and the selection information about the address of the detector with the address information output from the control unit, and, in accordance with a result of the comparison, detects a failure in an address select function in the row drive unit and the detector.

An imaging method according to the first aspect of the present disclosure is an imaging method implemented in an imaging apparatus including: a first substrate including a pixel and a pixel control line; and a second substrate, the first substrate and the second substrate being stacked on each other. The second substrate includes a row drive unit and a failure detector. One end of the pixel control line being connected to the row drive unit via a first connection electrode, and the other end of the pixel control line being connected to the failure detector via a second connection electrode. The imaging method includes the steps of: the row drive unit supplying a control signal for controlling operation of the pixel to the pixel control line via the first connection electrode; and the failure detector detecting a failure in accordance with the control signal supplied via the first connection electrode, the pixel control line, and the second connection electrode.

A camera module according to the first aspect of the present disclosure is a camera module that includes: a first substrate including a pixel and a pixel control line; and a second substrate, the first substrate and the second substrate being stacked on each other. In the camera module, the second substrate includes a row drive unit and a failure detector. One end of the pixel control line is connected to the row drive unit via a first connection electrode, and the other end of the pixel control line is connected to the failure detector via a second connection electrode. The row drive unit supplies a control signal for controlling operation of the pixel to the pixel control line via the first connection electrode. The failure detector detects a failure in accordance with the control signal supplied via the first connection electrode, the pixel control line, and the second connection electrode.

An electronic apparatus according to the first aspect of the present disclosure is an electronic apparatus that includes: a first substrate including a pixel and a pixel control line; and a second substrate, the first substrate and the second substrate being stacked on each other. In the electronic apparatus, the second substrate includes a row drive unit and a failure detector. One end of the pixel control line is connected to the row drive unit via a first connection electrode, and the other end of the pixel control line is connected to the failure detector via a second connection electrode. The row drive unit supplies a control signal for controlling operation of the pixel to the pixel control line via the first connection electrode. The failure detector detects a failure in accordance with the control signal supplied via the first connection electrode, the pixel control line, and the second connection electrode.

According to the first aspect of the present disclosure, a first substrate including a pixel and a pixel control line, and a second substrate including a row drive unit and a failure detector are stacked on each other. One end of the pixel control line is connected to the row drive unit via a first connection electrode, and the other end of the pixel control line is connected to the failure detector via a second connection electrode. The row drive unit supplies a control signal for controlling operation of the pixel to the pixel control line via the first connection electrode, and the failure detector detects a failure in accordance with the control signal supplied via the first connection electrode, the pixel control line, and the second connection electrode.

An imaging apparatus according to a second aspect of the present disclosure is an imaging apparatus that includes: a first substrate including a pixel and a vertical signal line connected to the pixel; and a second substrate, the first substrate and the second substrate being stacked on each other. In the imaging apparatus, the second substrate includes a signal supply circuit, an analog-to-digital conversion circuit, and a failure detector. One end of the vertical signal line is connected to the signal supply circuit via a first connection electrode, and the other end of the vertical signal line is connected to the analog-to-digital conversion circuit via a second connection electrode. The signal supply circuit supplies a dummy pixel signal to the vertical signal line via the first connection electrode. The analog-to-digital conversion circuit outputs a digital signal in accordance with the dummy pixel signal. The failure detector detects a failure in accordance with the digital signal.

According to the second aspect of the present disclosure, a first substrate including a pixel and a vertical signal line connected to the pixel, and a second substrate and the first substrate are stacked on each other. The second substrate includes a signal supply circuit, an analog-to-digital conversion circuit, and a failure detector. One end of the vertical signal line is connected to the signal supply circuit via a first connection electrode, and the other end of the vertical signal line is connected to the analog-to-digital conversion circuit via a second connection electrode. The signal supply circuit supplies a dummy pixel signal to the vertical signal line via the first connection electrode. The analog-to-digital conversion circuit outputs a digital signal in accordance with the dummy pixel signal, and the failure detector detects a failure in accordance with the digital signal.

An imaging apparatus according to a third aspect of the present disclosure is an imaging apparatus that includes: a first substrate on which a pixel is mounted; and a second substrate on which a signal processing unit that performs signal processing on an image captured by the pixel is mounted. The first substrate and the second substrate are stacked and are electrically connected, and the signal processing unit detects a failure through the signal processing.

According to the third aspect of the present disclosure, a first substrate on which a pixel is mounted, and a second substrate on which a signal processing unit that performs signal processing on an image captured by the pixel is mounted are stacked on each other and are electrically connected, and the signal processing unit detects a failure through the signal processing.

Effects of the Invention

According to the present disclosure, it is possible to detect a failure in an imaging device having a structure in which a plurality of substrates are stacked.

MODES FOR CARRYING OUT THE INVENTION

Figure 1:
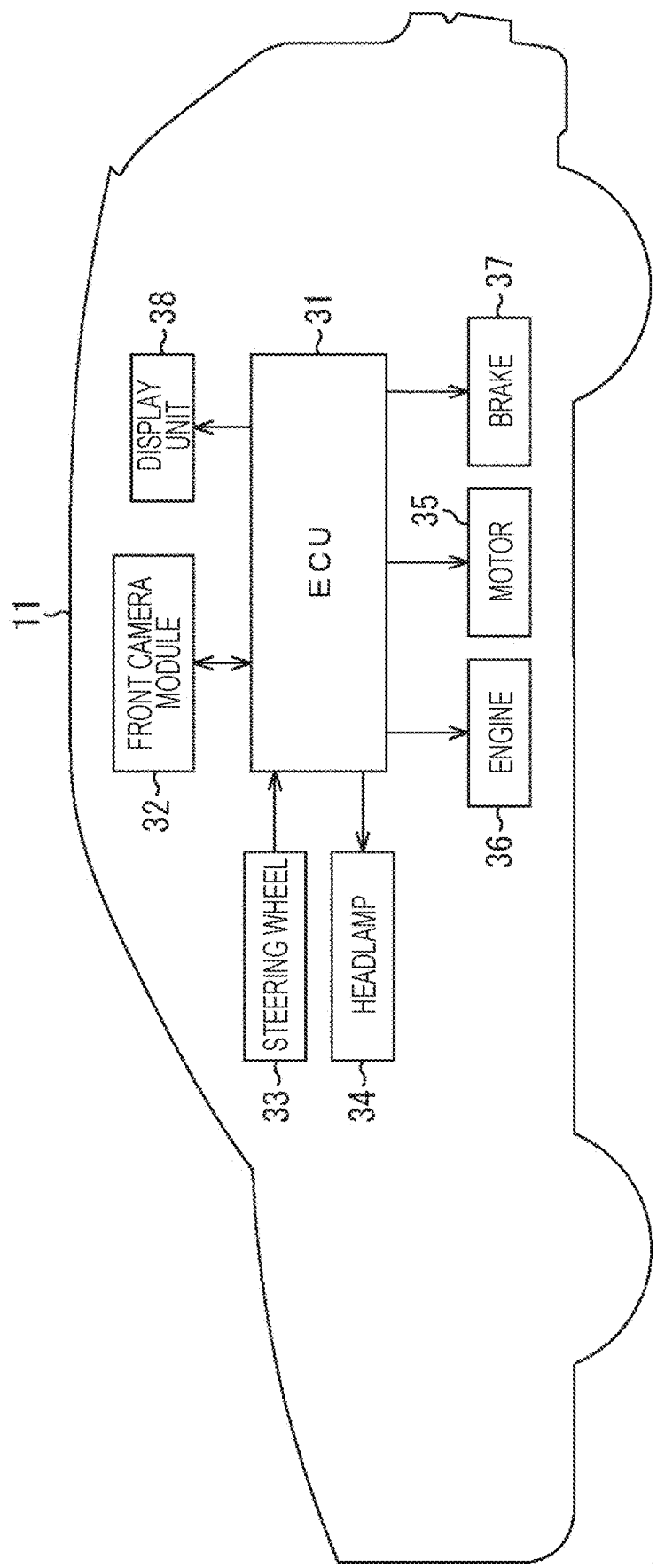
FIG. 1 is a diagram for explaining an example configuration of a vehicle according to the present disclosure.

The following is a detailed description of preferred embodiments of the present disclosure, with reference to the accompanying drawings. It should be noted that, in this specification and the drawings, components having substantially the same functional configurations are denoted by the same reference numerals, and explanation of them will not be repeated.

In addition, in the description below, explanation will be made in the following order.
1. First Embodiment
2. Second Embodiment
3. Third Embodiment
4. Fourth Embodiment
5. Fifth Embodiment
6. Pixel signal TSVs
7. Types of ADCs
8. Example structure of WCSP
9. Example application to an electronic apparatus
10. Examples of use of an imaging device
11. Example applications to moving objects 1. First Embodiment <Example Configuration of a Vehicle of the Present Disclosure>

Referring to FIG. 1, an example configuration of a vehicle according to the present disclosure is described.

A vehicle 11 according to the present disclosure includes an ECU 31, a front camera module 32, a steering wheel 33, a headlamp 34, a motor 35, an engine 36, a brake 37, and a display unit 38.

The electronic control unit (ECU) 31 controls the overall operation of the vehicle 11 relating to electronic control. For example, the ECU 31 performs operations relating to driving of various kinds and assists the driver in driving, in accordance with information supplied from the front camera module 32, the steering wheel 33, the headlamp 34, the motor 35, the engine 36, the brake 37, and the display unit 38.

The front camera module 32 includes an imaging device, and captures an image of the scenery in front of the vehicle 11, or more particularly, the scenery in front of the vehicle 11 that is running. In accordance with the captured image, the front camera module 32 recognizes the lane on which the vehicle 11 is currently running, the vehicle running ahead, the pedestrians, and the like, and supplies the recognition results to the ECU 31. The front camera module 32 also detects a failure or the like of the built-in imaging device. In a case where a failure is detected, the front camera module 32 notifies the ECU 31 to that effect. Through this process, the ECU 31 stops the operation relating to the driving and the driving support using the recognition results based on the image captured by the front camera module 32, and also causes the display unit 38 to display a message to that effect.

The steering wheel 33 is designed for controlling the running direction, and is normally operated by the driver, which is a user. In some cases, however, the steering wheel 33 is controlled by the ECU 31. Specifically, in a case where a pedestrian or a vehicle is detected in front of the running vehicle by the front camera module 32, and there is a possibility of a collision, for example, driving support is provided so that the steering wheel 33 is controlled through a determination made by the ECU 31, and a collision is avoided.

The headlamp 34 is a headlamp that illuminates the space in front of the vehicle 11, particularly in a situation where it is difficult for the driver to see with his/her own eyes during nighttime or the like. A switch or the like (not shown) is usually operated by the driver, to control switching on and off of the low beam and the high beam. The headlamp 34 is also controlled by the ECU 31 in some cases. For example, the following driving support is realized. In a case where an oncoming vehicle is detected by the front camera module 32, the ECU 31 determines to switch the lighting from the high beam to the low beam. In a case where any oncoming vehicle is no longer detected, control is performed to switch the lighting back to the high beam.

The motor 35 and the engine 36 are power sources for driving the vehicle 11. The motor 35 is driven by electric power, and the engine 36 is driven by fuel such as gasoline or light oil. The motor 35 and the engine 36 are also controlled by the ECU 31. Specifically, in a situation where the efficiency with the engine 36 is poor, and the fuel efficiency is lowered, like at the start of running, for example, only the motor 35 is driven. Also, at a time when the efficiency with the engine 36 is high, for example, control is performed so that the driving of the motor 35 is stopped, and the engine 36 is driven, depending on the running condition. Further, in a case where a running vehicle or a pedestrian is detected in front of the vehicle by the front camera module 32, driving support is provided so that the operation of the motor 35 and the engine 36 is stopped to assist in avoiding a crisis.

The brake 37 is operated by the driver to stop the running vehicle 11. Thus, the vehicle 11 is stopped. In some cases, the brake 37 is also controlled by the ECU 31. Specifically, in a case where a running vehicle or a pedestrian in front of the vehicle 11 is detected by the front camera module 32, and emergency avoidance is necessary, for example, driving support is provided so that the brake 37 to be operated through a determination made by the ECU 31, and an emergency stop is made.

The display unit 38 is formed with a liquid crystal display (LCD) or the like. In cooperation with a global positioning system (GPS) device (not shown), for example, the display unit 38 achieves a navigation function for displaying information such as route guidance to a destination. Also, the display unit 38 is formed with a touch panel or the like, and also functions as an operation input unit. Furthermore, in a case where the steering wheel 33, the motor 35, the engine 36, the brake 37, and the like are operated to take an emergency avoidance action in accordance with an image captured by the front camera module 32, for example, the display unit 38 displays a message to that effect. When a failure of the front camera module 32 is detected, and the driving support based on the captured image is stopped, the display unit 38 also displays information indicating that the driving support is stopped.

<Example Configuration of the Front Camera Module>

Figure 2:
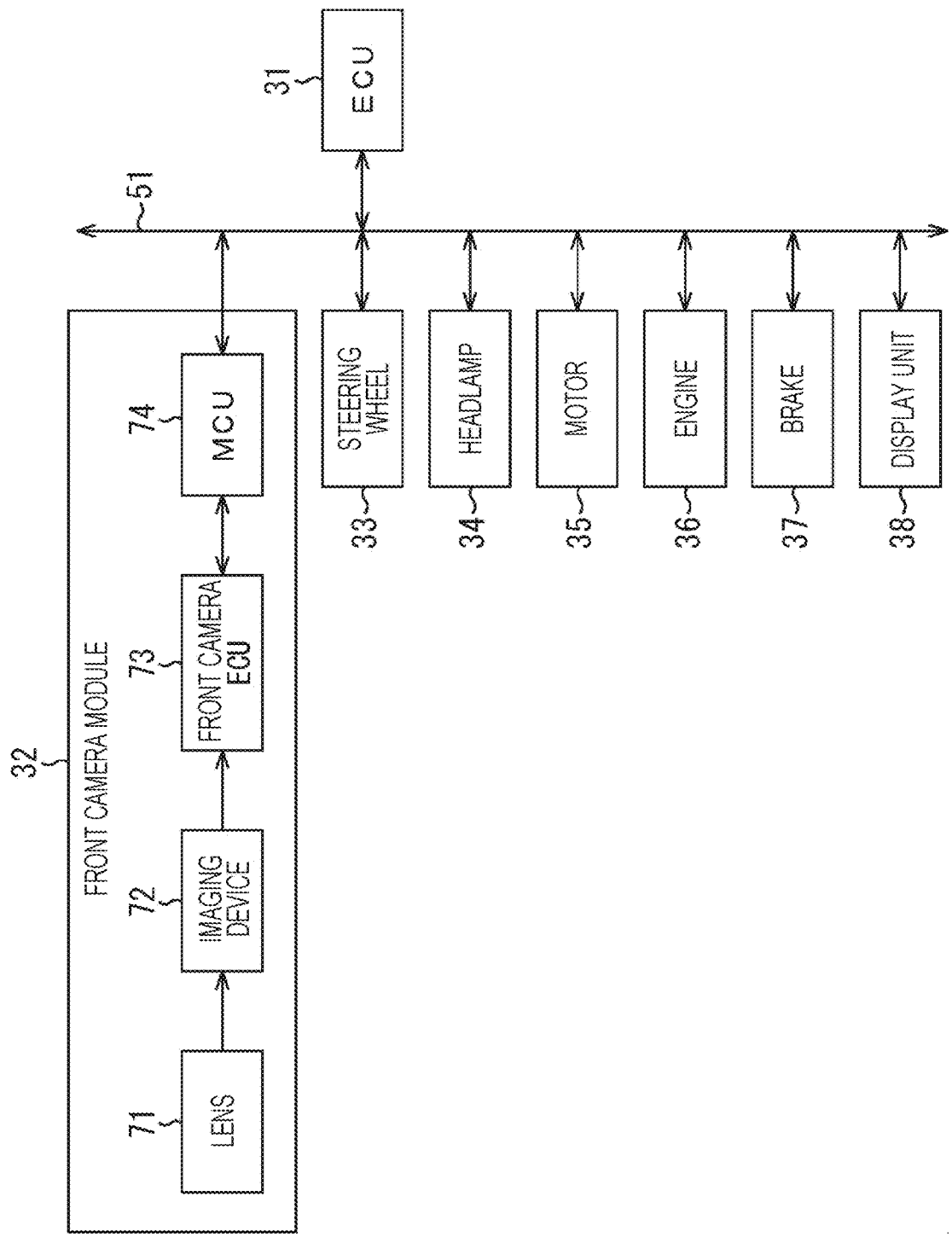
FIG. 2 is a diagram for explaining an example configuration of the front camera module shown in FIG. 1.

Referring now to FIG. 2, an example configuration of the front camera module 32 is described.

The front camera module 32 is connected via a bus 51 similarly to the ECU 31, the steering wheel 33, the headlamp 34, the motor 35, the engine 36, the brake 37, and the display unit 38, so that these components can exchange data and signals with one another.

Further, the front camera module 32 includes a lens 71, an imaging device 72, a front camera ECU 73, and a module control unit (MCU) 74.

The lens 71 gathers incident light from the imaging direction in front of the vehicle 11, and forms an image of the object on the imaging surface of the imaging device 72.

The imaging device 72 is formed with a complementary metal oxide semiconductor (CMOS) image sensor or the like. The imaging device 72 captures an image formed by the lens 71 gathering light and forming an image of the object in front of the vehicle 11, and supplies the captured image to the front camera ECU 73.

In accordance with the image of the object in front of the vehicle 11 captured by the imaging device 72, the front camera electronic control unit (ECU) 73 performs image processing, an image analysis process, and the like, such as lane detection, pedestrian detection, vehicle detection, headlamp detection, a signal recognition process, and image control, for example. The front camera ECU 73 supplies the results of the processes to the MCU 74. In addition to these processes, the front camera ECU 73 also detects a failure of the imaging device 72. In a case where a failure is detected, the front camera ECU 73 stops the outputting of the results of the processes, and outputs information indicating that a failure has been detected.

The MCU 74 converts the image processing results into information that can be recognized by the ECU 31 and the like, and outputs the resultant information to the ECU 31. Note that, in a case where information indicating that a failure of the imaging device 72 has been detected is output from the front camera ECU 73 at this stage, the MCU 74 supplies the corresponding information to the ECU 31. In such a case, the ECU 31 stops the driving support using the image processing results supplied from the front camera module 32, and causes the display unit 38 or the like to display information indicating that the driving support using the image processing results is stopped due to a failure of the imaging device 72. In this manner, the driver is made to recognize that the driving support is not being provided.

<Driving Support Process>

Figure 3:
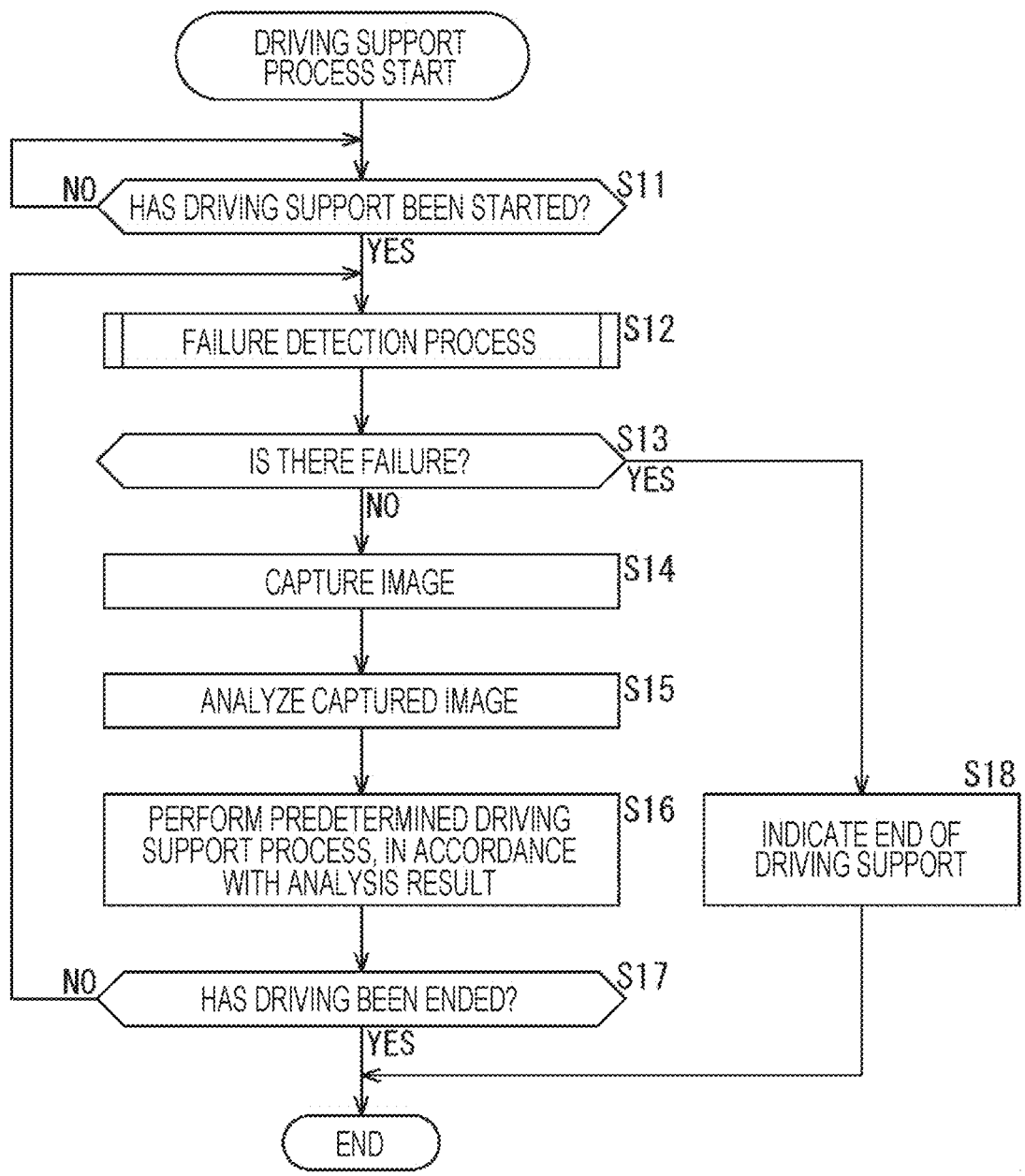
FIG. 3 is a flowchart for explaining a driving support process to be performed by the vehicle shown in FIG. 1.

Referring now to the flowchart in FIG. 3, a driving support process to be performed by the vehicle 11 is described.

In step S11, the front camera ECU 73 determines whether or not the display unit 38 is formed as a touch panel, and a driving support start instruction has been issued by operating the touch panel, for example. The front camera ECU 73 repeats a similar process, until a driving support start instruction is issued. Then, if a driving support start instruction has been issued in step S11, the process moves on to step S12, and a driving support process is started.

In step S12, the front camera ECU 73 performs a failure detection process on the front camera module 32. The failure detection process here may be the later described row address selecting function failure detection process (FIG. 7), the pulse output failure detection process (FIG. 12 or 15), the pixel control line failure detection process (FIG. 17), the ADC+TCV failure detection process (FIG. 24), or some other failure detection process, for example. The failure detection process in this example may be performed during imaging, or may be performed when the driving support system is activated by turning on the vehicle power supply, when the vehicle is subjected to pre-shipment inspection, or when defective products are eliminated at the factory.

In step S13, the front camera ECU 73 determines whether or not a failure has been detected through the failure detection process. If it is determined that any failure has not been detected, the process moves on to step S14.

In step S14, the front camera ECU 73 controls the imaging device 72 to capture an image, and acquires the captured image.

In step S15, the front camera ECU 73 analyzes the captured image. Specifically, the front camera ECU 73 performs image processing, an image analysis process, and the like, such as lane detection, pedestrian detection, vehicle detection, headlamp detection, a signal recognition process, and image quality control, and supplies the processing results to the ECU 31.

In step S16, in accordance with the analysis process results, the ECU 31 controls the steering wheel 33, the headlamp 34, the motor 35, the engine 36, the brake 37, and the display unit 38, to perform various kinds of driving support processes.

In step S17, the front camera ECU 73 determines whether or not the driving has been ended. If the driving has not been ended, the process returns to step S12, and the processing thereafter is repeated. Then, if it is determined in step S17 that the driving has been ended, the process comes to an end.

If it is determined in step S13 that there is a failure, on the other hand, the process moves on to step S18.

In step S18, the front camera ECU 73 notifies the ECU 31 that a failure has occurred in the imaging device 72. The ECU 31 terminates the driving support process, and causes the display unit 38 to display an image for causing the driver to recognize that the driving support has ended and is no longer being provided.

As in the above described process, in a driving support process to be performed in accordance with an image captured by the imaging device 72, if the driving support process cannot be appropriately performed due to a failure detected in the imaging device 72, the driving support process is immediately ended. Thus, it is possible to prevent an accident or the like due to an inappropriate driving support process.

<Example Configuration of the Hardware>

Figure 4:
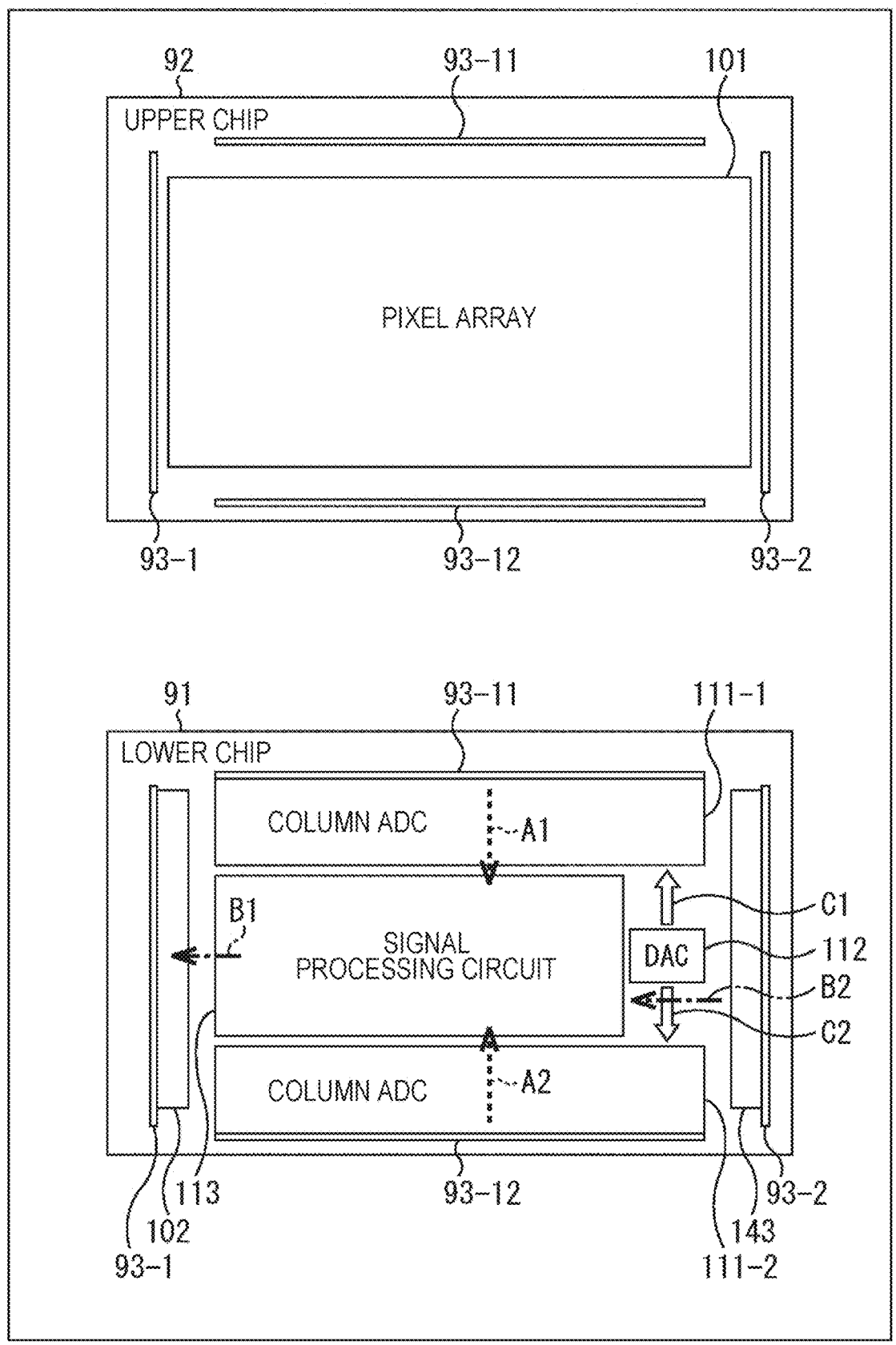
FIG. 4 is a diagram for explaining an example configuration of the hardware that forms the imaging device and the front camera ECU shown in FIG. 2.

Referring now to FIG. 4, the configuration of the hardware of the front camera ECU and the imaging device is described. The hardware of the front camera ECU and the imaging device has a configuration in which a lower chip 91 and an upper chip 92 are stacked. Note that, the right half of FIG. 4 shows a floor plan that is the hardware configuration of the lower chip 91, and the left half of FIG. 4 shows a floor plan that is the hardware configuration of the upper chip 92.

Through chip vias (TCVs) 93-1 and 93-2 are provided at the right and left end portions of each of the lower chip 91 and the upper chip 92 in the drawing, and penetrate through the lower chip 91 and the upper chip 92, to electrically connect the lower chip 91 and the upper chip 92. In the lower chip 91, a row drive unit 102 (FIG. 5) is disposed to the right of the TCV 93-1 in the drawing, and is electrically connected to the TCV 93-1. A control line gate 143 (FIG. 5) of the front camera ECU 73 is disposed to the left of the TCV 93-2 in the drawing, and is electrically connected to the TCV 93-2. Note that the row drive unit 102 and the control line gate 143 will be described later in detail with reference to FIG. 5.

In addition, TCVs 93-11 and 93-12 are provided at the upper and lower end portions of each of the lower chip 91 and the upper chip 92 in the drawing, and penetrate through the lower chip 91 and the upper chip 92, to electrically connect the lower chip 91 and the upper chip 92. In the lower chip 91, a column analog-to-digital converter (ADC) 111-1 is disposed under the TCV 93-11 in the drawing, and is electrically connected to the TCV 93-11. A column analog-to-digital converter (ADC) 111-2 is disposed on the TCV 93-12 in the drawing, and is electrically connected to the TCV 93-12.

A digital-to-analog converter (DAC) 112 is provided between the right end portions of the column ADCs 111-1 and 111-2 and on the left side of the control line gate 143, and outputs ramp voltages to the column ADCs 111-1 and 111-2, as indicated by arrows C1 and C2 in the drawing. Note that the column ADCs 111-1 and 111-2, and the DAC 112 correspond to an image signal output unit 103 shown in FIG. 5. Also, the DAC 112 preferably outputs ramp voltages having the same characteristics to the column ADCs 111-1 and 111-2, and therefore, is preferably located at the same distance from the column ADCs 111-1 and 111-2. Further, although only one DAC 112 is provided in the example shown in FIG. 4, a DAC may be provided for each of the column ADCs 111-1 and 111-2. That is, a total of two DACs having the same characteristics may be provided for the respective column ADCs 111-1 and 111-2. Note that the image signal output unit 103 will be described later in detail with reference to FIG. 5.

Figure 5:
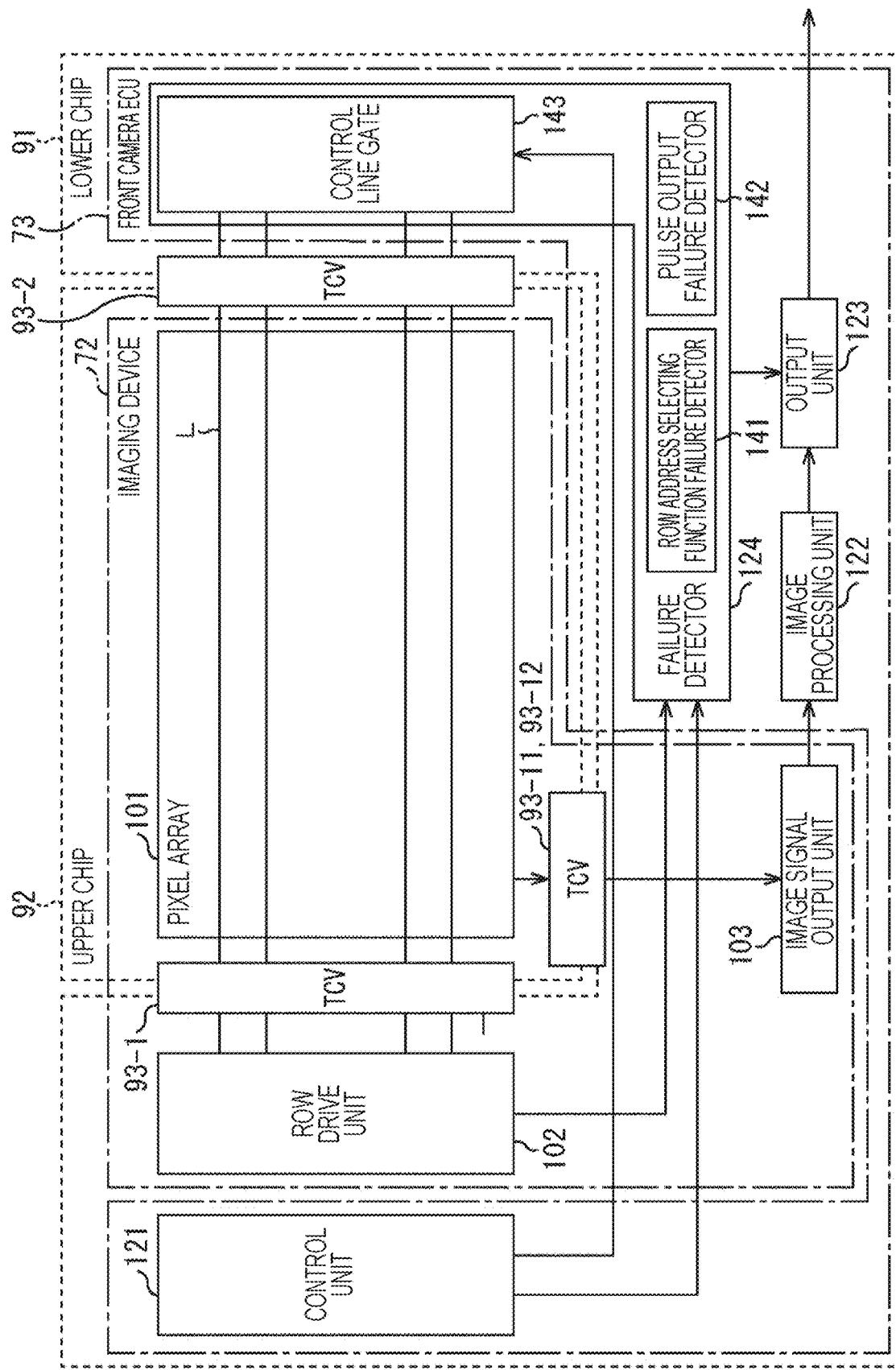
FIG. 5 is a diagram for explaining an example configuration of a first embodiment of the functions that form the imaging device and the front camera ECU shown in FIG. 2.

Furthermore, a signal processing circuit 113 is provided between the upper and lower column ADCs 111-1 and 111-2, and between the row drive unit 102 and the DAC 112, and forms the functions corresponding to a control unit 121, an image processing unit 122, an output unit 123, and a failure detector 124 shown in FIG. 5.

In the upper chip 92, substantially the entire surface of the rectangular region surrounded by the TCVs 93-1, 93-2, 93-11, and 93-12 provided at the upper, lower, right, and left end portions is formed with a pixel array 101.

In accordance with a control signal supplied from the row drive unit 102 from the TCV 93-1 via a pixel control line L (FIG. 5), the pixel array 101 outputs the pixel signals of the pixels in the upper half in the drawing among pixel signals to the lower chip 91 via the TCV 93-11, and outputs the pixel signals of the pixels of the lower half in the drawing to the lower chip 91 via the TCV 93-12.

As indicated by an arrow B1 in the drawing, the control signal is transmitted from the signal processing circuit 113 that embodies the row drive unit 102 to the control line gate 143 (FIG. 5) via the pixel control line L of the pixel array of the upper chip 92 via the TCV 93-1. The control line gate 143 (FIG. 5) detects presence/absence of a failure due to disconnection of the pixel control line L and the TCVs 93-1 and 93-2, by comparing the signal output from the control line gate 143 depending on the control signal from the row drive unit 102 (FIG. 5) via the pixel control line L for the row address that is command information from the control unit 121 (FIG. 5), with the detection pulse of the control signal corresponding to the row address supplied from the control unit 121. As indicated by an arrow B2 in the drawing, the control line gate 143 then outputs information about the presence/absence of a failure to the failure detector 124 formed with the signal processing circuit 113.

As indicated by an arrow A1 in the drawing, the column ADC 111-1 converts the pixel signals of the pixels of the upper half of the pixel array 101 in the drawing, which are supplied via the TCV 93-11, into digital signals column by column, and outputs the digital signals to the signal processing circuit 113. Also, as indicated by an arrow A2 in the drawing, the column ADC 111-2 converts the pixel signals of the pixels of the lower half of the pixel array 101 in the drawing, which are supplied via the TCV 93-12, into digital signals column by column, and outputs the digital signals to the signal processing circuit 113.

With this two-layer structure, the upper chip 92 only includes the pixel array 101, and accordingly, a semiconductor process specialized for pixels can be introduced. For example, since there is no circuit transistor in the upper chip 92, there is no need to pay attention to characteristics fluctuation due to a 1000° C. annealing process or the like, and thus, a high-temperature process or the like for preventing white spots can be introduced. As a result, characteristics can be improved.

Further, the failure detector 124 is disposed in the lower chip 91, so that signals that have passed through the TCVs 93-1 and 93-2 from the lower chip 91 to the upper chip 92 and from the upper chip 92 to the lower chip 91. Thus, appropriate failure detection can be performed.

<Specific Example Configurations of the Front Camera ECU and the Imaging Device>

Referring now to FIG. 5, specific example configurations of the functions of the front camera ECU 73 and the imaging device 72 formed by the hardware shown in FIG. 4 are described.

The imaging device 72 includes the pixel array 101, the row drive unit 102, and the image signal output unit 103.

In the pixel array 101, pixels that generate pixel signals depending on incident light are arranged in an array.

The row drive unit 102 generates a control signal to be transferred in a vertical direction, to reset and accumulate pixel signals from the respective pixels in the pixel array 101, and to read the reset levels and the signal levels of the pixel signals. The row drive unit 102 supplies the control signal to the respective pixels via the pixel control line L, so that the pixel signals are reset and read pixel by pixel.

Note that, in this case, both the reset level in a state where any signal subjected to photoelectric conversion is not accumulated, and the signal level in a state where signals subjected to photoelectric conversion are accumulated are read from the pixel signal at each of the pixels. That is, each pixel is read twice, and the difference value between the signal level and the reset level is set as a pixel signal. Accordingly, hereinafter, a pixel signal will be the difference value between the signal level and the reset level.

The image signal output unit 103 converts the pixel signals of analog signals read out from the pixel array 101 via the TCVs 93-11 and 93-12, under the control of the row drive unit 102, into digital signals, and supplies the digital signals as pixel signals to the image processing unit 122 of the front camera ECU 73.

The front camera ECU 73 includes the control unit 121, the image processing unit 122, the output unit 123, the failure detector 124, and the control line gate 143.

The control unit 121 controls operation of the entire front camera ECU 73. In a row address selecting function failure detection process, the control unit 121 also supplies command information for designating a predetermined row address to the row drive unit 102 and (the control line gate 143 of) the failure detector 124.

In a pulse output failure detection process, the control unit 121 also controls the row drive unit 102 to generate a control signal for controlling accumulation and reading of the pixel signals of the respective pixels in the pixel array 101. The control unit 121 further generates a pulse for failure detection for each control signal at a time when a control signal is output in the row drive unit 102, and supplies the pulse to the failure detector 124.

The failure detector 124 includes a row address selecting function failure detector 141, a pulse output failure detector 142, and the control line gate 143. The row address selecting function failure detector 141 performs the row address selecting function failure detection process, and the pulse output failure detector 142 performs the pulse output failure detection process, to detect the presence/absence of a failure and supply the detection result to the output unit 123.

More specifically, the row address selecting function failure detector 141 detects the presence/absence of a failure in the row address selecting functions of the row drive unit 102 and the control line gate 143, by performing the row address selecting function failure detection process.

The pulse output failure detector 142 also detects the presence/absence of a pulse output failure of the control signal supplied from the row drive unit 102 via the pixel control line L of a predetermined row address, by performing the pulse output failure detection process.

In accordance with an image including an image signal supplied from the image signal output unit 103 of the imaging device 72, the image processing unit 122 performs image signal processing and an image analysis process, such as lane detection, pedestrian detection, vehicle detection, headlamp detection, a signal recognition process, and image control, for example, and supplies the analysis processing results to the output unit 123.

The output unit 123 outputs various kinds of processing results from the image processing unit 122, and the failure detection process result from the failure detector 124, to the ECU 31.

Further, the imaging device 72 and the front camera ECU 73 shown in FIG. 5 have a structure in which the upper chip 92 serving as a first chip that forms a surface capable of receiving incident light from the object, and the lower chip 91 serving as a second chip stacked under the upper chip 92 are electrically connected by the through chip vias (TCVs) 93-1, 93-2, 93-11, and 93-12.

More specifically, the left end portion of the pixel array 101 disposed in the upper chip 92 in the drawing, and the row drive unit 102 disposed in the lower chip 91 are electrically connected by the TCV 93-1. Also, the right end portion of the pixel array 101 disposed in the upper chip 92 in the drawing, and the control line gate 143 disposed in the lower chip 91 are electrically connected by the TCV 93-2. Further, the lower end portion of the pixel array 101 disposed in the upper chip 92 in the drawing, and the image signal output unit 103 disposed in the lower chip 91 are electrically connected by the TCVs 93-11 and 93-12.

In the upper chip 92, only the pixel array 101 of the imaging device 72 is disposed. The row drive unit 102 and the image signal output unit 103 of the imaging device 72, and the control unit 121, the image processing unit 122, the output unit 123, and the failure detector 124, which constitute the front camera ECU 73, are disposed in the lower chip 91.

<Failure Detection Process by the Failure Detector>

Figure 6:
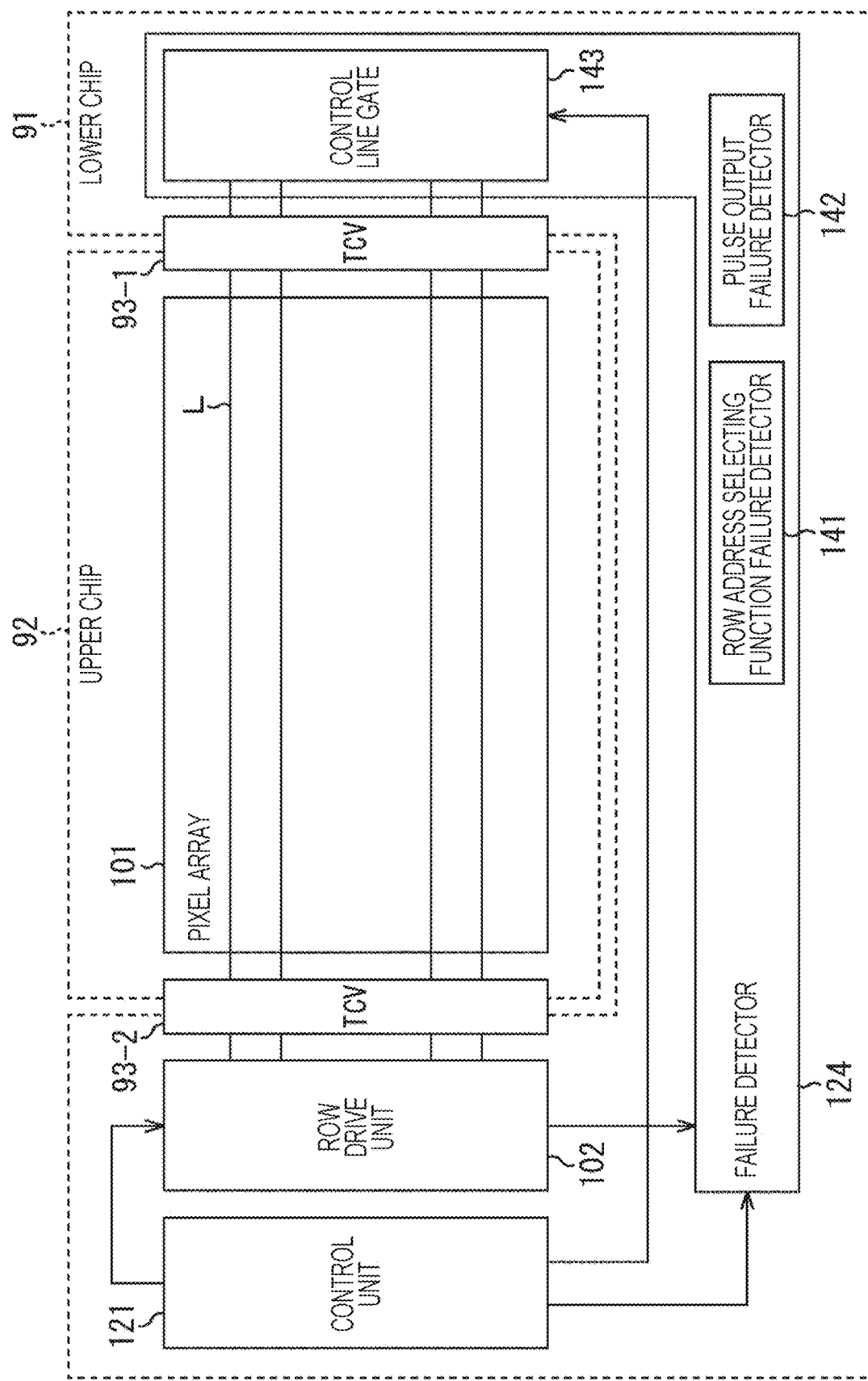
FIG. 6 is a diagram for explaining a failure detection process to be performed by the imaging device and the front camera ECU shown in FIG. 4.

Next, the row address selecting function failure detection process at the row address selecting function failure detector 141 of the failure detector 124, and the pulse output failure detection process at the pulse output failure detector 142 are described, with reference to FIG. 6.

The row address selecting function failure detector 141 is controlled by the control unit 121, and acquires row address command information supplied from the control unit 121. The control unit 121 also supplies the same row address command information as that supplied to the row address selecting function failure detector 141, to the row drive unit 102 and the control line gate 143.

In accordance with the row address command information supplied from the control unit 121, the row drive unit 102 and the control line gate 143 output selection information that is information about the row address to be selected as the current control target, to the row address selecting function failure detector 141 and the pulse output failure detector 142.

The row address selecting function failure detector 141 compares the row address command information supplied from the control unit 121 with the row address selection information supplied from the row drive unit 102 and the control line gate 143. If the row address command information matches the row address selection information, the row address selecting function failure detector 141 determines that there is no failure in the row address selecting function of the row drive unit 102 and the control line gate 143. If the row address command information does not match the row address selection information, the row address selecting function failure detector 141 determines that there is a failure in the row address selecting function.

The pulse output failure detector 142 detects presence/absence of a failure due to disconnection of the pixel control line L and the TCVs 93, by comparing the signal output from the control line gate 143 depending on the control signal from the row drive unit 102 via the pixel control line L for the row address that is the command information from the control unit 121, with the detection pulse of the control signal corresponding to the row address supplied from the control unit 121. The configurations of the control line gate 143 and the pulse output failure detector 142 will be described later in detail with reference to FIGS. 9 and 10.

Note that the functions of the control unit 121 and the failure detector 124 shown in FIG. 6 are formed with the signal processing circuit 113 shown in FIG. 5.

<Row Address Selecting Function Failure Detection Processing>

Figure 7:
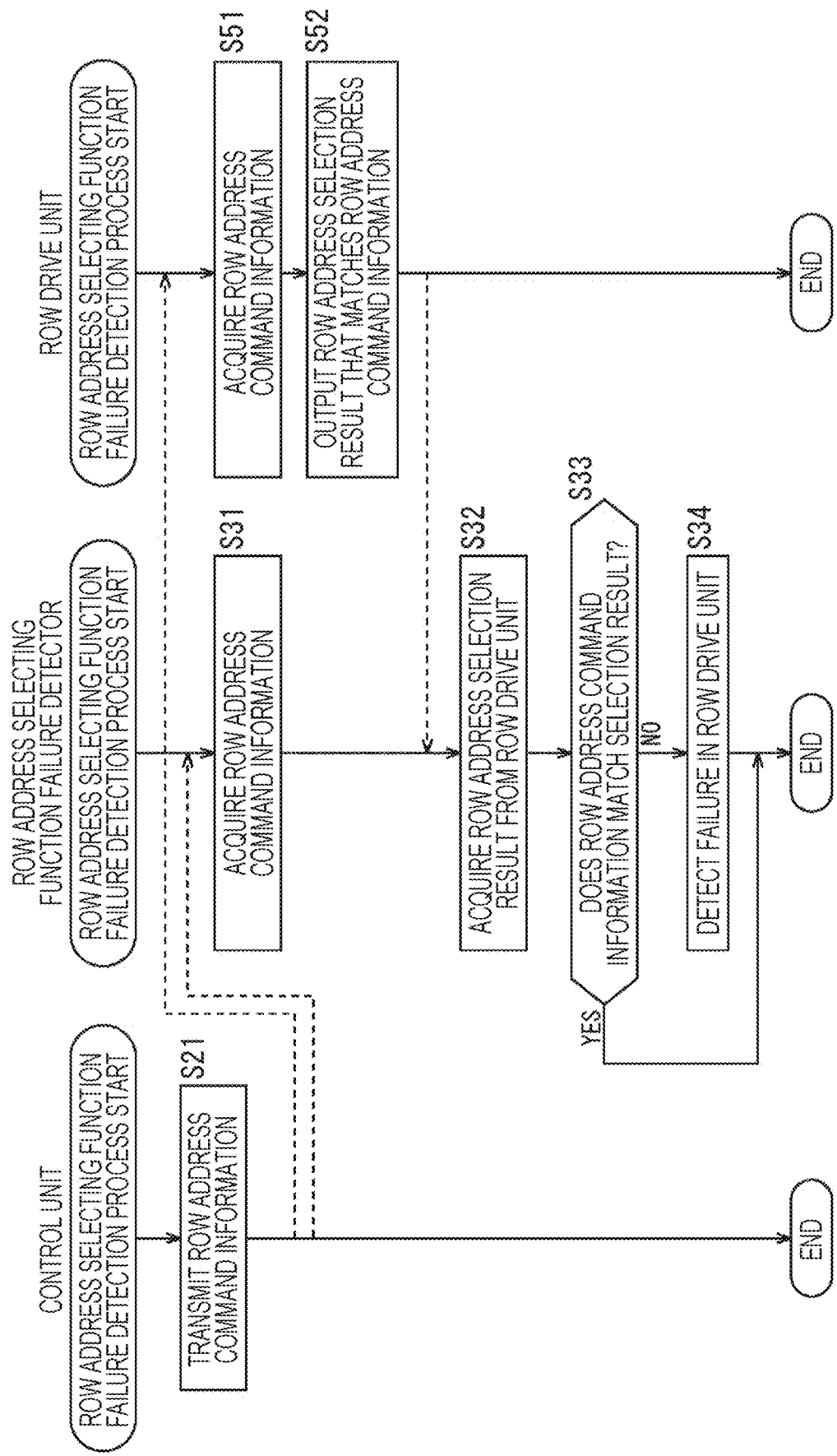
FIG. 7 is a flowchart for explaining a row address selecting function failure detection process to be performed by the imaging device and the front camera ECU shown in FIG. 4.

Referring now to the flowchart in FIG. 7, the row address selecting function failure detection process to be performed by the control unit 121 and the row address selecting function failure detector 141 of the failure detector 124 is described.

In step S21, the control unit 121 supplies command information for designating a predetermined row address to the row drive unit 102 and the failure detector 124.

Through this process, in step S31, the row address selecting function failure detector 141 of the failure detector 124 acquires the command information about the predetermined row address supplied from the control unit 121. In addition, likewise, through the process in step S51, the row drive unit 102 acquires the command information about the predetermined row address supplied from the control unit 121.

Figure 8:
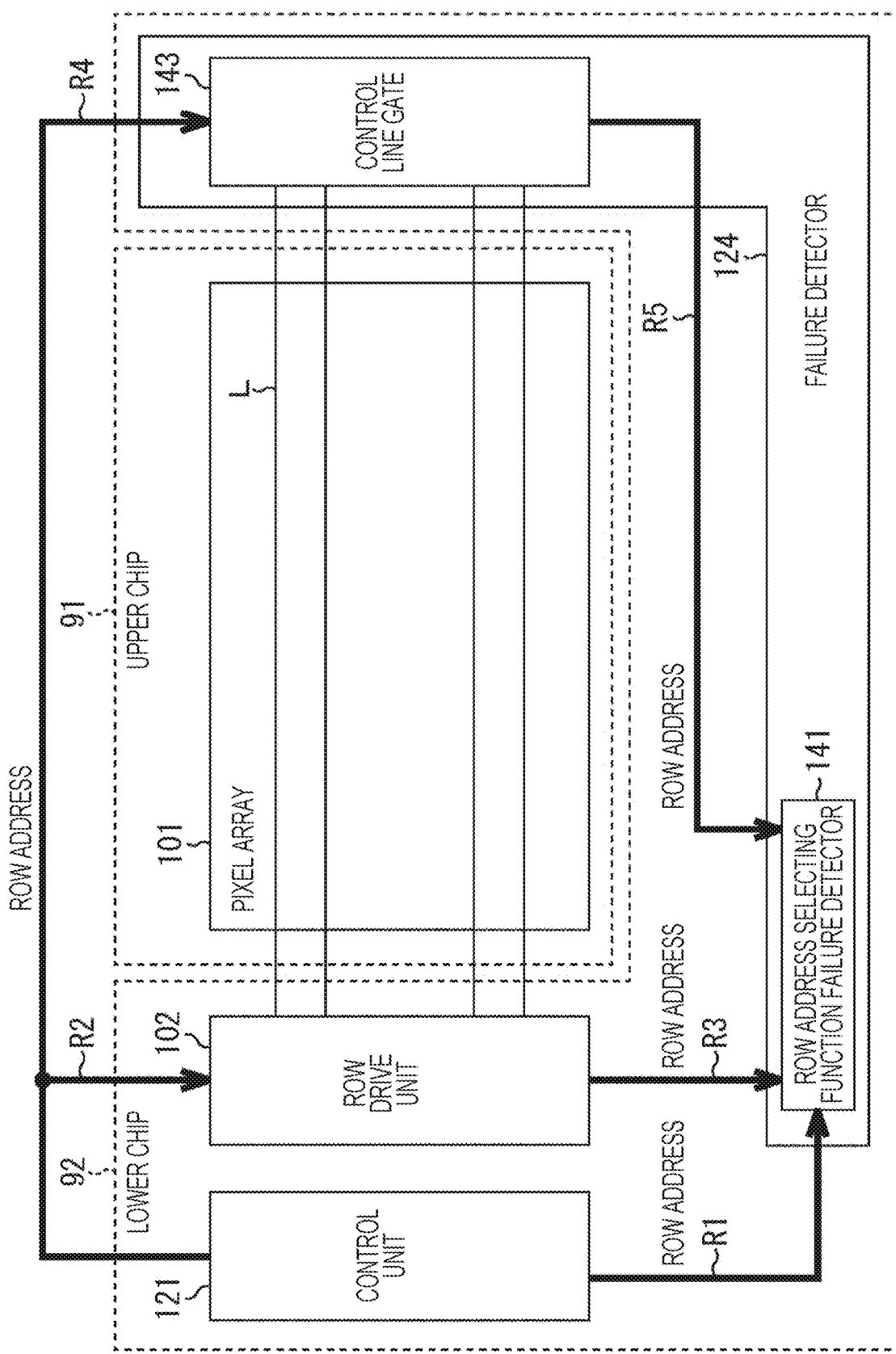
FIG. 8 is a diagram for explaining a row address selecting function failure detection process to be performed by the imaging device and the front camera ECU shown in FIG. 4.

That is, the process in steps S21 and S31 is the process through a route R1 shown in FIG. 8, and the process in steps S21 and S51 is the process through a route R2 in FIG. 8. Note that, in FIG. 8, the routes through which the information about the predetermined row address is transmitted is indicated with thick lines and arrows.

In step S52, in accordance with the acquired command information about the predetermined row address, the row drive unit 102 supplies the failure detector 124 with selection information that is the information about the row address to be selected as the current target.

In step S32, the row address selecting function failure detector 141 acquires the row address information as the selection information supplied from the row drive unit 102.

That is, the process in steps S52 and S32 is the process through a route R3 shown in FIG. 8.

In step S33, the row address selecting function failure detector 141 determines whether or not the row address command information matches the selection information. If the row address command information matches the selection information in step S33, it is determined that there is no failure in the row address selecting function of the row drive unit 102, and the process comes to an end.

If the row address command information does not match the selection information in step S33, on the other hand, it is determined that a failure has occurred in the row address selecting function, and the process moves on to step S34.

In step S34, the row address selecting function failure detector 141 detects the occurrence of a failure in the row address selecting function at the row drive unit 102, and outputs the detection result to the output unit 123.

Through the above process, the row address selecting function failure detector 141 can detect presence/absence of a failure of the row address selecting function at the row drive unit 102, in accordance with a determination as to whether or not the information about the row address that is the selection information supplied from the row drive unit 102 matches the row address that is the command information from the control unit 121.

Note that the row address selecting function detection process at the row address selecting function failure detector 141 and the control line gate 143 is similar to the process shown in FIG. 7, and therefore, explanation thereof is not made herein. In other words, the control line gate 143 may perform a process similar to the process in steps S51 through S53 in FIG. 7, to perform a similar failure detection process.

In this case, the process in steps S21 and S31 is the process through the route R1 shown in FIG. 8, and the process in steps S21 and S51 is the process through a route R4 in FIG. 8. Also, the process in steps S52 and S32 is the process through a route R5 shown in FIG. 8.

<Example Configuration of the Control Line Gate>

Figure 9:
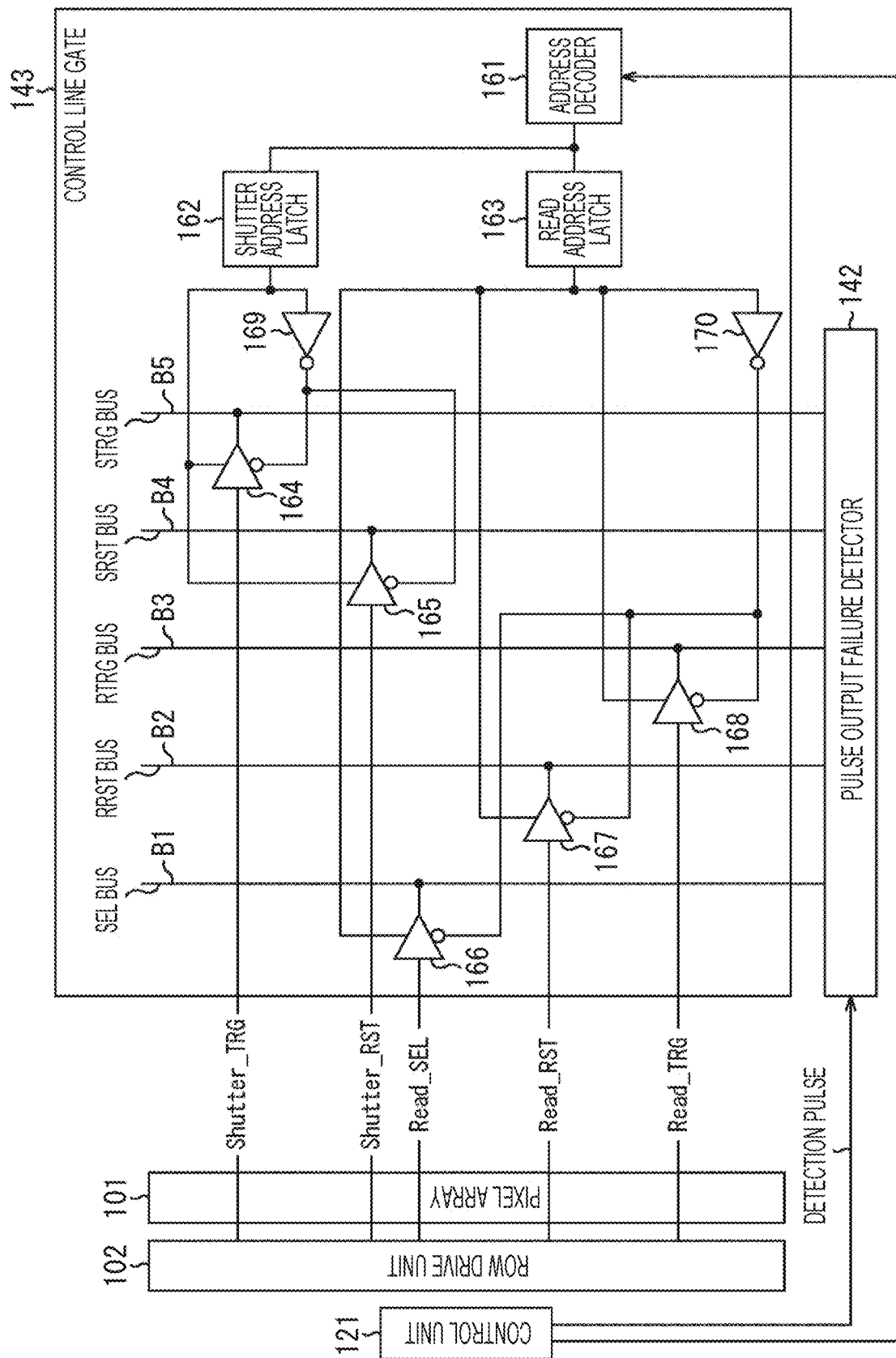
FIG. 9 is a diagram for explaining an example configuration of the control line gate shown in FIG. 4.

Referring now to FIG. 9, an example configuration of the control line gate 143 is described.

In the control line gate 143, an address decoder 161, a shutter address latch 162, and a read address latch 163 are provided. Also, in the respective rows, switching gates 164 through 168 for detecting the presence/absence of a supply of a control signal are provided for the respective kinds of control signals required for accumulation and reading of pixel signals. Various kinds of components, such as clocked inverters shown in FIG. 9 or operational amplifiers, can be used as the switching gates, for example.

The control signals to be dealt with here are the following five kinds of signals: shutter transfer signal Shutter_TRG in each row of the pixel array, shutter reset signal Shutter_RST in each row, read selection signal Read_SEL in each row, read reset signal Read_RST in each row, and read transfer signal Read_TRG in each row.

The shutter transfer signal Shutter_TRG is a control signal for turning on the transfer gate that releases the pixel signals accumulated by photoelectric conversion from a photodiode. The shutter reset signal Shutter_RST is a control signal for turning on the reset gate and setting the photodiode to the reset level, when releasing the pixel signals accumulated in the photodiode. The read selection signal Read_SEL is a control signal for turning on the selection gate, when outputting the pixel signals accumulated in the FD to a vertical transfer line (VSL). The read reset signal Read_RST is a control signal for turning on the reset gate, when setting the FD to the reset level. The read transfer signal Read_TRG is a control signal for turning on the transfer gate when transferring the pixel signal accumulated in the photodiode and setting the FD to the signal level.

More specifically, the switching gate 164 detects the shutter transfer signal Shutter_TRG. The switching gate 165 detects the shutter reset signal Shutter_RST. The switching gate 166 detects the read selection signal Read_SEL. The switching gate 167 detects the read reset signal Read_RST. The switching gate 168 detects the read transfer signal Read_TRG. Further, in each row, an inverter 169 that supplies negative power to the negative supply terminals of the switching gates 164 and 165, and an inverter 170 that supplies negative power to the negative supply terminals of the switching gates 166 through 168 are provided.

The address decoder 161 decodes an address in accordance with address information that is command information supplied from the control unit 121, and supplies the decoding result to the shutter address latch 162 and the read address latch 163.

The shutter address latch 162 supplies positive power to the positive supply terminals of the switching gates 164 and 165, and also supplies power to the inverter 169, when the decoding result is determined to be its own row address. At this stage, the inverter 169 converts the positive power into negative power, and supplies the negative power to the negative supply terminals of the switching gates 164 and 165. As a result, the switching gates 164 and 165 are put into an operable state.

If the switching gate 164 detects the shutter transfer signal Shutter_TRG from the row drive unit 102 as a Hi signal in accordance with the row address that is the corresponding command information at this stage, the switching gate 164 outputs the corresponding Hi signal to the pulse output failure detector 142 via a STRG bus B5.

Also, if the switching gate 165 detects the shutter reset signal Shutter_RST from the row drive unit 102 as a Hi signal, the switching gate 165 outputs the corresponding Hi signal to the pulse output failure detector 142 via a SRST bus B4.

The read address latch 163 supplies positive power to the positive supply terminals of the switching gates 166 through 168, and also supplies power to the inverter 170, when the decoding result is determined to be its own row address. At this stage, the inverter 170 converts the positive power into negative power, and supplies the negative power to the negative supply terminals of the switching gates 166 through 168. As a result, the switching gates 166 through 168 are put into an operable state.

If the switching gate 166 detects the read selection signal Read_SEL from the row drive unit 102 as a Hi signal in accordance with the row address that is the corresponding command information at this stage, the switching gate 166 outputs the corresponding Hi signal to the pulse output failure detector 142 via a SEL bus B1.

Also, if the switching gate 167 detects the read reset signal Read_RST as a Hi signal, the switching gate 167 outputs the corresponding Hi signal to the pulse output failure detector 142 via an RRST bus B2.

Further, if the switching gate 168 detects the read transfer signal Read_TRG as a Hi signal, the switching gate 168 outputs the corresponding Hi signal to the pulse output failure detector 142 via an RTRG bus B3.

That is, when various kinds of control signals corresponding to the row address designated as the command information are correctly supplied from the row drive unit 102, Hi signals are output from the corresponding buses B1 through B5 at the timing specified by the command information about the row address.

Note that the functions of the control unit 121 and the pulse output failure detector 142 shown in FIG. 9 are formed with the signal processing circuit 113 in FIG. 4.

<Example Configuration of the Pulse Output Failure Detector>

Figure 10:
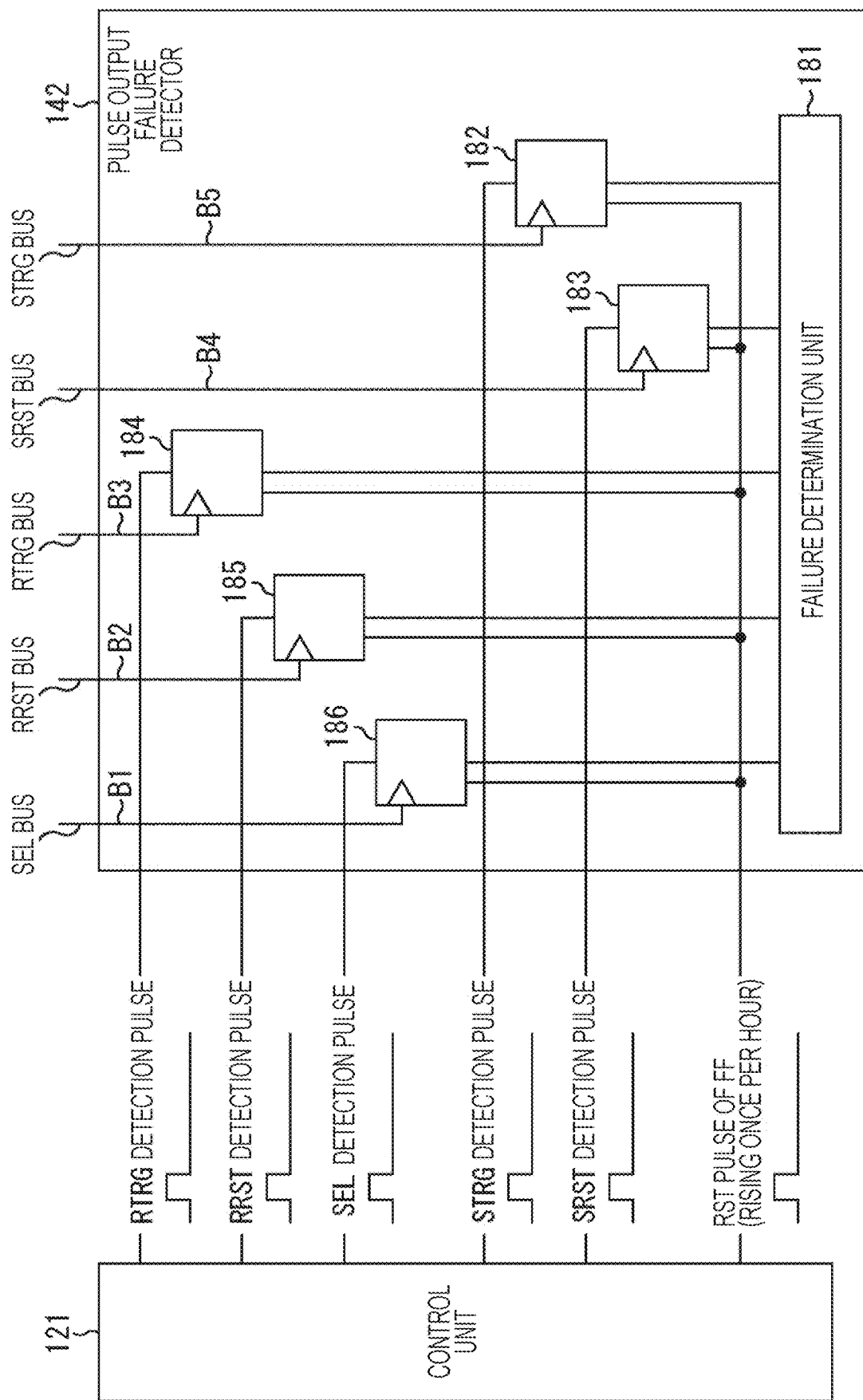
FIG. 10 is a diagram for explaining an example configuration of the pulse output failure detector shown in FIG. 4.

Referring now to FIG. 10, a specific example configuration of the pulse output failure detector 142 is described.

The pulse output failure detector 142 includes a failure determination unit 181 and latches 182 through 186. When both an output signal from the STRG bus B5 and a pulse for detecting the shutter transfer signal STRG from the control unit 121 enter a Hi signal state, the latch 182 outputs a Hi signal to the failure determination unit 181 until a reset. When both an output signal from the SRST bus B4 and a pulse for detecting the shutter reset signal SRST from the control unit 121 enter a Hi signal state, the latch 183 outputs a Hi signal to the failure determination unit 181 until a reset.

When both an output signal from the RTRG bus B3 and a pulse for detecting the read transfer signal RTRG from the control unit 121 enter a Hi signal state, the latch 184 outputs a Hi signal to the failure determination unit 181 until a reset. When both an output signal from the RRST bus B4 and a pulse for detecting the read transfer signal RRST from the control unit 121 enter a Hi signal state, the latch 185 outputs a Hi signal to the failure determination unit 181 until a reset. When both an output signal from the SEL bus B5 and a pulse for detecting the read selection signal SEL from the control unit 121 enter a Hi signal state, the latch 186 outputs a Hi signal to the failure determination unit 181 until a reset.

When the output signals of the respective latches 182 through 186 are not Hi signals, the failure determination unit 181 detects a failure.

Specifically, in a case where each of the latches 182 through 186 outputs a Hi signal, the control unit 121 causes the row drive unit 102 to output a predetermined control signal indicating the row address designated as command information. In a case where the control signal is appropriately output, the corresponding control signal is output as a Hi signal from the control line gate 143 to the pulse output failure detector 142 through the buses B1 through B5.

At this timing, the control unit 121 also supplies the pulse output failure detector 142 with a pulse for detecting the corresponding control signal that has a greater pulse width than the pulse of the command signal for generation of the control signal to be supplied to the row drive unit 102. Therefore, if those pulses are supplied at almost the same timing, a Hi signal is output in each of the latches 182 through 186. Accordingly, the failure determination unit 181 can determine that there is no failure, as long as a Hi signal is being output.

If one of the latches 182 through 186 stops outputting a Hi signal in this case, the control signal at the row address designated as the command signal is not output at the designated timing. Accordingly, it can be determined that a failure due to disconnection has occurred at one of the pixel control lines L or one of the TCVs 93 or the like.

Thus, in a case where any failure is not detected in this process, it is confirmed that there is no disconnection of the pixel control lines L in the pixel array 101, and it also can be confirmed that no disconnection has occurred in the TCVs 93.

Note that, in each of the latches 182 through 186, a terminal that receives reset signals from the control unit 121 is provided, and when a reset signal is received prior to operation, the latched value is reset.

Note that the functions of the control unit 121 and the pulse output failure detector 142 shown in FIG. 10 are formed with the signal processing circuit 113 in FIG. 4.

<Control Line Gate Management Process in the Pulse Output Failure Detection Process>

Figure 11:
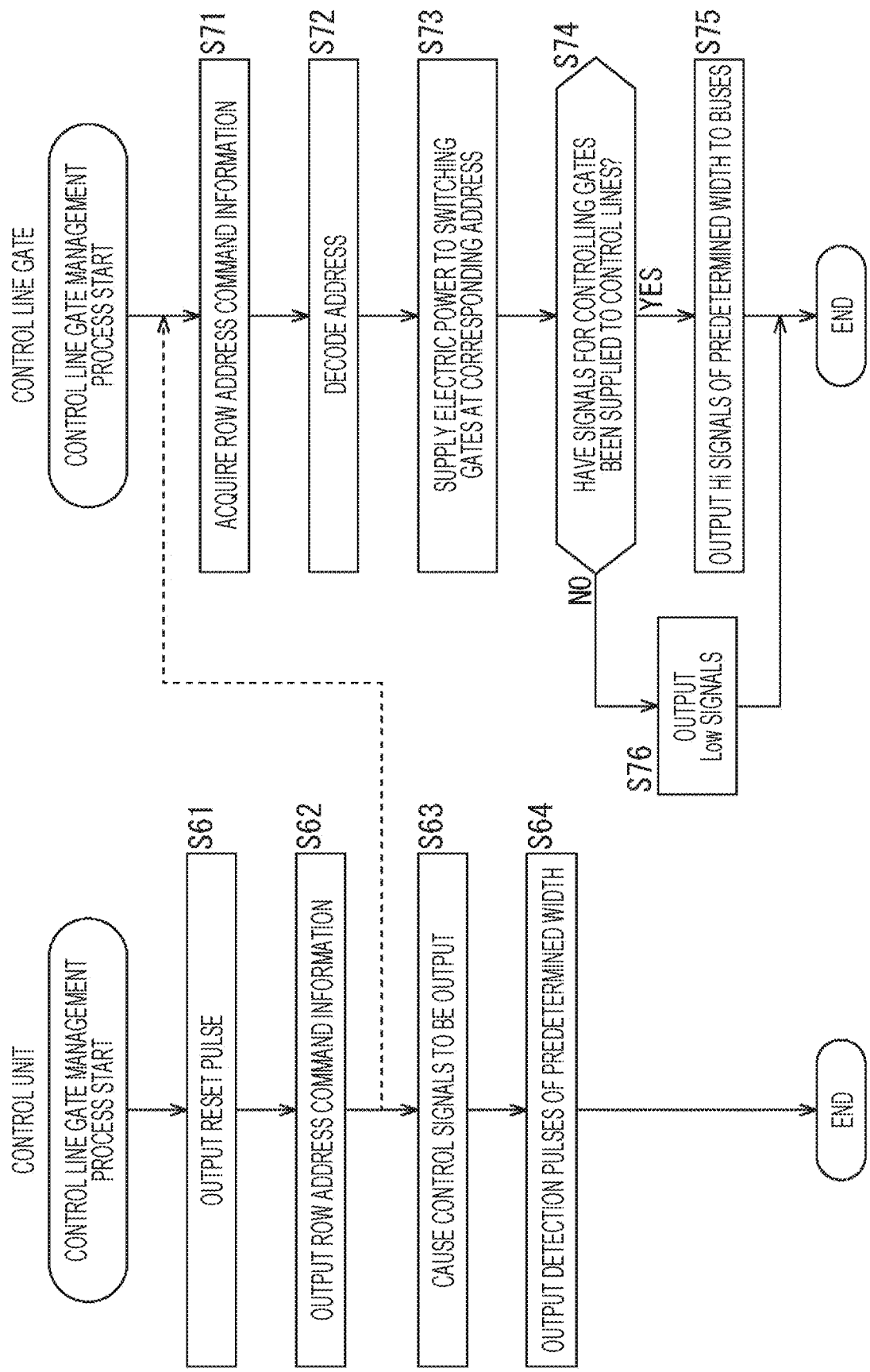
FIG. 11 is a flowchart for explaining a control line gate management process to be performed by the control line gate shown in FIG. 4.

Referring now to the flowchart in FIG. 11, a control line gate management process in the pulse output failure detection process to be performed by the control unit 121 and the pulse output failure detector 124 is described.

Specifically, in step S61, the control unit 121 supplies a reset signal to all of the latches 182 through 186 in the pulse output failure detector 142, to reset the latched information. Note that, although only the process in each row is described herein, resetting of the latches 182 through 186 is performed once in each column. Although only the process in each row is described herein, failure detection is also performed on all the rows by repeating a process of detecting a failure while one row is being read and reading the next row after a reset.

In step S62, the control unit 121 supplies the control line gate 143 with the next control signal to be output from the row drive unit 102 and the row address thereof. Note that this process is a process to be performed individually, when the control signals (Shutter_TRG and Shutter_RST) for controlling the shuttering and the control signals (Read_SEL, Read_RST, and Read_TRG) for controlling the reading are output to each of the pixels in the pixel array 101.

In step S71, the address decoder 161 of the control line gate 143 acquires the control signals and row address information supplied from the control unit 121.

In step S72, the address decoder 161 of the control line gate 143 decodes the row address information supplied from the control unit 121, and supplies the decoding result to the shutter address latch 162 and the read address latch 163 of each row.

In step S73, the shutter address latch 162 and the read address latch 163 of the corresponding row address each supply electric power to the corresponding switching gates 164 through 168, and put the switching gates 164 through 168 into an operable state. More specifically, the shutter address latch 162 and the read address latch 163 each apply a positive voltage to the positive voltage terminals of the switching gates 164 through 168 of the corresponding row address. The shutter address latch 162 and the read address latch 163 also each cause generation of a negative voltage via the inverters 169 and 170, and apply the negative voltage to the negative voltage terminals of the switching gates 164 through 168. That is, as a positive voltage and a negative voltage are applied to the positive voltage terminals and the negative voltage terminals, respectively, the switching gates 164 through 168 are put into an operable state.

Here, in step S63, the control unit 121 controls the row drive unit 102 so that the shutter transfer signal Shutter_TRG, the shutter reset signal Shutter_RST, the read selection signal Read_SEL, the read reset signal Read_RST, and the read transfer signal Read_TRG at the same row address as the row address are output at predetermined timing.

On the other hand, in step S74, the switching gates 164 through 168 determine whether or not the corresponding shutter transfer signal Shutter_TRG, the corresponding shutter reset signal Shutter_RST, the corresponding read selection signal Read_SEL, the corresponding read reset signal Read_RST, and the corresponding read transfer signal Read_TRG have been supplied. If these signals have been supplied, the switching gates 164 through 168 output Hi signals to the corresponding buses B1 through B5. Note that, for ease of explanation, the switching gates 164 through 168 determine the presence/absence of the control signals independently of one another in this process. However, when the control gates are detected, the switching gates 164 through 168 operate to output Hi signals, and do not actually determine the presence/absence of the control signals. Therefore, the process in step S74 merely indicates the operating conditions for the switching gates 164 through 168 to output Hi signals.

That is, when the control signals including the shutter transfer signal Shutter_TRG, the shutter reset signal Shutter_RST, the read selection signal Read_SEL, the read reset signal Read_RST, and the read transfer signal Read_TRG are supplied to the designated row address, the switching gates 164 through 168 detect these control signals, and output Hi signals from the STRG bus B5, the SRST bus B4, the SEL bus B1, the RRST bus B2, and the RTRG bus B3, respectively.

On the other hand, if the shutter transfer signal Shutter_TRG, the shutter reset signal Shutter_RST, the read selection signal Read_SEL, the read reset signal Read_RST, and the read transfer signal Read_TRG have not been supplied in step S74, the process moves on to step S76.

In step S76, the switching gates 164 through 168 output low signals to the corresponding buses B1 through B5, respectively.

In step S64, the control unit 121 then supplies a STRG detection pulse to the latch 182, a SRST detection pulse to the latch 183, a SEL detection pulse to the latch 186, a RRST detection pulse to the latch 185, and a RTRG detection pulse to the latch 184. The STRG detection pulse, the SRST detection pulse, the SEL detection pulse, the RRST detection pulse, and the RTRG detection pulse are supplied as the pulses for detecting the shutter transfer signal Shutter_TRG, the shutter reset signal Shutter_RST, the read selection signal Read_SEL, the read reset signal Read_RST, and the read transfer signal Read_TRG.

Through the above process, under the control of the control unit 121, the row drive unit 102 supplies the control signals that are the shutter transfer signal Shutter_TRG, the shutter reset signal Shutter_RST, the read selection signal Read_SEL, the read reset signal Read_RST, and a read transfer signal Read_TRG, via the pixel control lines L at a predetermined row address. At this point of time, the control unit 121 supplies the STRG detection pulse to the latch 182, the SRST detection pulse to the latch 183, the SEL detection pulse to the latch 186, the RRST detection pulse to the latch 185, and the RTRG detection pulse to the latch 184 at the corresponding timing. The STRG detection pulse, the SRST detection pulse, the SEL detection pulse, the RRST detection pulse, and the RTRG detection pulse are supplied as the pulses for detecting the shutter transfer signal Shutter_TRG, the shutter reset signal Shutter_RST, the read selection signal Read_SEL, the read reset signal Read_RST, and the read transfer signal Read_TRG.

<Pulse Output Failure Detection Process>

Next, a pulse output failure detection process to be performed, in conjunction with the above described control line gate management process, by the pulse output failure detector 142 is described with reference to the flowchart in FIG. 12.

In step S91, the latches 182 through 186 determine whether or not the respective detection pulses supplied thereto are Hi signals. Specifically, the latch 182 determines whether or not the STRG detection pulse is a Hi signal, the latch 183 determines whether or not the SRST detection pulse is a Hi signal, the latch 186 determines whether or not the SEL detection pulse is a Hi signal, the latch 185 determines whether or not the RRST detection pulse is a Hi signal, and the latch 184 determines whether or not the RTRG detection pulse is a Hi signal. Then, if the detection pulses are determined to be Hi signals, the process moves on to step S92.

In step S92, the latches 182 through 186 determine whether or not the signals at the buses B5, B4, B3, B2, and B1 are Hi signals. Specifically, the latch 182 determines whether or not the signal supplied from the STRG bus B5 is a Hi signal, the latch 183 determines whether or not the signal supplied from the SRST bus B4 is a Hi signal, the latch 186 determines whether or not the signal supplied from the SEL bus B1 is a Hi signal, the latch 185 determines whether or not the signal supplied from the RRST bus B2 is a Hi signal, and the latch 184 determines whether or not the signal supplied from the RTRG bus B3 is a Hi signal. Then, if the signals at the buses B5, B4, B3, B2, and B1 are Hi signals, the process moves on to step S93.

In step S93, the latches 182 through 186 output Hi signals.

Figure 13:
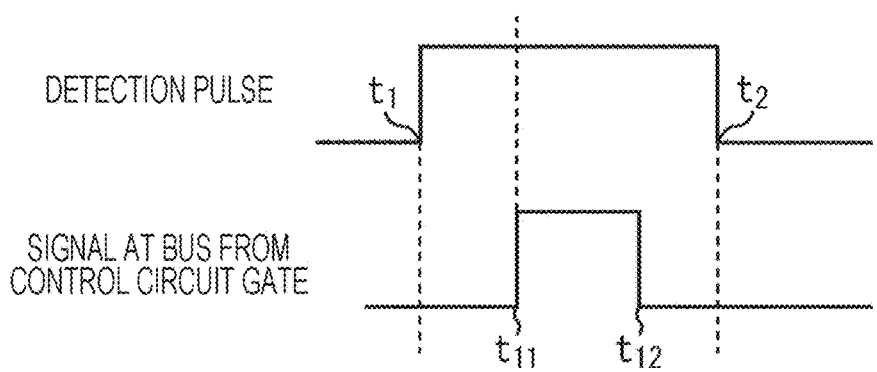
FIG. 13 is a diagram for explaining a pulse output failure detection process to be performed by the pulse output failure detector shown in FIG. 4.

Specifically, if the signals at the buses B1 through B5 are Hi signals as indicated by the period of time from t11 to t12 during a period in which the detection pulse is a Hi signal as indicated by the period of time from t1 to t2 in FIG. 13, the control signals supplied for transferring a pixel signal via the pixel control lines L at a predetermined row address in the pixel array 101 are appropriately supplied at appropriate timing. Accordingly, it is determined that there is neither a failure due to disconnection or the like of the pixel control lines L and the TCVs 93-1 and 93-2, nor a failure that might cause an abnormality in time constants or the like. Thus, the latches 182 through 186 output Hi signals indicating that there is no failure.

If it is determined in step S91 or S92 that one of the signals is not a Hi signal, on the other hand, the process moves on to step S94, and the latches 182 through 186 output Low signals. That is, it is determined that a failure due to disconnection of the pixel control lines L, or a failure that causes an abnormality in time constants or the like has been detected, and the latches 182 through 186 output Low signals indicating that there is a failure.

In step S95, the failure determination unit 181 determines whether or not the signals supplied from the latches 182 through 186 are Hi signals. If these signals are not Hi signals, or if these signals are Low signals, an occurrence of a failure is detected in step S96.

If the signals supplied from the latches 182 through 186 are Hi signals in step S95, on the other hand, it is determined that there is no failure, and the process in step S96 is skipped.

Through the above process, presence/absence of a pulse output failure can be detected. In other words, it becomes possible to check whether or not the control signals at a predetermined row address designated by the control unit 121 have been output to the designated row address at designated timing. If the output of the control signals cannot be confirmed, an occurrence of a failure can be detected.

At this point of time, it is also possible to check presence/absence of disconnection of the pixel control lines L, presence/absence of an abnormality in various kinds of time constants or the like, and presence/absence of a state in which the various control signals are fixed as Hi signals.

Furthermore, only the pixel array 101 in the imaging device 72 is provided in the upper chip 92, the other components of the imaging device 72 and the front camera ECU 73 are provided in the lower chip 91, and the upper chip 92 and the lower chip 91 are stacked and are electrically connected via the TCVs 93-1 and 93-2. With this structure, it is also possible to check presence/absence of disconnection of the TCVs 93-1 and 93-2.

Figure 12:
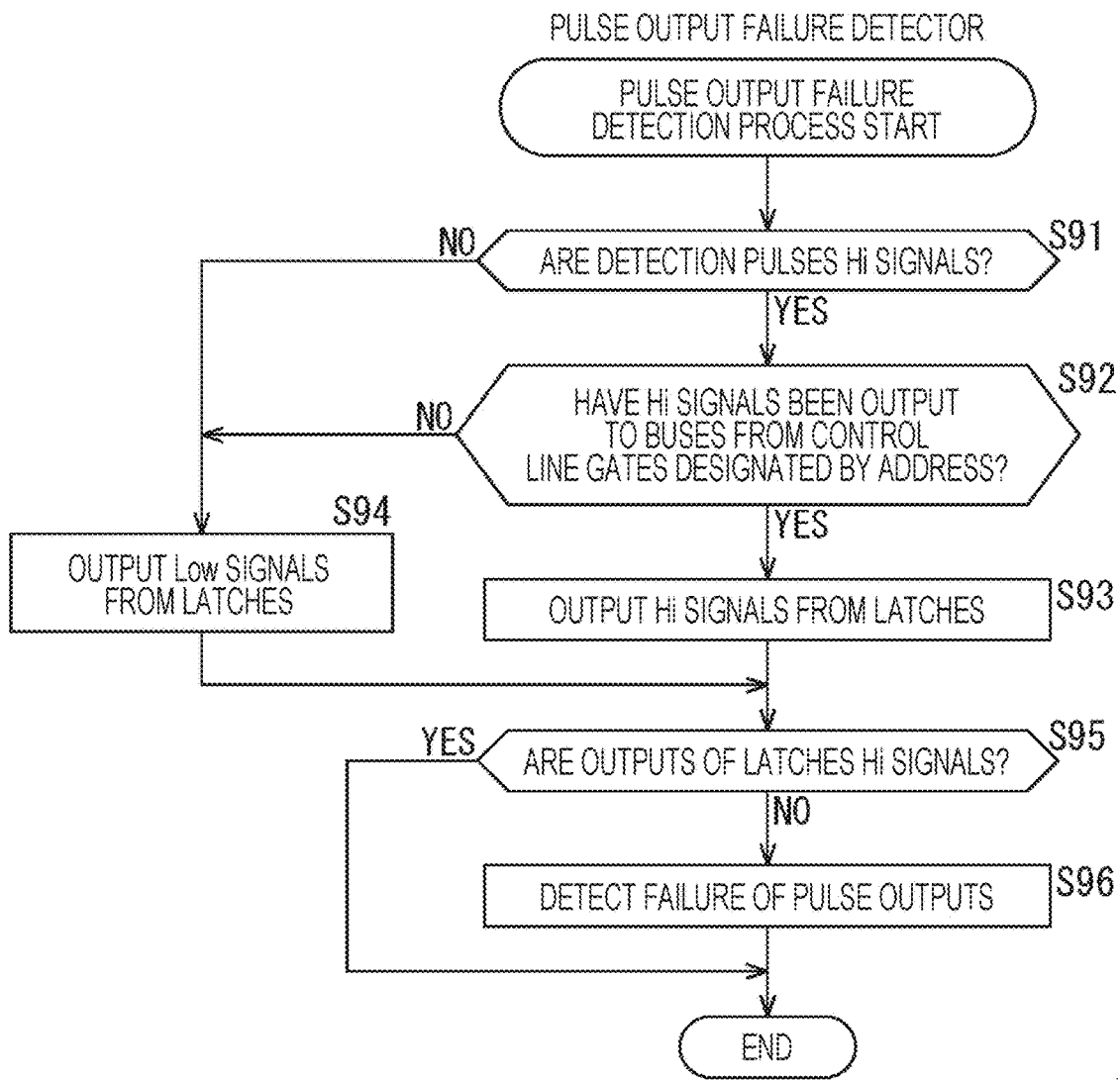
FIG. 12 is a flowchart for explaining a pulse output failure detection process to be performed by the pulse output failure detector shown in FIG. 4.

Note that, in the process in steps S91 and S92 in FIG. 12, the latches 182 through 186 determine whether or not the supplied signals are Hi signals. However, the latches 182 through 186 do not actually determine whether or not the signals are Hi signals. That is, the latches 182 through 186 are designed only to output Hi signals when the various detection pulses are Hi signals while the signals from the buses B1 through B5 are Hi signals. Therefore, the process in steps S91 and S92 in FIG. 12 merely indicates the operating conditions for the latches 182 through 186 to output Hi signals.

First Modification of the First Embodiment

In the above described example, a pulse output failure detection process is a process in which detection pulses are output to the pulse output failure detector 142 at the time when various control signals are output from the control unit 121 to the control line gate 143, and the latches 182 through 186 output Hi signals indicating that there is no failure only in a case where the timing of the various control signals at the control line gate 143 matches the timing of the output signals from the buses B1 through B5. However, all the detection pulses may be fixed Hi signals, and presence/absence of signals from the buses B1 through B5 may be checked, so that only failures due to disconnection of the pixel control lines L and the TCVs 93-1 and 93-2 are detected in a simpler manner.

Figure 14:
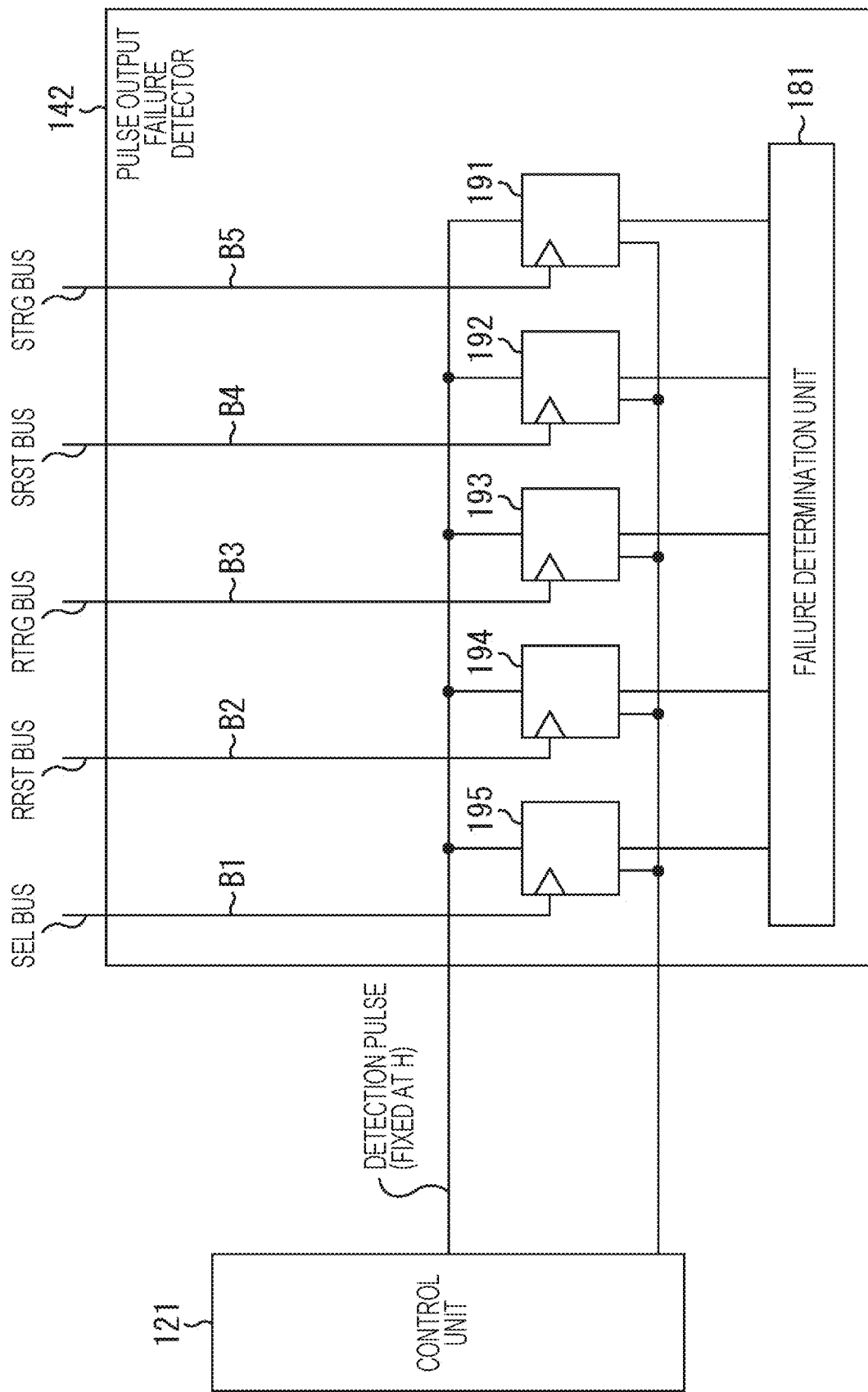
FIG. 14 is a diagram for explaining a modification of the pulse output failure detector as a first modification of the functions that form the first embodiment.

FIG. 14 shows an example configuration of the pulse output failure detector 142 having a simplified structure. Note that, in the configuration of the pulse output failure detector 142 shown in FIG. 14, the components having the same functions as the components in the pulse output failure detector 142 shown in FIG. 10 are denoted by the same reference numerals and signs, and have the same names as those in FIG. 10. Therefore, explanation of them will not be repeated below, as appropriate.

Specifically, the pulse output failure detector 142 in FIG. 14 differs from the pulse output failure detector 142 in FIG. 10 in that latches 191 through 195 having the same structure are provided in place of the latches 182 through 186, and a detection pulse is shared among the latches 191 through 195 and is supplied as a fixed Hi signal. Further, the control unit 121 supplies a reset pulse (RST pulse) to the latches 191 through 195 once in each process for one row in the horizontal direction, and thus, resets the respective latches.

With such a configuration, a pulse output failure due to disconnection or the like can be detected in a simple manner through the above described control line gate management process, in accordance with Hi signals or Low signals of the buses B1 through B5 indicating presence/absence of control signals supplied via the pixel control lines L and the TCVs 93-1 and 93-2.

Note that the functions of the control unit 121 and the pulse output failure detector 142 shown in FIG. 14 are formed with the signal processing circuit 113 in FIG. 4.

<Pulse Output Failure Detection Process by the Pulse Output Failure Detector in FIG. 14>

Figure 15:
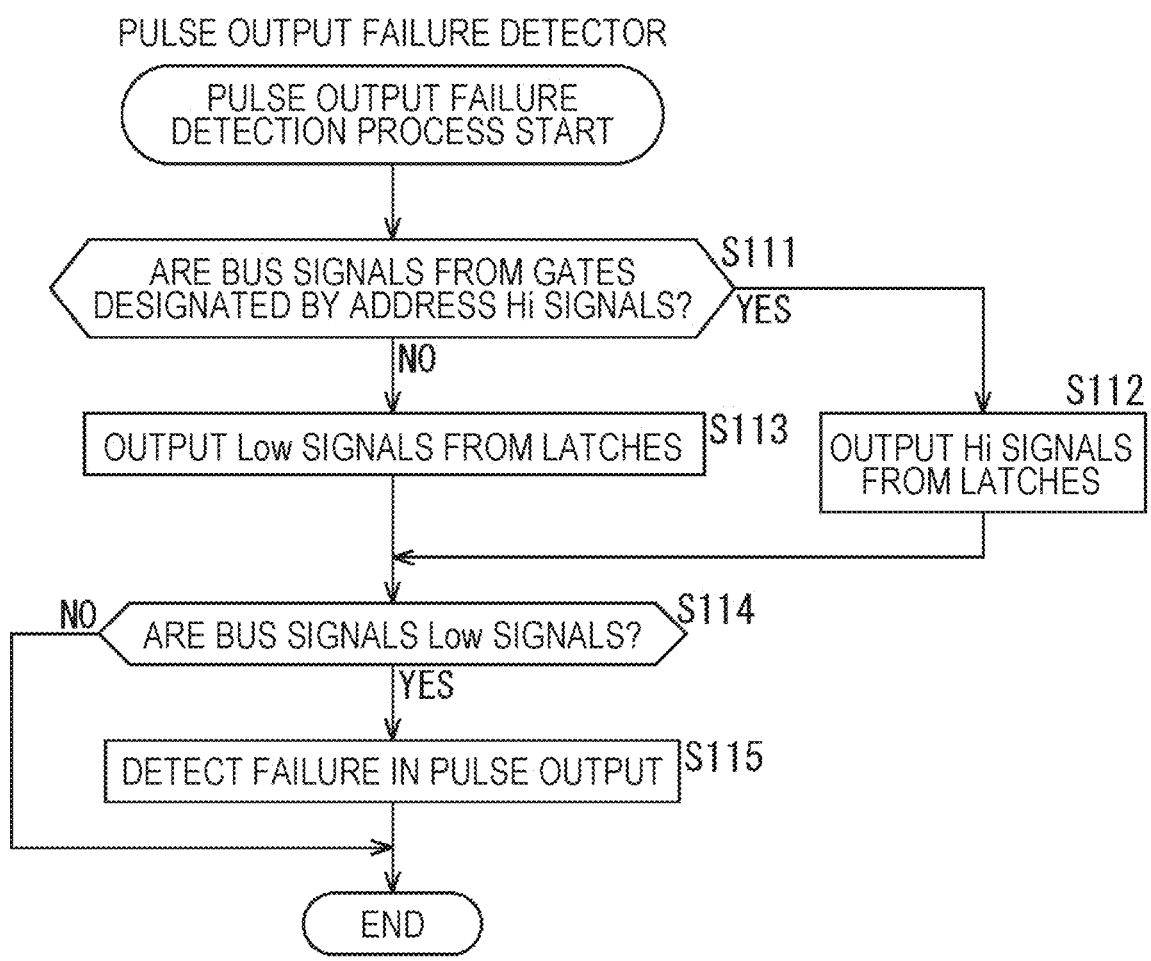
FIG. 15 is a diagram for explaining a pulse output failure detection process to be performed by the pulse output failure detector shown in FIG. 14.

Referring now to the flowchart in FIG. 15, a pulse output failure detection process by the pulse output failure detector shown in FIG. 14 is described. Note that this process will be described below on the assumption that the control line gate management process described with reference to the flowchart in FIG. 11 is performed. In this example, however, the detection pulses in the process in step S63 in FIG. 11 are not output at predetermined timings for the respective control signals, but are invariably output as Hi signals.

In step S111, the latches 191 through 195 determine whether or not the signals supplied from the corresponding buses B5, B4, B3, B2, and B1 are Hi signals, or whether or not the signals indicate that control signals have been supplied thereto. If it is determined in step S111 that the Hi signals have been supplied, the process moves on to step S112.

In step S112, since the detection pulses are fixed Hi signals, and the signals supplied from the corresponding buses B5, B4, B3, B2, and B1 are Hi signals, the latches 191 through 195 latch Hi signals indicating that no failure has been detected, and output the Hi signals.

If the signals supplied from the corresponding buses B5, B4, B3, B2, and B1 are Low signals in step S111, on the other hand, the control signals have been supplied, and therefore, it is determined that a failure such as disconnection has been detected. The process then moves on to step S113.

In step S113, the latches 191 through 195 latch and output Low signals indicating that a failure has been detected.

In step S114, the failure determination unit 181 determines whether or not a Low signal has been supplied from any of the latches 191 through 195. Then, if it is determined in step S114 that a Low signal has been supplied, the process moves on to step S115.

In step S115, the failure determination unit 181 determines that a failure has been detected, and outputs information indicating that a failure has occurred.

Through the above process, it is possible to detect, with a simple configuration, a failure related to disconnection of the pixel control lines L and the TCVs 93-1 and 93-2 in the pixel array 101.

Second Modification of the First Embodiment

In the above described example, the row drive unit 102 and the control line gate 143 are connected via the TCVs 93-1 and 93-2, with the pixel array 101 being interposed in between. However, the area in which the TCVs 93 are provided may be minimized, to reduce the total area of the upper chip 92 and the lower chip 91.

Figure 16:
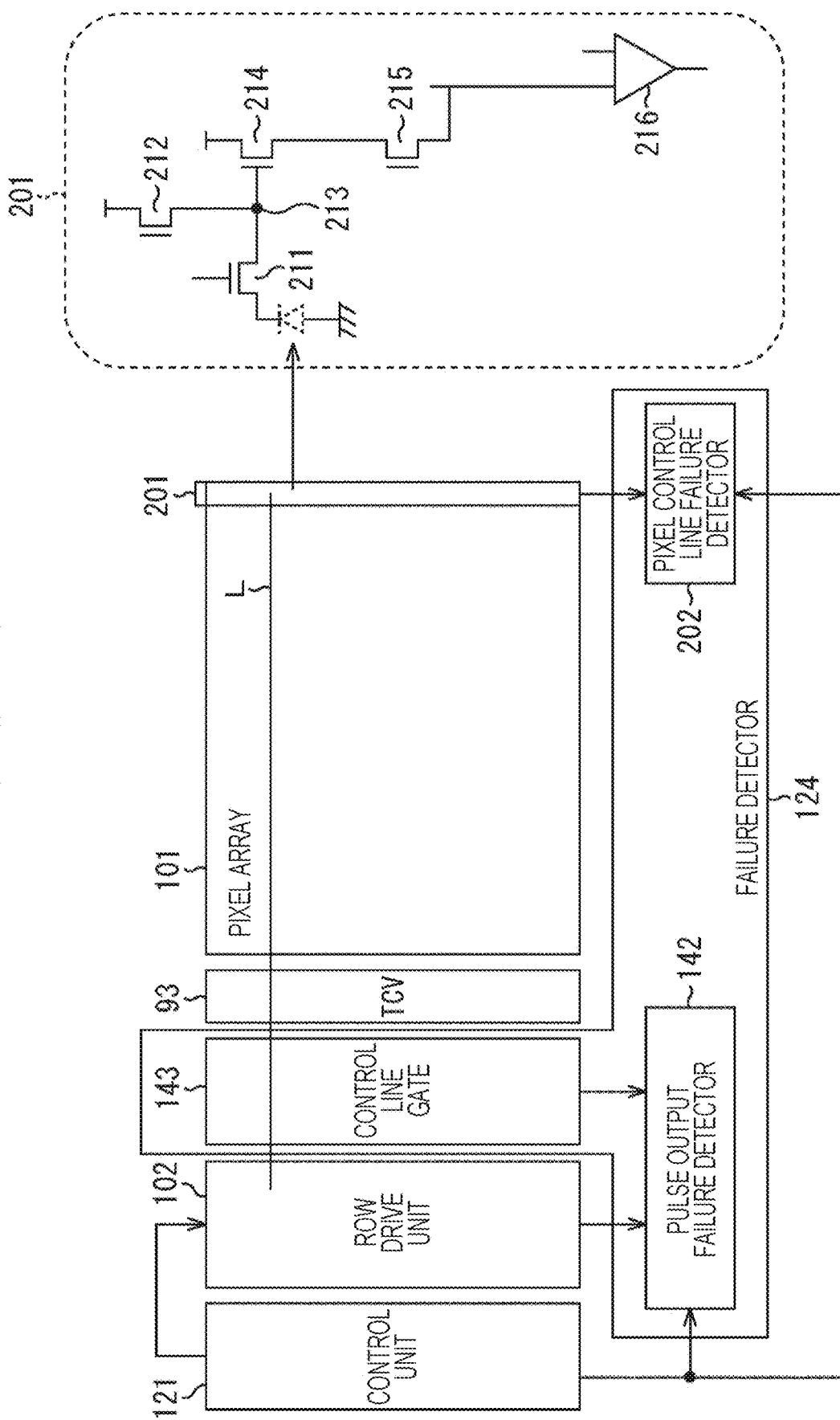
FIG. 16 is a diagram for explaining a modification of the imaging device and the front camera ECU as a second modification of the functions that form the first embodiment.

In this case, as shown in a left portion of FIG. 16, the control line gate 143 may be disposed between the pixel array 101 and the row drive unit 102, and a TCV 93 may be provided only between the pixel array 101 and the control line gate 143, for example.

With such a configuration, the portion at which the TCV 93 is provided can be reduced, and accordingly, the area relating to the TCV 93 can be reduced. Further, processing in the control line gate 143 can realize similar processing to that in the case shown in FIG. 4, and thus, it is possible to check whether the control signals output from the row drive unit 102 are output to a predetermined row address at predetermined timings.

However, where only this configuration is adopted, it is not possible to check presence/absence of disconnection of the pixel control line L and the TCV 93 in the pixel array 101.

Therefore, in the pixel array 101 shown in FIG. 16, a failure detection column 201 formed with black pixels (optical black pixels) is provided at the right end portion, and a series of controls signals necessary for reading a normal pixel signal are supplied for a predetermined row address. In this manner, a predetermined pixel value is generated, and is output to a pixel control line failure detector 202 provided in the failure detector 124. In accordance with the signal supplied from the failure detection column 201, the image control line failure detector 202 detects a failure related to disconnection of the pixel control line L and the TCV 93.

More specifically, as shown in a right portion of FIG. 16, the failure detection column 201 is formed with optical black (OPB) pixels not including any photodiode. As a series of control signals designated by a predetermined row address are supplied, a predetermined pixel signal corresponding to a black pixel is output. In FIG. 16, the portion at which a photodiode is normally disposed is denoted by the circuit symbol of a photodiode with a dotted line, which indicates that any photodiode is not provided.

More specifically, the failure detection column 201 includes a transfer transistor 211, a reset transistor 212, a floating diffusion (FD) 213, an amplification transistor 214, a selection transistor 215, and an AD converter 216.

The transfer transistor 211, the reset transistor 212, the amplification transistor 213, and the selection transistor 215 are all provided in a conventional pixel circuit, and are operated with the shutter transfer signal Shutter_TRG, the shutter reset signal Shutter_RST, the read selection signal Read_SEL, the read reset signal Read_RST, and the read transfer signal Read_TRG, which have been described above.

In addition, the pixel signal of a black pixel output from the selection transistor 215 is output to the AD converter 216. The AD converter 216 performs analog-to-digital conversion on the pixel signal, and outputs the pixel signal to the pixel control line failure detector 202.

Depending on whether or not the pixel signal supplied from the failure detection column 201 indicates the pixel value of a predetermined black pixel, the pixel control line failure detector 202 detects presence/absence of a failure related to disconnection of the pixel control lines L and the TCVs 93 in the pixel array 101.

Note that, although an example configuration not including any photodiode has been described as the configuration of the failure detection column 201, any configuration may be adopted in principle, as long as a fixed pixel value is output when a pixel signal is read out. For example, a photodiode may be disposed at the portion indicated by the dotted line in FIG. 16, to block light. A pixel circuit of black pixels may be formed in this manner.

Note that the functions of the control unit 121 and the failure detector 124 shown in FIG. 16 are formed with the signal processing circuit 113 shown in FIG. 4.

<Pixel Control Line Failure Detection Process>

Figure 17:
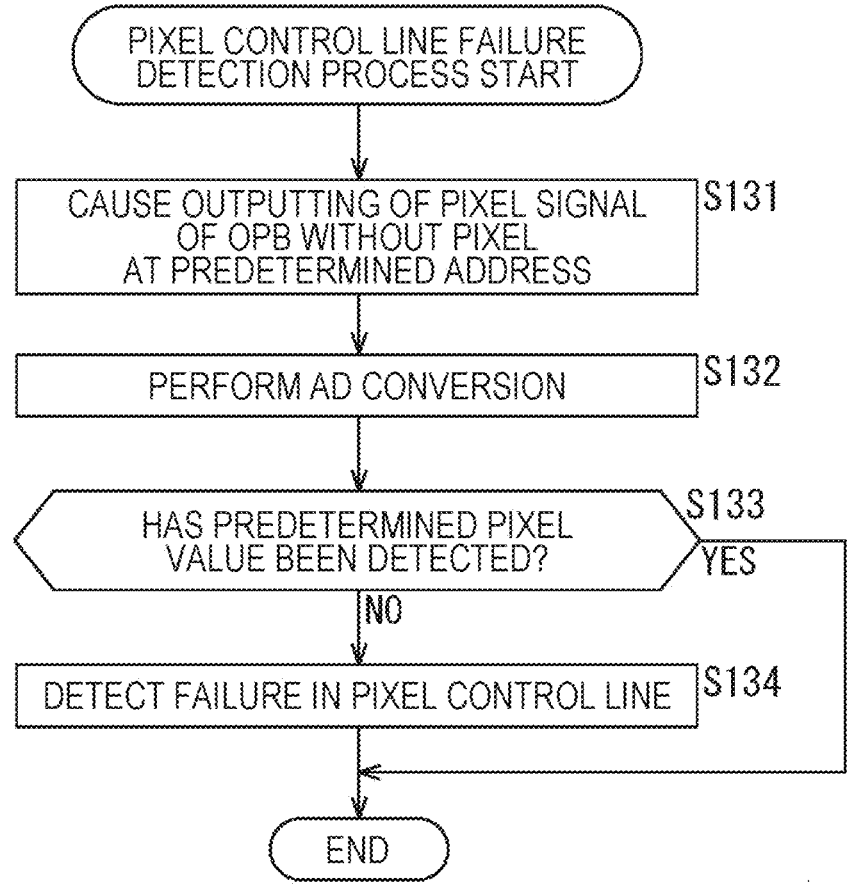
FIG. 17 is a flowchart for explaining a pixel control line failure detection process to be performed by the imaging device and the front camera ECU shown in FIG. 16.

Referring now to the flowchart in FIG. 17, a control line failure detection process to be performed by the failure detection column 201 of the pixel array 101 and the pixel control line failure detector 202 shown in FIG. 16 is described.

In step S131, the transistors 211 through 214 in the failure detection column 201 output a pixel signal of a black pixel, to the AD converter 216, as an OPB pixel without any photodiode, in accordance with control signals such as the shutter transfer signal Shutter_TRG, the shutter reset signal Shutter_RST, the read selection signal Read_SEL, the read reset signal Read_RST, and the read transfer signal Read_TRG.

In step S132, the AD converter 216 converts the pixel signal formed with an analog signal into a digital signal, and outputs the digital signal to the pixel control line failure detector 202.

In step S133, the pixel control line failure detector 202 determines whether or not the pixel value of the pixel signal formed with a black pixel is a predetermined pixel value. If the pixel value is determined not to be the predetermined pixel value in step S133, the process moves on to step S134.

In step S134, the pixel control line failure detector 202 determines that a failure due to disconnection or the like has been detected in the pixel control lines L or the TCVs 93 or the like in the pixel array 101, and outputs the result to the output unit 123.

Specifically, when a pixel control line L or a TCV 93 is disconnected, the transistors 211 through 214 cannot be operated with control signals such as the shutter transfer signal Shutter_TRG, the shutter reset signal Shutter_RST, the read selection signal Read_SEL, the read reset signal Read_RST, and the read transfer signal Read_TRG. Therefore, it is determined that the predetermined pixel value has not been output, and a failure has been detected.

If the predetermined pixel value is detected in step S133, on the other hand, the process in step S134 is skipped. Specifically, the predetermined black pixel is detected because the transistors 211 through 214 are operated with control signals such as the shutter transfer signal Shutter_TRG, the shutter reset signal Shutter_RST, the read selection signal Read_SEL, the read reset signal Read_RST, and the read transfer signal Read_TRG. Therefore, it is determined that any failure has not been detected.

Through the above process, it becomes possible to perform failure detection based on the timings at which the control signals output from the row drive unit 102 are output and the row address, while reducing the area occupied by the TCV 93. Further, at this point of time, it becomes possible to detect a failure due to disconnection of the pixel control lines L and the TCVs 93 in the pixel array 101.

2. Second Embodiment

In the above described example, row address selecting function failures, pulse output failures, and disconnection failures in pixel control lines and TCVs are detected. However, a failure in an analog-to-digital conversion circuit (ADC) may be detected so that a disconnection failure in a TCV is also detected.

Figure 18:
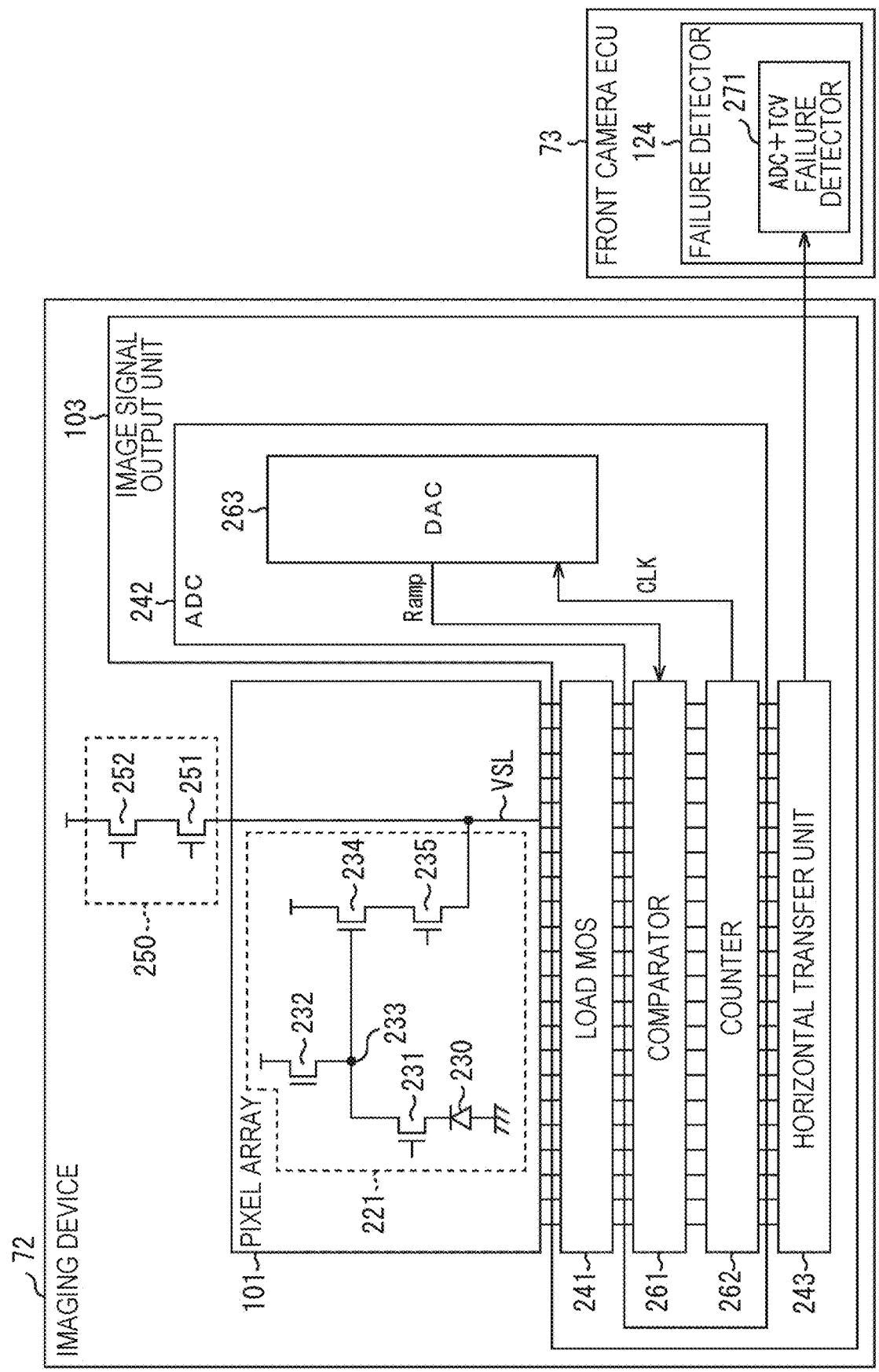
FIG. 18 is a diagram for explaining an example configuration of a second embodiment of the imaging device and the front camera ECU shown in FIG. 2.

FIG. 18 is a diagram for explaining example configurations of the imaging device 72 and the front camera ECU 73 that are designed to detect disconnection failures of an ADC and a TCV, or more particularly example configurations of the pixel array 101, the image signal output unit 103, and the failure detector 124. Note that, among the components shown in FIG. 18, the components having the same functions as those described with reference to FIG. 4 are given the same names and the same reference numerals as those shown in FIG. 4, and explanation of them is not made herein as appropriate. The components not particularly mentioned herein are the same as those shown in FIG. 4.

Specifically, the pixel array 101, the image signal output unit 103 and the failure detector 124 shown in FIG. 18 differs from the configuration shown in FIG. 4 in that the configuration of the pixel circuit of each of the pixels constituting the pixel array 101 and the configuration of the pixel signal output unit 103 are specifically shown, and an ADC+TCV failure detector 271 is added to the failure detector 124.

The pixel circuit of each of the pixels 221 arranged in an array that forms the pixel array 101 include a photodiode 230, a transfer transistor 231, a reset transistor 232, a floating diffusion (FD) 233, an amplification transistor 234, a selection transistor 235, and a vertical transfer line VSL.

Further, the vertical transfer line VSL is provided with a DSF circuit 250 that includes a switch transistor 251 and a DSF transistor 252. Note that the DSF circuit 250 including the switch transistor 251 and the DSF transistor 252 is not disposed in the pixel array 101 in the upper chip 92 but is disposed in the lower chip 91, and is connected to the vertical transfer line VSL via a TCV 93.

The configuration formed with the photodiode 230, the transfer transistor 231, the reset transistor 232, the floating diffusion (DF) 233, the amplification transistor 234, and the selection transistor 235 is similar to that of a conventional pixel circuit, and is similar to that of the pixel circuit forming each of the pixels arranged in an array in the above described pixel array 101.

Specifically, the photodiode 230 accumulates an electric charge corresponding to the amount of incident light, and outputs the electric charge as a pixel signal. The transfer transistor 231 operates with the above described shutter transfer signal Shutter_TRG and read transfer Read_TRG, and transfers the electric charge accumulated in the photodiode 230 to the FD 233, or cooperates with the reset transistor 232 to reset the photodiode 230 and the FD 233 to the reset level. Meanwhile, the reset transistor 232 operates with the above described shutter reset signal Shutter_RST and read reset signal Read_RST, to set the FD 233 to the reset level, or to set the photodiode 230 to the reset level.

The FD 233 is set to the signal level of the pixel signal supplied from the photodiode 230 or to the reset level by the reset transistor 232, and is connected to the gate of the amplification transistor 234.

The amplification transistor 234 amplifies the power supply voltage in accordance with the voltage of the accumulated electric charge in the FD 233, to output a pixel signal. The selection transistor 235 operates with the read selection signal Read_SEL, and, when selected as a row address, causes the pixel signal output from the amplification transistor 234 to be transferred to the vertical transfer line VSL.

In this example, the DSF circuit 250 including the switch transistor 251 and the DSF transistor 252 is further provided in the vertical transfer line VSL. The DSF circuit 250 outputs a pixel signal or a dummy pixel signal. More specifically, the DSF (Dummy Source Follower circuit) transistor 252 is a transistor for supplying the vertical transfer line VSL with a dummy pixel signal that is formed with a fixed signal instead of a pixel signal. The switch transistor 251 switches between outputting a pixel signal from the selection transistor 235 to the vertical transfer line VSL and outputting a dummy pixel signal from the DSF transistor 252 to the vertical transfer line VSL.

Note that the dummy pixel signal that is output when the DSF transistor 252 is turned on is a pixel signal formed with a predetermined pixel value. However, a plurality of DSF transistors 252 may be provided to output a plurality of pixel signals formed with predetermined pixel values in a switching manner. In the description below, a plurality of DSF transistors 252 that are not shown in the drawing are provided for the respective pixel signals formed with a plurality of kinds of pixel values, and these pixel signals can be selectively switched and output.

The image signal output unit 103 includes a load MOS 241, an ADC 242, and a horizontal transfer unit 243.

The load MOS 241 converts a pixel signal supplied via the vertical transfer line VSL of the pixel array 101 from a current value to a voltage value, and supplies the converted value to the ADC 242.

The ADC 242 converts the pixel signal formed with an analog signal supplied from the load MOS 241 into a digital signal, and outputs the digital signal to the horizontal transfer unit 243.

More specifically, the ADC 242 includes a comparator 261, a counter 262, and a digital-to-analog converter (DAC) 263.

The comparator 261 performs a comparison between a ramp voltage (Ramp) that is supplied from the DAC 263 and varies at predetermined step intervals in synchronism with a clock from the counter 262, and a pixel signal formed with the analog signal input from the load MOS 241. The comparator 261 then supplies the comparison result to the counter 262.

The counter 262 repeatedly performs counting, and outputs the count value at a time when the comparison result in the comparator 261 is inverted as a digital signal to the horizontal transfer unit 243. The counter 262 also supplies a clock signal to the DAC 242.

The DAC 263 generates a ramp voltage (Ramp) by changing the ramp voltage at a predetermined step in synchronization with the clock signal from the counter 262, and supplies the ramp voltage to the comparator 261. Note that the DAC 263 corresponds to the DAC 112 in the floor plan in FIG. 4.

The horizontal transfer unit 243 supplies the image processing unit 122 with the pixel signal converted to the digital signal supplied from the ADC 242, and also supplies the pixel signal to the ADC+TVC failure detector 271 in the failure detector 124.

The ADC+TVC failure detector 271 controls the DSF circuit 250 to output a dummy pixel signal during a blanking period or the like, for example, and compares the pixel signal converted to a digital signal by the ADC 242 with a predetermined pixel signal that is set as the dummy pixel signal in advance. Depending on whether or not the converted pixel signal matches the predetermined pixel signal, the ADC+TCV failure detector 271 detects a failure in the ADC 242, or a failure due to the presence of disconnection of the pixel control line L and the TCV 93 or the like.

Figure 19:
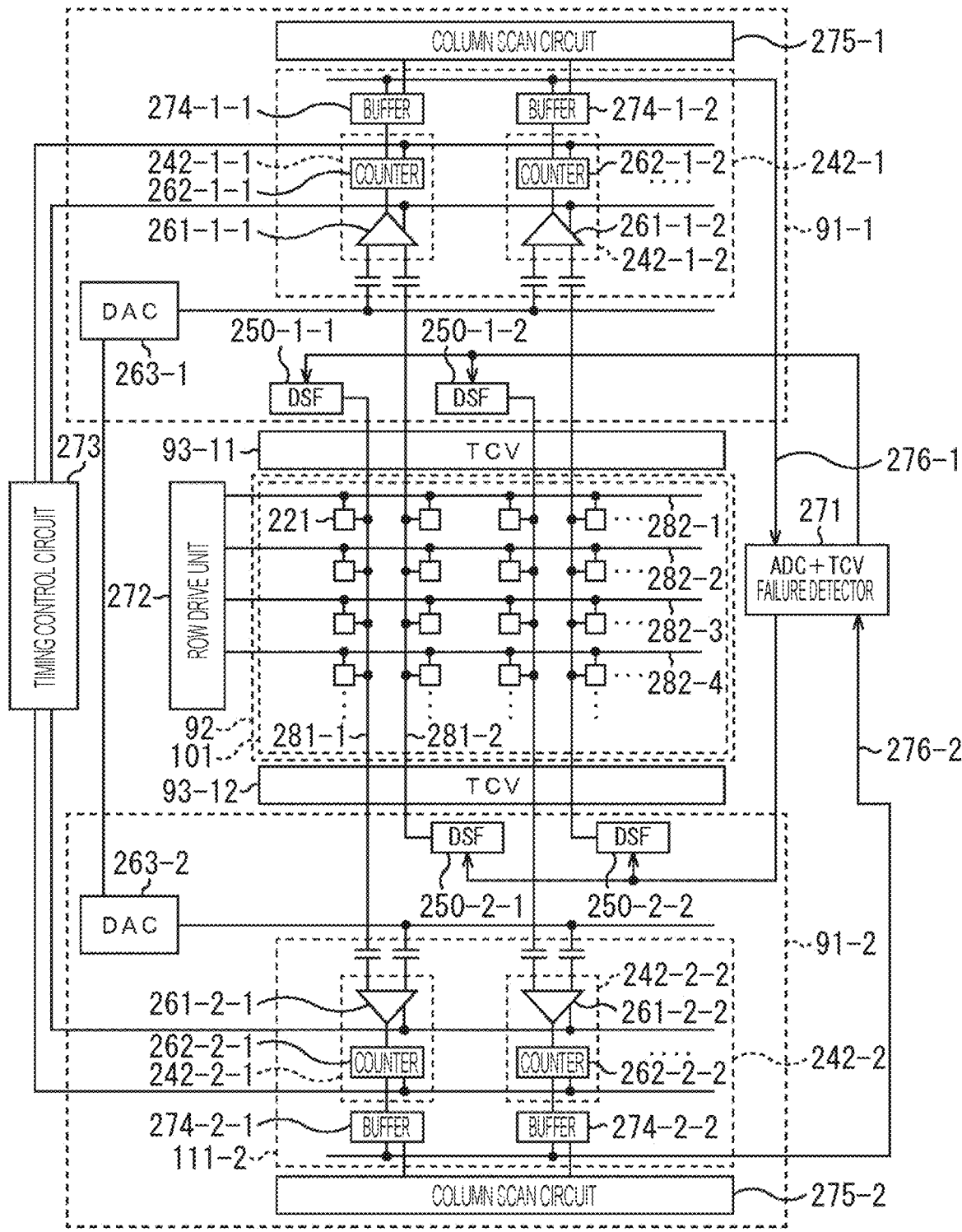
FIG. 19 is a diagram for explaining an ADC+TCV failure detection process to be performed by the imaging device and the front camera ECU shown in FIG. 18.

More specifically, as shown in FIG. 19, for example, the lower chip 91 is divided into two regions formed with lower chips 91-1 and 91-2, and ADCs 242-1 and 242-2 are arranged in a column. Further, the lower chips 91-1 and 91-2 are electrically connected to the upper chip 92 in which the pixel array 101 shown in FIG. 18 is provided, via TCVs 93-11 and 93-12, respectively. Here, the ADCs 242-1 and 242-2 shown in FIG. 19 correspond to the column ADCs 111-1 and 111-2 in FIG. 4.

In addition, the outputs of the pixels 221 are controlled by row control lines 282-1, 282-2, .... A row drive unit 272 performs control so that the pixel signals of the pixels 221 in a predetermined row are output. The pixel signals output from the pixels 221 transmit through column signal lines 281-1, 281-2, ..., and are output to the column ADCs 242-1 and 242-2.

Meanwhile, DSF circuits 250-1 (250-1-1, 250-1-2, ...) are provided in the lower chip 91-1, and supply a dummy pixel signal to ADCs 242-2 (242-2-1, 242-2-2, ...) of the other lower chip 91-2 via the TCVs 93-11 and 93-12 and the pixel array 101. Likewise, DSF circuits 250-2 (250-2-1, 250-2-2, ...) are provided in the lower chip 91-2, and supply a dummy pixel signal to ADCs 242-1 (242-1-1, 242-1-2, ...) of the other lower chip 91-1 via the TCVs 93-11 and 93-12 and the pixel array 101. Note that the number of divisions of the lower chip 91 may be two or more. In this case, the same number of ADCs 242 and the same number of DSF circuits 250 as the number of divisions are provided in the respective divided regions.

The ADCs 242-1 (242-1-1, 242-1-2, ...) each compare the magnitude of a pixel signal output from the pixel array 101 with the magnitude of a ramp voltage supplied from a DAC 263-1 with comparators 261-1 (261-1-1, 261-1-2, ...), and gives a binary result to counters 262-1 (262-1-1, 262-1-2, ...).

The ADCs 242-2 (242-2-1, 242-2-2, ...) each compare the magnitude of a pixel signal output from the pixel array 101 with the magnitude of a ramp voltage supplied from a DAC 263-2 with comparators 261-2 (261-2-1, 261-2-2, ...), and gives a binary result to counters 262-2 (262-2-1, 262-2-2, ...).

The comparators 261-1 and 261-2 have auto zero circuits that use a PSET signal supplied from a timing control circuit 273 as a trigger, and set an offset that is the difference in level between the pixel signal supplied from the pixels 221 and the ramp voltage to zero.

The counters 262-1 and 262-2 perform a counting operation in accordance with a counter control signal supplied from the timing control circuit 273. The counter clock is masked by the outputs of the comparators 261-1 and 261-2, so that a digital signal corresponding to the level of the pixel signal can be obtained.

Bus buffers 274-1 (274-1-1, 274-1-2, ...) are designed for controlling outputs, and include latch circuits. The bus buffers 274-1 each output a value to a horizontal output line 276-1, in accordance with a selection signal from a column scan circuit 275-1.

Bus buffers 274-2 (274-2-1, 274-2-2, ...) are designed for controlling outputs, and include latch circuits. The bus buffers 274-2 each output a value to a horizontal output line 276-2, in accordance with a selection signal from a column scan circuit 275-2.

The timing control circuit 273 controls the overall operation sequence in the imaging device 72, with a master clock MCK being the operation timing reference.

The ADC+TVC failure detector 271 controls the DSF circuits 250-1 and 250-2 to output a dummy pixel signal via the pixel array 101 and the TCVs 93-11 and 93-12, and causes the ADCs 242-1 and 242-2 to convert a pixel signal into a digital signal. Depending on whether or not the pixel signal is formed with a predetermined pixel value, the ADC+TCV failure detector 271 detects an abnormality in the ADCs 242-1 and 242-2 and a failure due to disconnection of the TCVs 93-11 and 93-12.

More specifically, the ADC+TVC failure detector 271 controls the DSF circuits 250-1 of the lower chip 91-1, so that a dummy pixel signal is output to the ADCs 242-2 of the lower chip 91-2 via the pixel array 101 and the TCVs 93-11 and 93-12, and the ADCs 242-2 convert a pixel signal into a digital signal. Depending on whether or not the pixel signal is formed with a predetermined pixel value, the ADC+TCV failure detector 271 detects an abnormality in the ADCs 242-2 and a failure due to disconnection of the TCVs 93-11 and 93-12.

Likewise, the ADC+TCV failure detector 271 controls the DSF circuits 250-2 of the lower chip 91-2, so that a dummy pixel signal is output to the ADCs 242-1 of the lower chip 91-1 via the pixel array 101 and the TCVs 93-11 and 93-12, and the ADCs 242-1 convert a pixel signal into a digital signal. Depending on whether or not the pixel signal is formed with a predetermined pixel value, the ADC+TCV failure detector 271 detects an abnormality in the ADCs 242-1 and a failure due to disconnection of the TCVs 93-11 and 93-12.

Furthermore, an operation test on mounting may be further conducted to detect a failure as an operation abnormality, on the premise that there is no abnormalities in the ADCs 242 and the TCVs 93.

<First Operation Test>

Figure 20:
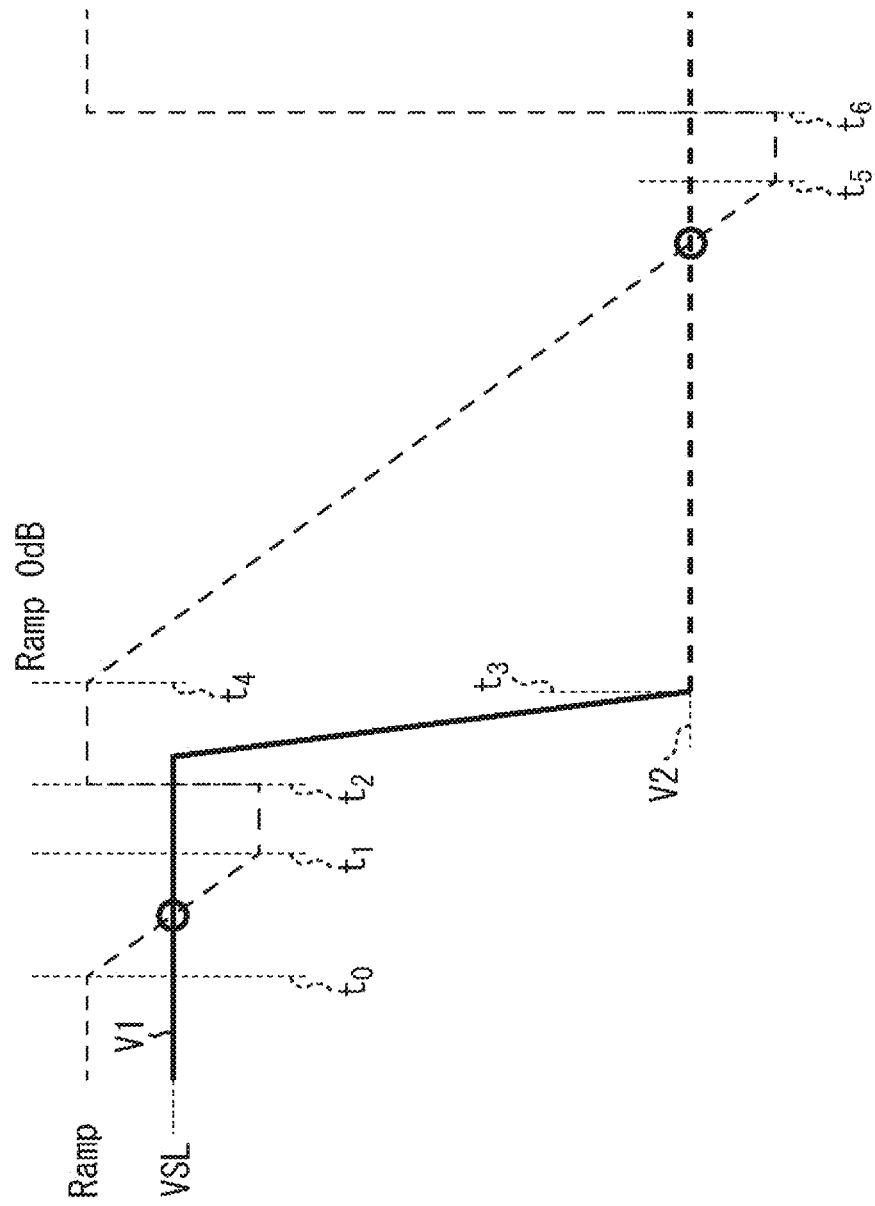
FIG. 20 is a diagram for explaining a first operation test in the ADC+TCV failure detection process to be performed by the imaging device and the front camera ECU shown in FIG. 18.

As shown in FIG. 20, for example, the ADC+TVC failure detector 271 controls the DSF circuit 250, to realize the following series of operations: a dummy pixel signal formed with a potential V1 at the reset level is generated, and the ADC 242 obtains a pixel signal at the reset level; and a dummy pixel signal formed with a potential V2 at a predetermined signal level for the potential of the DSF circuit 250, and a pixel signal at the signal level is obtained. The ADC+TCV failure detector 271 may detect an operation failure by checking whether or not a pixel signal that is the difference between the signal level and the reset level is output as a predetermined pixel signal.

In this manner, it is possible to perform failure detection based on whether or not an abnormality has occurred in the reading of a pixel signal by correlated double sampling.

Note that, in FIG. 20, the solid line indicates the pixel value of the dummy pixel signal that is output by controlling the DSF circuit 250, and the dashed line indicates the change in the ramp voltage. Between time t0 and time t2, the potential V1 at the reset level is output as the dummy pixel signal, and the ramp potential becomes lower during this period. At the timing indicated by a circle between time t0 and time t1, the comparison result from the comparator 261 inverts. Accordingly, at this timing, a pixel signal formed with a digital signal at the reset level is obtained from the value of the counter at the ramp voltage corresponding to the reset level potential V1.

In addition, at time t3, the DSF circuit 250 is controlled, and a dummy pixel signal corresponding to the potential V2 is output as a pixel signal at the signal level. The ramp voltage is reset at time t4, and falls again between time t4 and time t5. As the comparison result from the comparator 261 inverts at the timing indicated by a circle between time t4 and t5, a pixel signal formed with a digital signal at the signal level is output at this timing.

If the difference between the reset level and the signal level obtained in this manner is obtained as a pixel value, and the pixel value is a predetermined pixel value that has been set in advance, there is no failure due to disconnection of the ADC 242 and the TCV 93. Further, it is also possible to confirm that any operation failure has occurred in a pixel signal reading process by CDS.

Note that the pixel value of the dummy pixel signal that is indicated by the solid line in FIG. 20 and is output through control of the DSF circuit 250 is output from the pixel array 101 in the floor plan in FIG. 4. Also, the ramp voltage indicated by the dashed line in FIG. 20 is output by the DAC 111 in the floor plan in FIG. 4. That is, the DAC 263 corresponds to the DAC 111.

<Second Operation Test>

The gain in analog-to-digital conversion may be changed to obtain an AD conversion result, and an operation failure due to a gain error may be detected.

Figure 21:
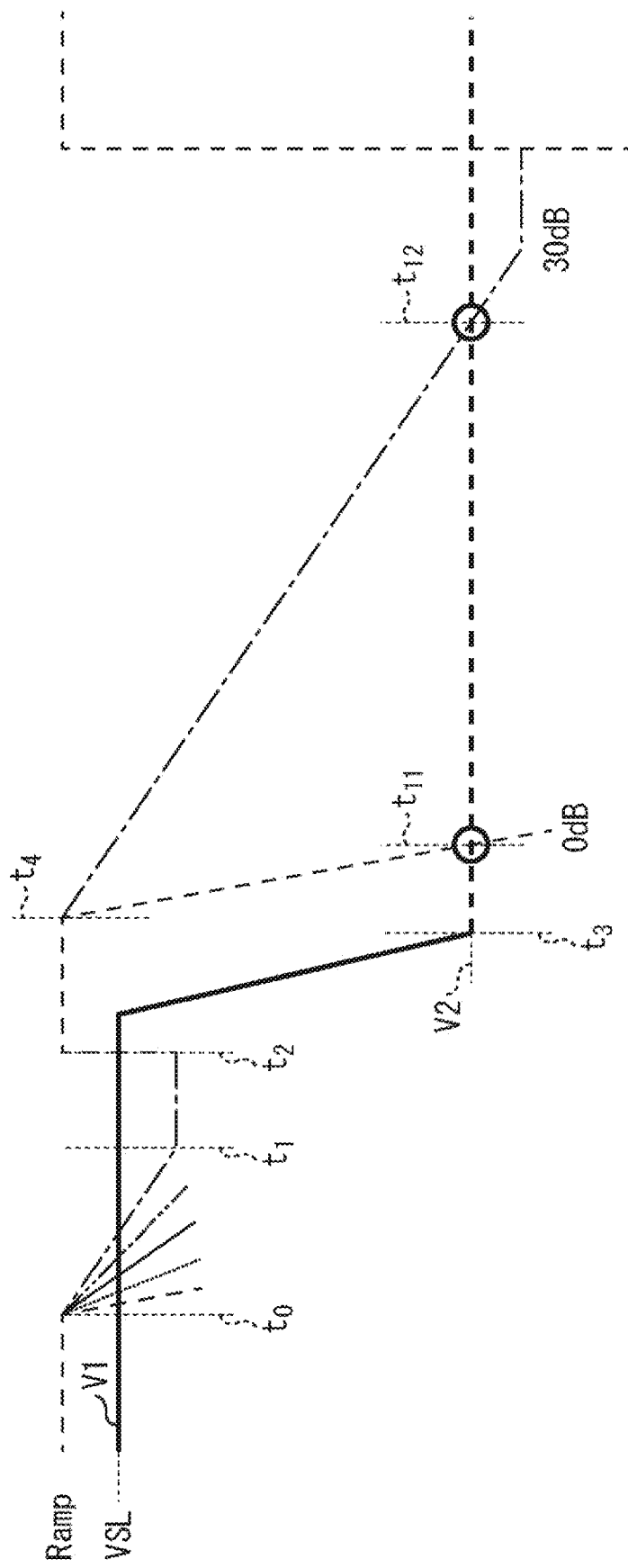
FIG. 21 is a diagram for explaining a second operation test in the ADC+TCV failure detection process to be performed by the imaging device and the front camera ECU shown in FIG. 18.

As shown in FIG. 21, the step width of the ramp voltage is changed, and the value of the counter is multiplied by the analog gain. In this manner, an AD conversion result is checked.

Specifically, as shown in FIG. 21, the step width that is the rate of change in the ramp voltage is changed, and each AD conversion result is checked to determine whether each signal has been converted into a predetermined digital signal. For example, at time t3, the operation of the DSF circuit 250 is controlled, so that a dummy pixel signal corresponding to the potential V2 is output.

At this point of time, an operation failure due to a gain error may be detected, depending on whether or not the pixel signal converted into the digital signal obtained at time t11 through the change in a 0-dB ramp voltage that is indicated by a dashed line in FIG. 21, for example, and the pixel signal converted into the digital signal obtained at time t12 through the change in a 30-dB ramp voltage indicated by a dot-and-dash line, for example, match respective pixel signals that have been set in advance.

Note that the pixel value of the dummy pixel signal that is indicated by the solid line in FIG. 21 and is output through control of the DSF circuit 250 is output from the pixel array 101 in the floor plan in FIG. 4. Also, the ramp voltage indicated by the dashed line in FIG. 21 is output by the DAC 111 in the floor plan in FIG. 4. That is, the DAC 263 corresponds to the DAC 111.

<Third Operation Test>

To detect an operation failure, a check may be made to determine whether or not an operation for a sunspot correction process is performed.

In a case where a sunspot appears, a pixel signal at the reset level cannot be obtained. In such a case, the signal level corrects the pixel signal by counting the value of the counter to the maximum value.

Figure 22:
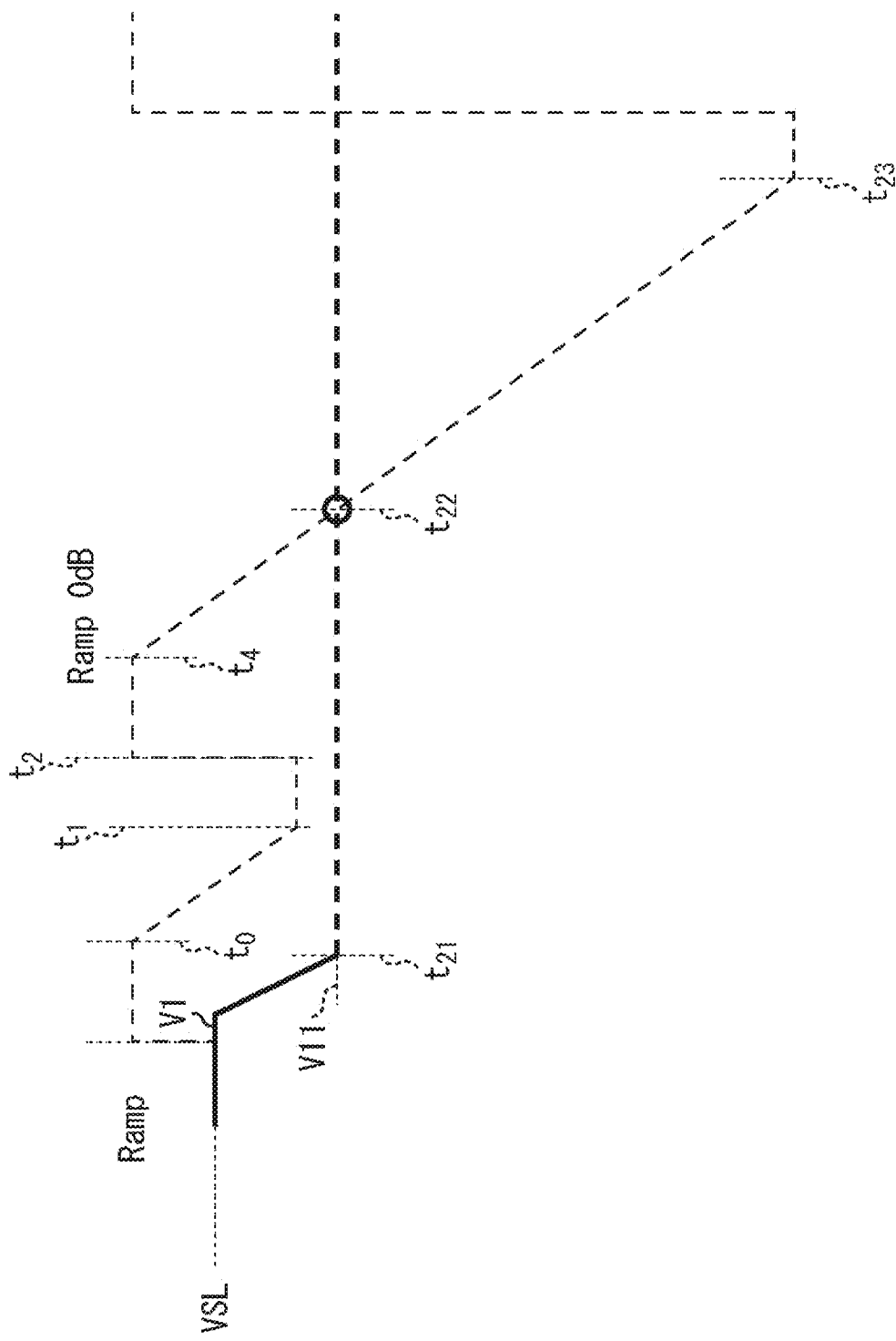
FIG. 22 is a diagram for explaining a third operation test in the ADC+TCV failure detection process to be performed by the imaging device and the front camera ECU shown in FIG. 18.

Therefore, as shown in FIG. 22, at the time t21, which is before the t1-t2 period for determining the reset level, the operation of the DSF circuit 250 is controlled, so that a dummy pixel signal formed with a potential V11 that cannot be set at the reset level is output. After that, in a case where a pixel signal at the signal level is detected after time t4, a check is made at time t23 to determine whether or not a sunspot correction process is to be performed, depending on whether or not to perform an operation to count the counter value up to the maximum value, even if the comparator inverts at time t22, as will be shown thereafter. In this manner, an operation failure is detected.

Note that the pixel value of the dummy pixel signal that is indicated by the solid line in FIG. 22 and is output through control of the DSF circuit 250 is output from the pixel array 101 in the floor plan in FIG. 4. Also, the ramp voltage indicated by the dashed line in FIG. 22 is output by the DAC 111 in the floor plan in FIG. 4. That is, the DAC 263 corresponds to the DAC 111.

<Fourth Operation Test>

To detect an operation failure, a check may be made to determine whether or not a clamp operation at a time of dark-current clamp is performed.

Specifically, in a case where there is noise due to dark current, the value for the ramp voltage is clamped by the amount equivalent to the pixel signal formed with the noise due to the dark current. Thus, the pixel signal is corrected.

Figure 23:
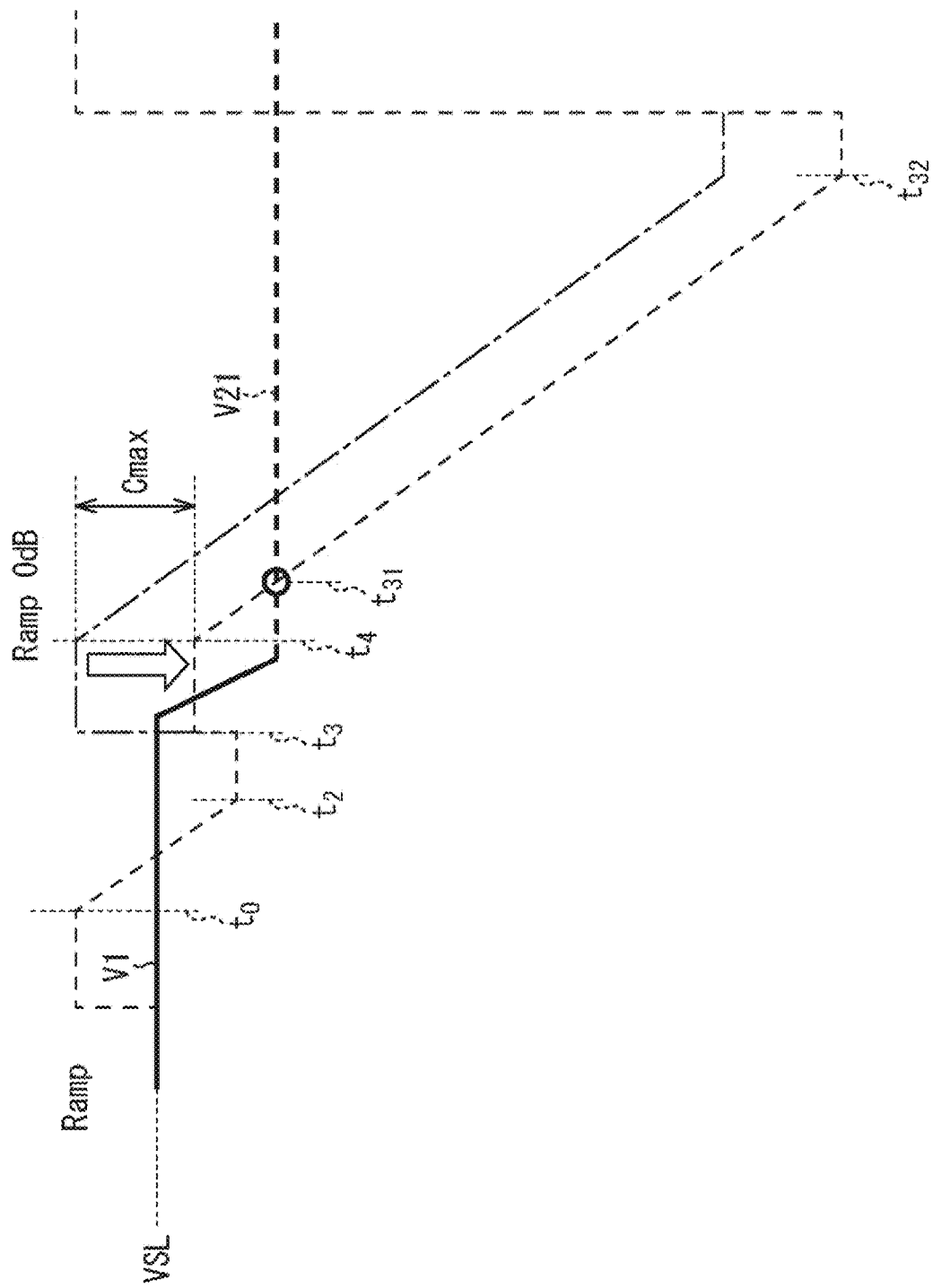
FIG. 23 is a diagram for explaining a fourth operation test in the ADC+TCV failure detection process to be performed by the imaging device and the front camera ECU shown in FIG. 18.

Therefore, as shown in FIG. 23, after the reset level at time t2 is detected, a dummy pixel signal is set to a pixel signal V21 that is such that a pixel signal with the maximum clamp value Cmax can be detected. An operation failure may be then detected, depending on whether or not a predetermined digital signal is obtained, and a clamp operation is to be performed.

Note that the pixel value of the dummy pixel signal that is indicated by the solid line in FIG. 23 and is output through control of the DSF circuit 250 is output from the pixel array 101 in the floor plan in FIG. 4. Also, the ramp voltage indicated by the dashed line in FIG. 23 is output by the DAC 111 in the floor plan in FIG. 4. That is, the DAC 263 corresponds to the DAC 111.

<ADC+TCV Failure Detection Process>

Figure 24:
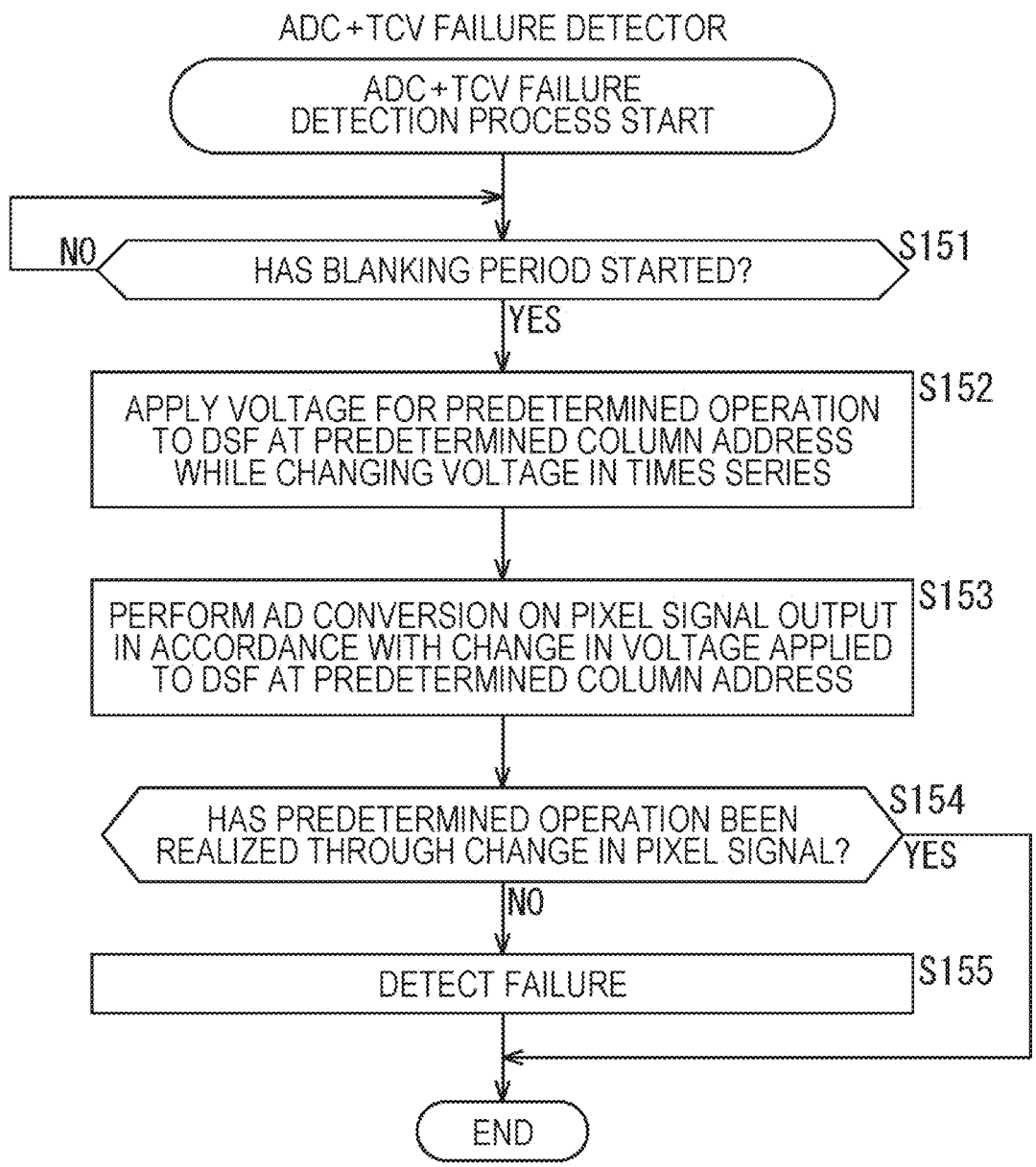
FIG. 24 is a flowchart for explaining an ADC+TCV failure detection process to be performed by the imaging device and the front camera ECU shown in FIG. 19.

Referring now to the flowchart in FIG. 24, an ADC+TCV failure detection process to be performed by the ADC+TCV failure detector 271 is described.

In step S151, the ADC+TCV failure detector 271 determines whether or not a blanking period in image processing has started, and repeats a similar process until a blanking period starts. Then, if a blanking period has started in step S151, the process moves on to step S152.

In step S152, the ADC+TCV failure detector 271 operates the DSF circuit 250-1 at a predetermined column address, so that a dummy pixel signal is output while being changed in time series to comply with one of the above described first through fourth operation tests.

In step S153, the ADC 242-2 converts the pixel signal output as the dummy pixel signal into a digital signal, and sequentially supplies the digital signal to the ADC+TCV failure detector 271.

In step S154, in accordance with the time-series change in the pixel signal that has been output as the dummy pixel signal supplied from the ADCs 242-2 and been converted into a digital signal, the ADC+TCV failure detector 271 determines whether or not a predetermined operation result has been obtained from an operation test among the above described first through fourth operation tests. If a predetermined operation result has not been obtained from an operation test among the first through fourth operation tests in step S154, the process moves on to step S155.

In step S155, the ADC+TCV failure detector 271 detects an operational abnormality in the ADCs 242-2 and a disconnection failure in the TCVs 93-11 and 93-12, or an operation failure related to an operation checked by the first through fourth operation tests, and supplies the detection result to the output unit 123.

If a predetermined operation result has been obtained from an operation rest among the first through fourth operation tests in step S154, on the other hand, it is determined that neither disconnection failures in the ADCs 242-2 and the TCVs 93-11 and 93-12, nor operation failures related to an operation checked by an operation test among the first through fourth operation tests have occurred. Therefore, the process in step S155 is skipped.

Through the above described process, it becomes possible to detect presence/absence of an operational abnormality in the ADCs 242, presence/absence of disconnection of the TCVs 93, and presence/absence of an operation failure checked by the first through fourth operation tests.

Note that, in the above described example, one of the above described first through fourth operation tests is conducted during a blanking period. However, the first through fourth operation tests may be sequentially switched and performed every time a blanking period starts, or two or more of these operation tests may be performed during one blanking period, for example.

Also, in the above described example, the DSF circuits 250-1 are controlled to generate dummy pixel signals, and pixel signals are subjected to AD conversion by the ADCs 242-2. However, it is of course possible to control the DSF circuits 250-2 so that dummy pixel signals are generated, and pixel signals are subjected to AD conversion by the ADCs 242-1.

First Modification of the Second Embodiment

Figure 25:
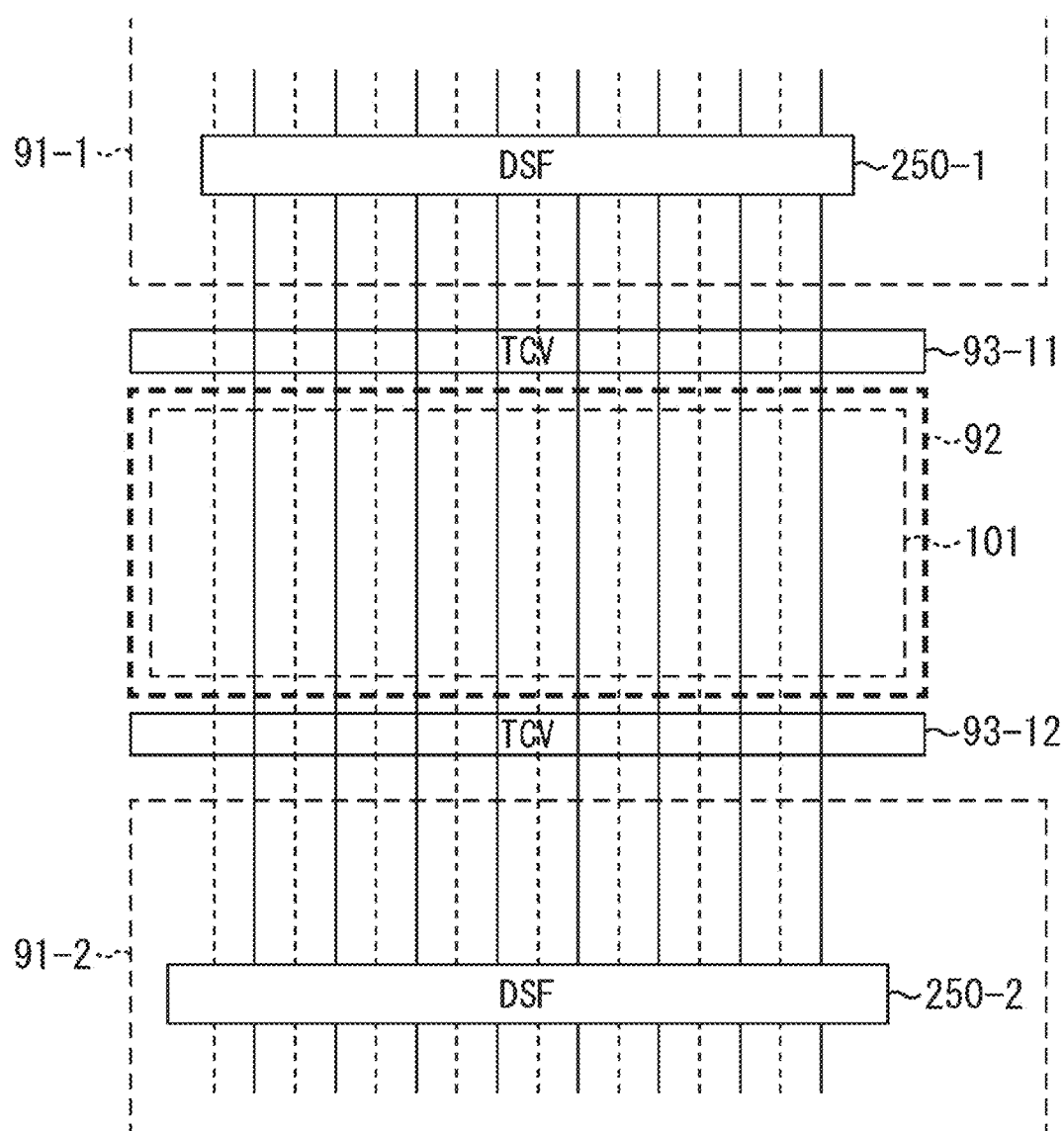
FIG. 25 is a diagram for explaining a first modification of the functions that form the second embodiment.

In the above described example, the set potentials of dummy pixel signals that can be controlled by the DSF circuit 250 are set at the same potential in the vertical transfer line VSL of each column. However, different pixel potentials may be set. For example, as shown in FIG. 25, the dummy pixel signals in the VSLs indicated by dotted lines and the VSLs indicated by solid lines in columns adjacent to one another may be alternately set at a first potential and a second potential that is higher than the first potential. When short-circuiting occurs between the adjacent vertical transfer lines VSL in such a configuration, the pixel value of a pixel signal converted into a digital signal by the ADC 242 changes. Thus, the short-circuiting between the vertical transfer lines VSL can be detected.

Note that, in the above described example, the pixel array 101, the row drive unit 102, and the image signal output unit 103 are provided as the components of the imaging device 72, while the control unit 121, the image processing unit 122, the output unit 123, the failure detector 124, and the control line gate 143 are provided as the components of the front camera ECU 73. However, in addition to the pixel array 101, the row drive unit 102, and the image signal output unit 103, the control unit 121 (or only the function related to failure detection among the functions thereof), the failure detector 124, and the control line gate 143 may also be provided as the components of the imaging device 72. As the imaging device 72 is made to have some of the functions of the front camera ECU 73 in this manner, failure detection can be singly performed by the imaging device 72. Further, it is also possible to replace a conventional imaging device with the imaging device 72 of the present disclosure. Thus, failure detection becomes possible even in a machine that used to have no imaging device capable of failure detection.

3. Third Embodiment

In the example described in the first embodiment, driving support is ended when a failure is detected through a driving support process. However, even if a failure is detected, the portion with the failure may be corrected or the like so that the driving support can be continued.

Specifically, the ADCs 242 are formed on a column-by-column basis. Therefore, in a case where a failure occurs in a column, noise is included in pixel signals in the row or the column having the failure, resulting in vertical streak noise or horizontal streak noise.

To counter that in such a case, the pixel signals of the row or the column where a failure has been detected are corrected with the pixel signals of rows or columns having no failures. In this manner, a failure occurrence may be solved by correction so that the driving support process can be continued.

Figure 26:
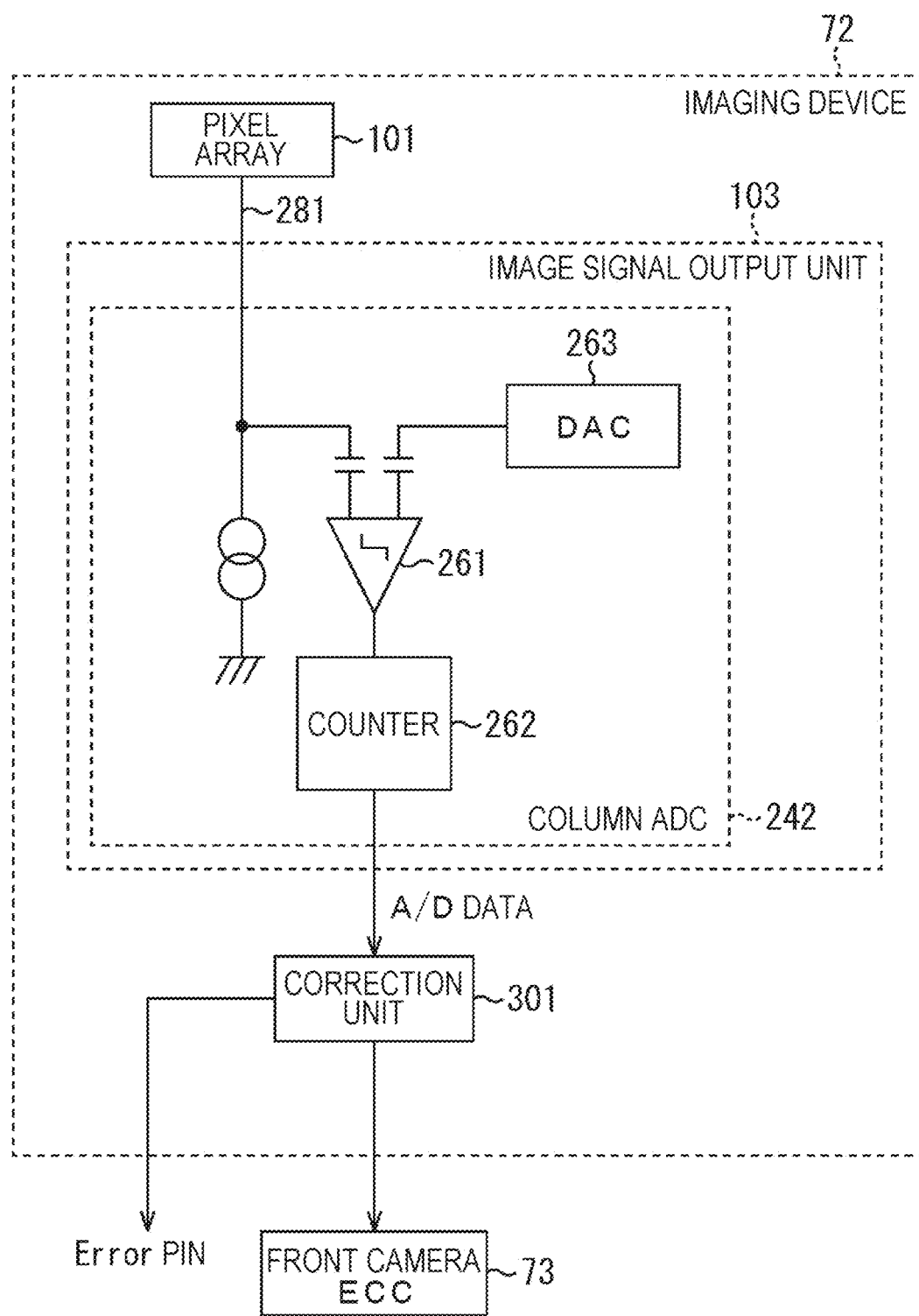
FIG. 26 is a diagram for explaining an example configuration of the functions that form a third embodiment.

FIG. 26 shows an example configuration of an imaging device 72 designed to be capable of correction and output in a case where vertical streak noise or horizontal streak noise has appeared due to an abnormality in the ADCs 242 that perform AD conversion column by column. Note that components such as the row drive unit 102 related to control are not shown in the configuration of the imaging device 72 in FIG. 26.

Specifically, the imaging device 72 in FIG. 26 includes a pixel array 101, an image signal output unit 103, and a correction unit 301. Although the configuration of one column is shown in FIG. 26, the ADCs 242 for all the columns are provided in practice, and pixel signals of the respective columns are converted into digital signals by the ADCs 242. The digital signals are then output to the correction unit 301. Note that, in the image signal output unit 103 shown in FIG. 26, the configuration of the ADC 242 described above with reference to FIG. 18 is shown in a simplified manner, and only the configuration of one column is shown.

The correction unit 301 detects presence/absence of an occurrence of a failure by detecting presence/absence of horizontal streak noise and vertical streak noise. In a case where there is a failure, the correction unit 301 outputs a signal indicating an occurrence of an error from an error pin to the MCU 74.

Further, in a case where horizontal streak noise or vertical streak noise has been detected, the correction unit 301 uses the pixel signals of normal rows and the pixel signals of normal columns in correcting the pixels signals of the row and the pixel signals of the column causing the horizontal streak noise and the vertical streak noise, so that the corrected pixel signals are output. Note that an example configuration of the correction unit 301 will be described in detail with reference to FIG. 27.

<Example Configuration of the Correcting Unit>

Figure 27:
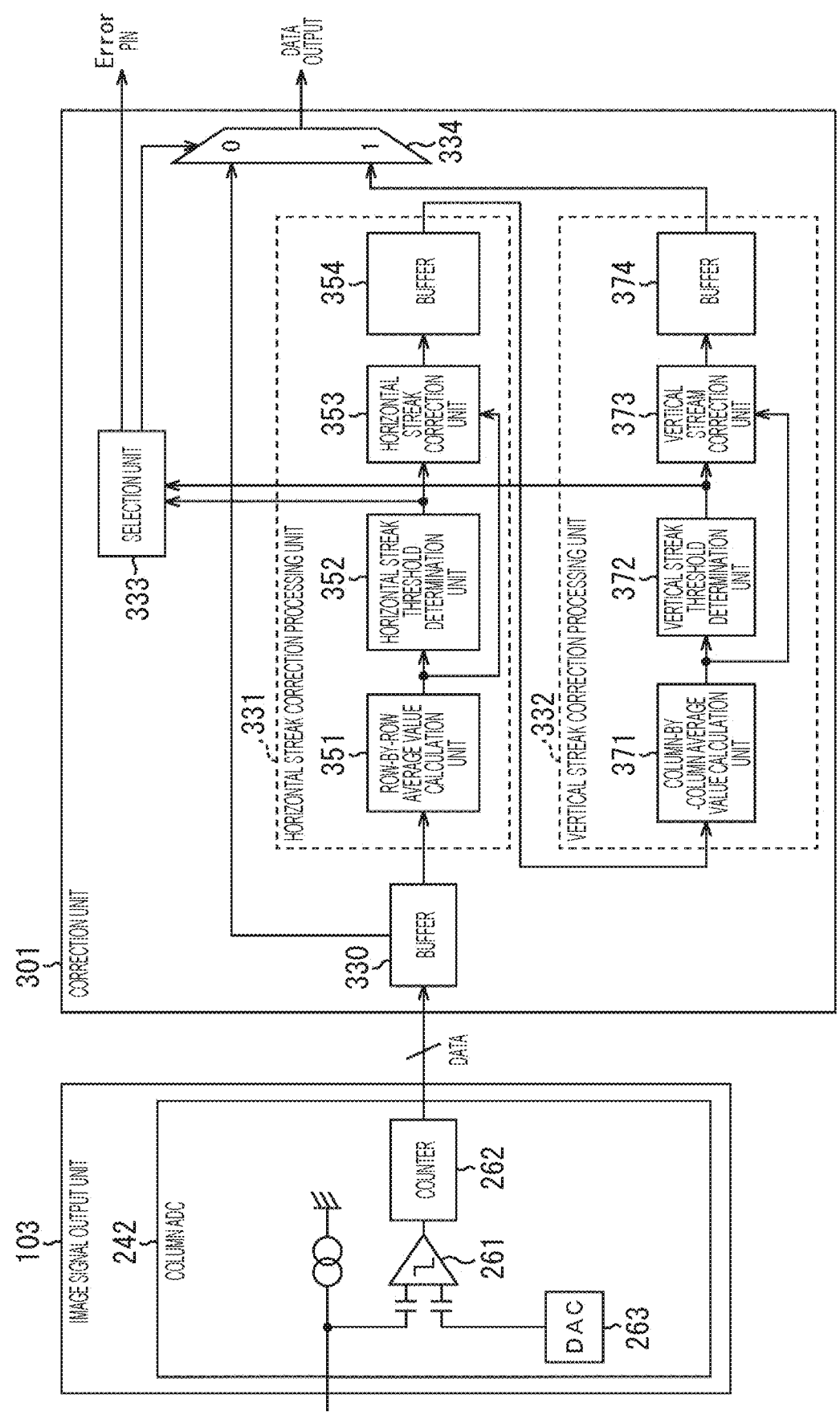
FIG. 27 is a diagram for explaining an example configuration of the correction unit shown in FIG. 26.

Referring now to FIG. 27, an example configuration of the correction unit 301 is described.

The correction unit 301 includes a buffer 330, a horizontal streak correction processing unit 331, a vertical streak correction processing unit 332, a selection unit 333, and a selector 334.

The buffer 330 stores pixel signals supplied from the image signal output unit 103, and stores the pixel signals as one image.

The horizontal streak correction processing unit 331 sets the pixel signals stored in the buffer 330 as current target rows one by one. The horizontal streak correction processing unit 331 reads the pixel signals of the pixels of the three rows including the current target row and the rows before and after the current target row, and calculates the average value of each of the three rows. The horizontal streak correction processing unit 331 then calculates the difference between the average value of the pixel signals of the current target row and the average value of the pixel signals of the other rows, and determines whether or not there is horizontal streak noise by determining whether or not the difference is larger than a predetermined value. The horizontal streak correction processing unit 331 outputs the determination result to the selection unit 333, and, if there is horizontal streak noise, performs correction by replacing each pixel value of the current target row with the average value of the pixel values of the rows before and after the current target row.

The vertical streak correction processing unit 332 sets the pixel signals stored in a buffer 354 of the horizontal streak correction processing unit 331 as current target columns one by one. The vertical streak correction processing unit 332 reads the pixel signals of the pixels of the three columns including the current target column and the columns before and after the current target column, and calculates the average value of each of the three columns. The vertical streak correction processing unit 332 then calculates the difference between the average value of the pixel signals of the current target column and the average value of the pixel signals of the other columns, and determines whether or not there is vertical streak noise by determining whether or not the difference is larger than a predetermined value. The vertical streak correction processing unit 332 outputs the determination result to the selection unit 333, and, if there is vertical streak noise, performs correction by replacing each pixel value of the current target column with the average value of the pixel values of the columns before and after the current target column.

The selection unit 333 supplies the selector 334 with a selection signal for selecting the pixel signal to be selected and output by the selector 334, in accordance with a determination result indicating whether or not there is horizontal streak noise or vertical streak noise. If there is horizontal streak noise or vertical streak noise, the selection unit 333 outputs an error signal from an error pin to the MCU 74.

More specifically, in a case where no correction is required, or where the pixel signals in the buffer 330 are to be output without correction, "0" is output to the selector 334. In a case where correction is required, "1" is output to the selector 334.

In accordance with the selection signal supplied from the selection unit 333, the selector 334 outputs the pixel signals in the buffer 330 without correction, or outputs corrected pixel values from a buffer 374 of the vertical streak correction processing unit 332.

More specifically, the horizontal streak correction processing unit 331 includes a row-by-row average value calculation unit 351, a horizontal streak threshold determination unit 352, a horizontal streak correction unit 353, and the buffer 354.

The row-by-row average value calculation unit 351 sets an unprocessed row in the image stored in the buffer 330 as the current target row, reads the pixel signals of the three rows including the current target row and the rows before and after the current target row, calculates the average value of each of the three rows, and outputs the average values to the horizontal streak threshold determination unit 352.

The horizontal streak threshold determination unit 352 calculates the difference between the average value of the pixel values of the current target row and the average value of the pixel values of the rows before and after the current target row, and compares the difference with a predetermined threshold value. The horizontal streak threshold determination unit 352 then determines whether there is horizontal streak noise, depending on whether or not the difference is larger than the predetermined threshold value, and the values of the current target row greatly differ from those of the other rows. If the horizontal streak threshold determination unit 352 determines that there is horizontal streak noise, the horizontal streak threshold determination unit 352 outputs information indicating that there is horizontal streak noise and a failure has been detected to the selection unit 333, and controls the horizontal streak correction unit 353 so that the horizontal streak correction unit 353 calculates a correction value.

Instructed to correct the pixel values of the current target row, the horizontal streak correction unit 353 performs correction by replacing the pixel value of each of the pixels of the current target row with the average value of the pixel values at each corresponding position in the rows before and after the current target row. The horizontal streak correction unit 353 then outputs and stores the corrected pixel values into the buffer 354.

Figure 28:
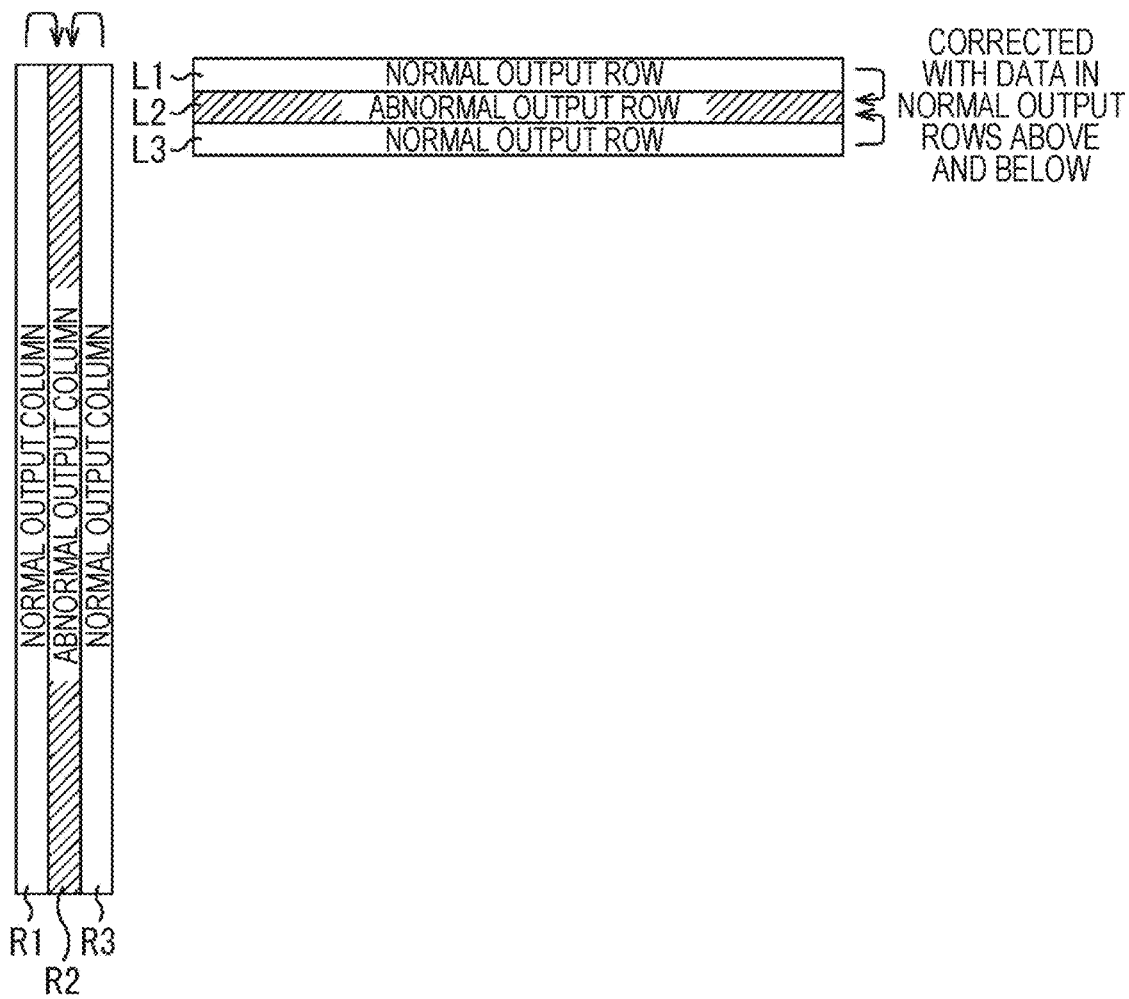
FIG. 28 is a diagram for explaining a method of correcting pixel signals on a row-by-row basis and a column-by-column basis.

More specifically, as shown in a right portion of FIG. 28, in a case where horizontal streak noise is detected, the current target row L2 is an abnormal output row formed with abnormal pixel values, and rows L1 and L3 before and after the current target row L2 are normal output rows formed with normal pixel values, for example, the horizontal streak correction unit 353 replaces the pixel values of the current target row L2 with the average value of the respective pixels of the rows L1 and L3.

Meanwhile, the vertical streak correction processing unit 332 includes a row-by-row average value calculation unit 371, a vertical streak threshold determination unit 372, a vertical streak correction unit 373, and the buffer 374.

The row-by-row average value calculation unit 371 sets an unprocessed column in the image stored in the buffer 354 of the horizontal streak correction processing unit 331 as the current target column, reads the pixel signals of the three columns including the current target column and the columns before and after the current target column, calculates the average value of each of the three columns, and outputs the average values to the vertical streak threshold determination unit 372.

The vertical streak threshold determination unit 372 calculates the difference between the average value of the pixel values of the current target column and the average value of the pixel values of the columns before and after the current target column, and compares the difference with a predetermined threshold value. The vertical streak threshold determination unit 372 then determines whether there is vertical streak noise, depending on whether or not the difference is larger than the predetermined threshold value, and the values of the current target column greatly differ from those of the other columns. If the vertical streak threshold determination unit 372 determines that there is vertical streak noise, the vertical streak threshold determination unit 372 outputs information indicating that there is vertical streak noise and a failure has been detected to the selection unit 333, and controls the vertical streak correction unit 373 so that the vertical streak correction unit 373 calculates a correction value.

Instructed to correct the pixel values of the current target column, the vertical streak correction unit 373 performs correction by replacing the pixel value of each of the pixels of the current target column with the average value of the pixel values the columns before and after the current target column. The vertical streak correction unit 373 then outputs and stores the corrected pixel values into the buffer 374.

More specifically, as shown in a left portion of FIG. 28, in a case where vertical streak noise is detected, the current target column R2 is an abnormal output column formed with abnormal pixel values, and columns R1 and R3 before and after the current target column R2 are normal output columns formed with normal pixel values, for example, the vertical streak correction unit 373 replaces the pixel values of the current target column R2 with the average value of the respective pixels of the columns R1 and R3.

<Correction Process by the Correction Unit in FIG. 27>

Figure 29:
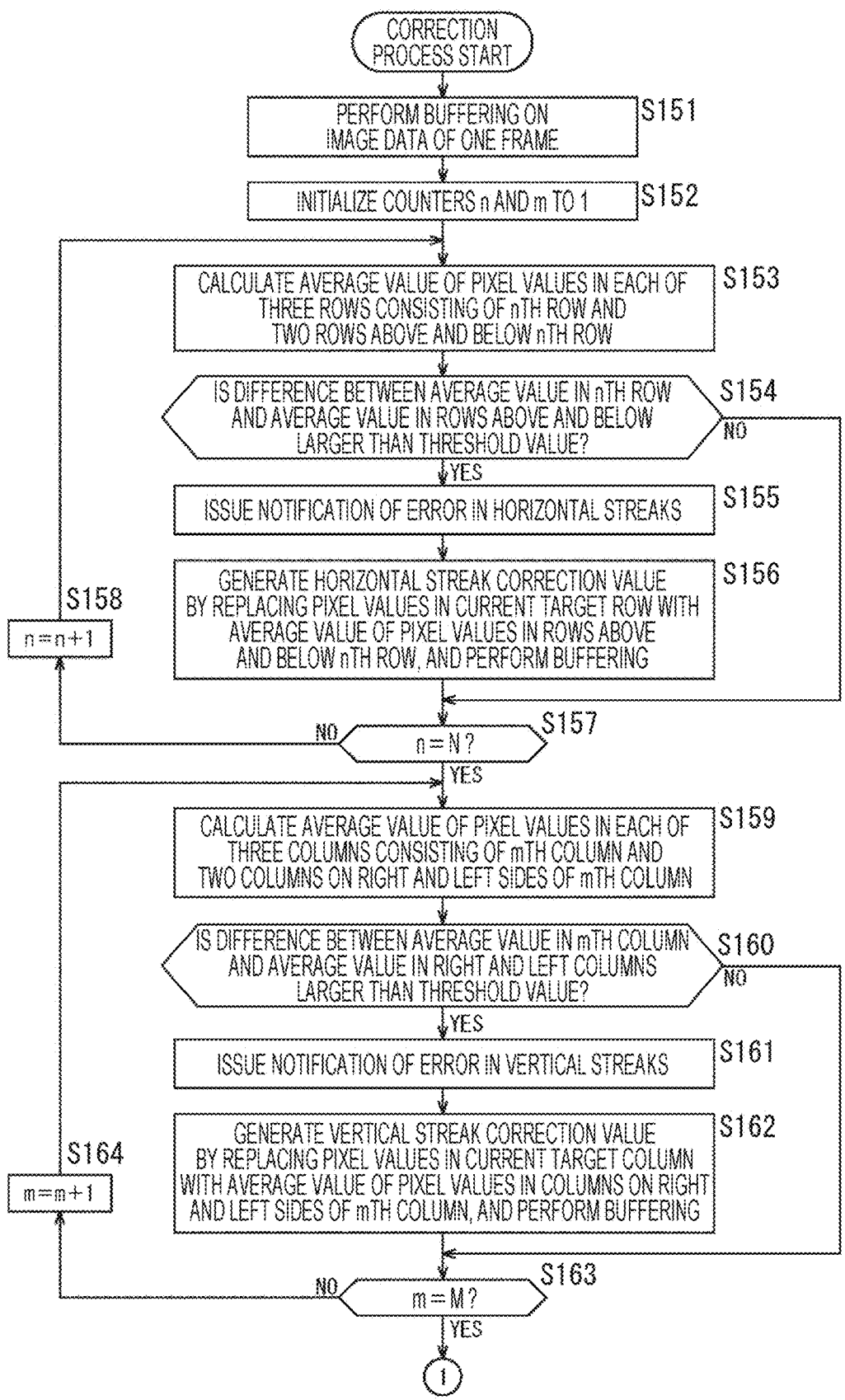
FIG. 29 is a flowchart for explaining a correction process to be performed by the correction unit shown in FIG. 27.
Figure 30:
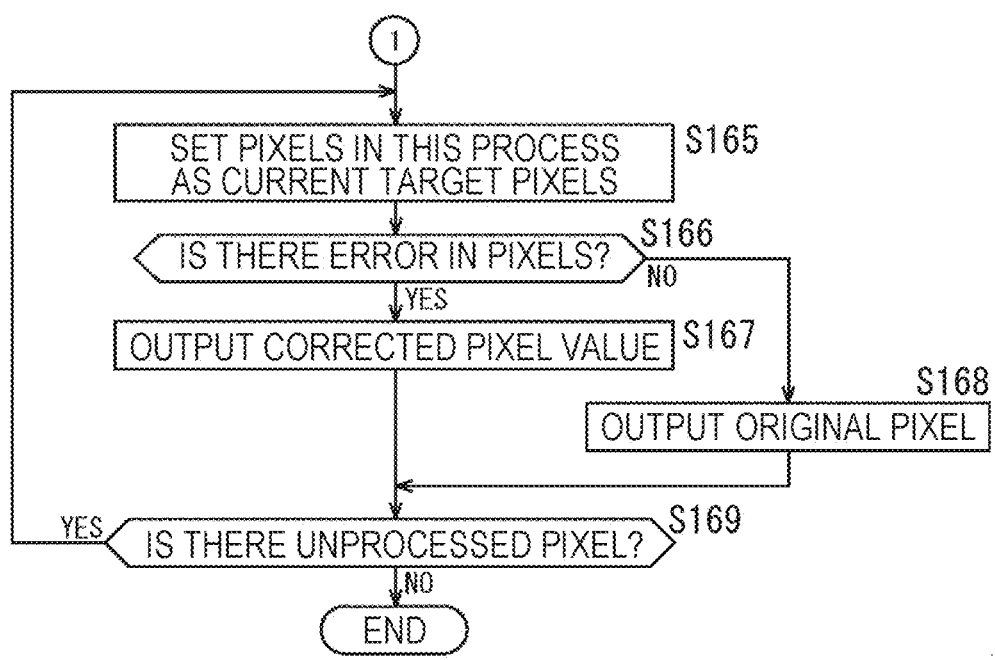
FIG. 30 is a flowchart for explaining a correction process to be performed by the correction unit shown in FIG. 27.

Referring now to the flowchart shown in FIGS. 29 and 30, a correction process to be performed by the correction unit 301 shown in FIG. 27 is described.

In step S151, the buffer 330 stores pixel signals supplied from the image signal output unit 103, and stores the pixel signals as one image.

In step S152, the correction unit 301 initializes counters n and m, which count rows and columns, to 1.

In step S153, the row-by-row average value calculation unit 351 of the horizontal streak correction processing unit 331 reads the pixel signals of a total of three rows, or the pixel signals of the nth row as the current target row and the pixel signals of the rows before and after the current target row in the image stored in the buffer 330. The row-by-row average value calculation unit 351 then calculates the average value of each of the three rows, and outputs the average values to the horizontal streak threshold determination unit 352.

In step S154, the horizontal streak threshold determination unit 352 calculates the difference between the average value of the pixel values of the nth row as the current target row and the average value of the pixel values of the rows before and after the current target row, and compares the difference with a predetermined threshold value. The horizontal streak threshold determination unit 352 then determines whether there is horizontal streak noise, depending on whether or not the difference is larger than the predetermined threshold value, and the pixel values of the current target row greatly differ from the pixel values of the other rows.

If the difference between the average value of the pixel values of the nth row as the current target row and the average value of the pixel values of the rows before and after the current target row is larger than the predetermined threshold value, and horizontal streak noise is detected in step S154, the process moves on to step S155.

In step S155, the horizontal streak threshold determination unit 352 outputs information indicating that there is horizontal streak noise and a failure has been detected to the selection unit 333, and instructs the horizontal streak correction unit 353 to calculate a correction value. Here, the selection unit 333 stores information indicating that the pixel signals of the nth row as the current target row have been corrected.

In step S156, the horizontal streak correction unit 353 performs correction by replacing the pixel values of the nth row as the current target row with the average value of the pixel values of the rows before and after the current target row, and stores the corrected values into the buffer 354. The process then moves on to S158.

If it is determined in step S154 that there is no horizontal streak noise, on the other hand, the process moves on to step S157.

In step S157, a check is made to determine whether or not the counter n is a maximum value N. If the counter n is not the maximum value N, the process moves on to step S158.

In step S158, the correction unit 301 increments the counter n by 1, and the process then returns to step S153.

That is, the process in steps S153 through S158 is repeated to determine whether or not there is horizontal streak noise. If there is horizontal streak noise, a process similar to the above described process is repeated until the process of buffering pixel values corrected with the preceding and succeeding rows is performed on all the row.

Then, if the process has been performed on all the rows, and it is determined in step S157 that the counter n is the maximum value N, the process moves on to step S159.

In step S159, the column-by-column average value calculation unit 371 of the vertical streak correction processing unit 332 reads the pixel signals of a total of three columns, or the pixel signals of the mth column as the current target column and the pixel signals of the columns on the right and left sides of the current target column in the image stored in the buffer 354 of the horizontal streak correction processing unit 331. The column-by-column average value calculation unit 371 then calculates the average value of each of the three columns, and outputs the average values to the vertical streak threshold determination unit 372.

In step S160, the vertical streak threshold determination unit 372 calculates the difference between the average value of the pixel values of the current target column and the average value of the pixel values of the right and left columns, and compares the difference with a predetermined threshold value. The vertical streak threshold determination unit 372 then determines whether there is vertical streak noise, depending on whether or not the difference is larger than the predetermined threshold value, and the values of the current target column greatly differ from those of the other columns.

If the difference between the average value of the pixel values of the current target column and the average value of the pixel values of the right and left columns is larger than the predetermined threshold value, and vertical streak noise is detected in step S160, the process moves on to step S161.

In step S161, the vertical streak threshold determination unit 372 outputs information indicating that there is vertical streak noise and a failure has been detected to the selection unit 333, and instructs the vertical streak correction unit 373 to calculate a correction value. Here, the selection unit 333 stores information indicating that the pixel signals of the mth column as the current target column have been corrected.

In step S162, the vertical streak correction unit 373 performs correction by replacing the pixel values of the mth column as the current target column with the average value of the pixel values of the right and left columns, and stores the corrected values into the buffer 374. The process then moves on to S163.

If it is determined in step S161 that there is no vertical streak noise, on the other hand, the process moves on to step S163.

In step S163, a check is made to determine whether or not the counter m is a maximum value M. If the counter m is not the maximum value M, the process moves on to step S164.

In step S164, the correction unit 301 increments the counter m by 1, and the process then returns to step S159.

That is, the process in steps S159 through S164 is repeated to determine whether or not there is vertical streak noise. If there is vertical streak noise, pixel values corrected with the right and left columns are buffered. If there is no vertical streak noise, a process similar to the above described process is repeated until the process of buffering the pixel values without any correction is performed on all the columns.

Then, if the process has been performed on all the columns, and it is determined in step S163 that the counter m is the maximum value M, the process moves on to step S165.

That is, after a horizontal streak correction process is performed through the process in steps S153 through S158, a vertical streak correction process is performed through the process in steps S159 through S164. In this process, a vertical streak correction process is performed on an image already subjected to a horizontal streak correction process. Accordingly, the buffer 374 in the vertical streak correction processing unit 332 stores the respective pixels of an image subjected to both a vertical streak correction process and a horizontal streak correction process.

In step S165 (FIG. 30), the selection unit 333 sets an unprocessed pixel as the current target pixel (m, n) among the pixels constituting the image to be read.

In step S166, the selection unit 333 determines whether or not there is an error in the nth row or the mth column to which the current target pixel (m, n) belongs, in accordance with correction information. If it is determined in step S166 that there is an error in the current target pixel (m, n), the process moves on to step S167.

In step S167, the selection unit 333 outputs a signal "1" to the selector 334. The signal "1" is a selection signal for reading the pixel value of the corrected current target pixel stored in the buffer 374 of the vertical streak correction processing unit 332. In accordance with the selection signal, the selector 334 reads and outputs the pixel value of the corrected current target pixel stored in the buffer 374 of the vertical streak correction processing unit 332.

If it is determined in step S166 that there is no error in the current target pixel, on the other hand, the process moves on to step S168.

In step S168, the selection unit 333 outputs a signal "0" to the selector 334. The signal "0" is a selection signal for reading the original pixel value of the uncorrected current target pixel stored in the buffer 330. In accordance with the selection signal, the selector 334 reads and outputs the original pixel value of the uncorrected current target pixel stored in the buffer 330.

In step S169, the selection unit 333 determines whether or not there is an unprocessed pixel. If there is an unprocessed pixel, the process returns to step S166. That is, the process in steps S165 through S169 is repeated until either a corrected pixel value or an original uncorrected pixel value is selectively read from all the pixels, depending on presence/absence of an error.

Then, if it is determined in step S169 that there are no more unprocessed pixels, the process comes to an end.

As the above process is performed, correction can be performed column by column or row by row, even in a case where a failure has occurred in the ADCs 242 in a column. Thus, the driving support process can be continued.

Note that, even when there is a failure in the column ADCs 242, an error signal is output from the Error pin. Thus, the MCU 74 can recognize which column ADC 242 has a failure, and issue a failure occurrence notification. However, even if there is a failure in a column ADC 242, and there is a vertical streak error or a horizontal streak error, the image signal can be corrected, and thus, the driving support process can be continued. That is, even if there is a vertical streak error or a horizontal streak error, a process to be performed when a failure has been detected is not performed in step S13 in the flowchart in FIG. 3, but the driving support process can be continued by virtue of the process in steps S14 through S17.

Also, in the above described example, the correction unit 301 is provided in the imaging device 72. However, the correction unit 301 may be provided in the front camera ECU 73 so that a process similar to the above can be performed.

Further, in the above described example configuration of the correction unit 301 shown in FIG. 27, a vertical streak correction process is performed by the vertical streak correction processing unit 332 after a horizontal streak correction process is performed by the horizontal streak correction processing unit 331. However, the process sequence may be reversed so that a horizontal streak correction process is performed by the horizontal streak correction processing unit 331 after a vertical streak correction process is performed by the vertical streak correction processing unit 332.

Also, a horizontal streak correction process by the horizontal streak correction processing unit 331 and a vertical streak correction process by the vertical streak correction processing unit 332 may be performed in parallel, and the selector 334 may selectively output three kinds of pixel values, depending on the type of an error that has occurred. The three kinds of pixel values are an original pixel value, a pixel value subjected to a horizontal streak correction process, and a pixel value subjected to a vertical streak correction process. In a case where these three kinds of pixel values are selected, of a pixel subjected to both a vertical streak correction process and a horizontal streak correction process, the pixel value subjected to the horizontal streak correction process may be selectively output, for example.

4. Fourth Embodiment

In the above described example, a structure in which the imaging device 72 and the front camera ECU 73 are designed so that the upper chip 92 as the first chip and the lower chip 91 as the second chip stacked under the upper chip 92 are electrically connected by the TCVs 93-1, 93-2, 93-11, and 93-12. However, Cu wiring lines may be provided at positions facing each other, and the Cu wiring lines may be directly joined to each other (Cu—Cu junction) so that the upper chip 92 and the lower chip 91 are electrically connected.

Figure 31:
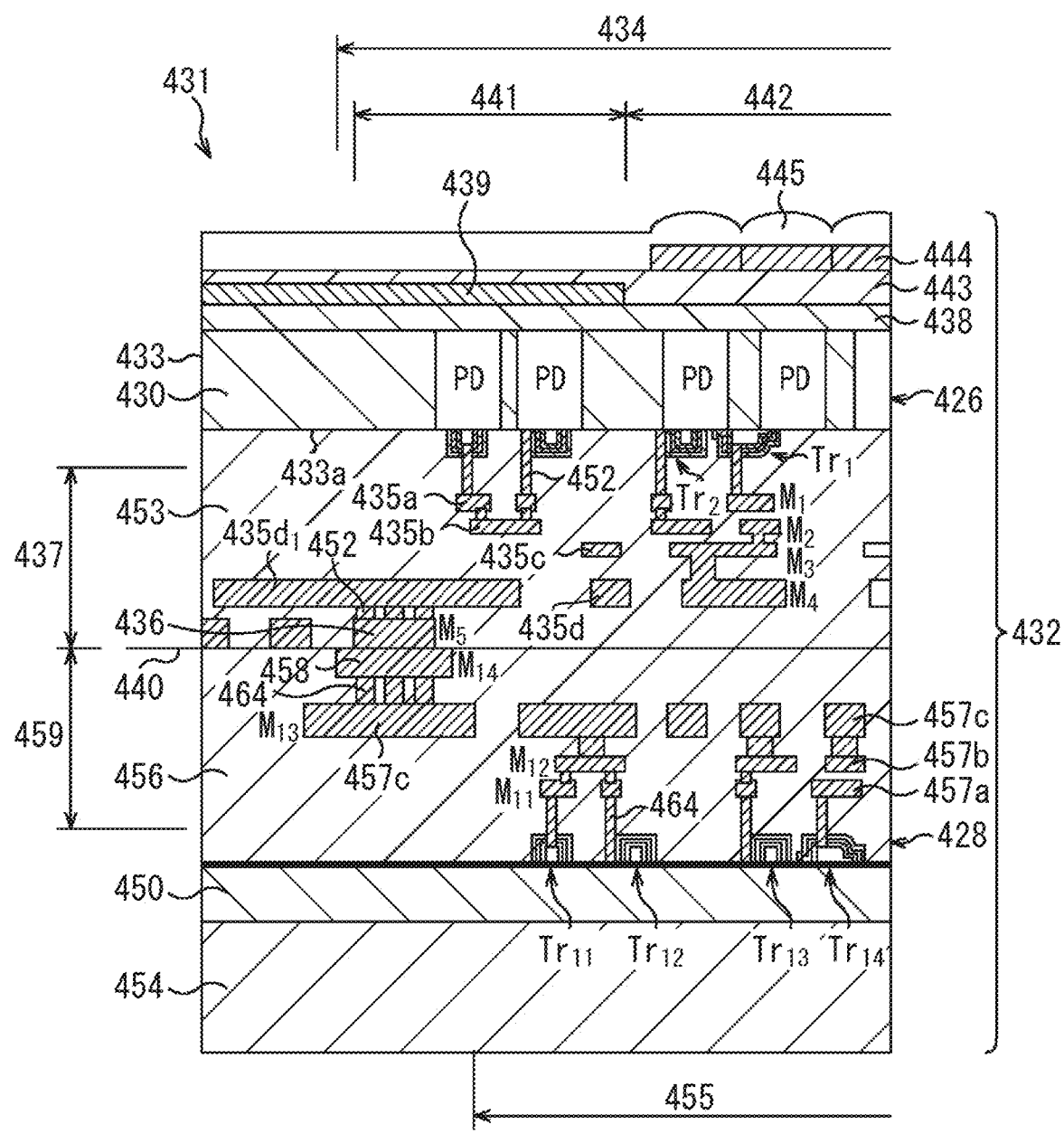
FIG. 31 is a diagram for explaining an example configuration for forming a fourth embodiment.

FIG. 31 shows an example configuration of an imaging device 431 that includes a multilayer semiconductor chip 432 in which a first semiconductor chip unit 426 having a pixel array 434 formed therein and a second semiconductor chip unit 428 having a logic circuit 455 formed therein are bonded to each other. Note that the imaging device 431 in FIG. 31 corresponds to the imaging device 72 and the front camera ECU 73 described above, the first semiconductor chip unit 426 corresponds to the upper chip 92, and the second semiconductor chip unit 428 corresponds to the lower chip 91.

In the first semiconductor chip unit 426, a semiconductor well region 430 is formed in a first semiconductor substrate 433 formed with a thinned silicon film. In this semiconductor well region 430, the pixel array 434 is formed. In the pixel array 434, a plurality of pixels each including a photodiode PD serving as a photoelectric conversion portion and a plurality pixel transistors Tr1 and Tr2 are two-dimensionally arranged in columns. The photodiodes PD are formed in an effective pixel array 442 and an optical black region 441 that constitute the pixel array 434. A plurality of MOS transistors that constitute a control circuit (not shown) that controls the pixel array 434 are also formed in the semiconductor substrate 433. On the side of a front surface 433a of the semiconductor substrate 433, a multilevel wiring layer 437 is formed. In the multilevel wiring layer 437, wiring lines 435 (435a through 435d) and a wiring line 436 that are formed with a plurality of (five in this example) metal layers M1 through M5 are disposed via an interlayer insulating film 453. Copper (Cu) wiring lines formed by a dual damascene technique are used as the wiring lines 435 and 436. On the back surface side of the semiconductor substrate 433, a light blocking film 439 including an upper portion of the optical black region 441 is formed via an insulating film 438, and color filters 444 and a lens array 445 are formed on the effective pixel array 442 via a planarizing film 443. The lens array 445 can also be formed on the optical black region 441.

In the multilevel wiring layer 437 of the first semiconductor chip unit 426, the corresponding pixel transistors and the wiring lines 435, and the adjacent upper and lower wiring lines 435 are connected via conductive vias 452. Further, the connection wiring line 436 of the fifth metal layer M5 is formed to face the surface 440 joined to the second semiconductor chip unit 428. The connection wiring line 436 is connected to a predetermined wiring line 435d1 of the fourth metal layer M4 via conductive vias 452.

In the second semiconductor chip unit 428, a semiconductor well region 450 is formed in a second semiconductor substrate 454 including silicon, and the logic circuit 455 serving as a peripheral circuit is formed in the semiconductor well region 450. The logic circuit 455 is formed with a plurality of MOS transistors Tr11 through Tr14 including CMOS transistors. On the side of the front surface of the second semiconductor substrate 454 shown in FIG. 31, a multilevel wiring layer 459 is formed. In the multilevel wiring layer 459, wiring lines 457 [457a through 457c] and a wiring line 458 that are formed with a plurality of (four in this example) metal layers M11 through M14 are disposed via an interlayer insulating film 456. Copper (Cu) wiring lines formed by a dual damascene technique are used as the wiring lines 457 and 458.

In the multilevel wiring layer 459 of the second semiconductor chip unit 428, the MOS transistors Tr11 through Tr14 and the wiring lines 457, and the adjacent upper and lower wiring lines 457 are connected via conductive vias 464. Further, the connection wiring line 458 of the fourth metal layer M14 is formed to face the surface 440 joined to the first semiconductor chip unit 426. The connection wiring line 458 is connected to a predetermined wiring line 457c of the third metal layer M13 via conductive vias 464.

The connection wiring lines 436 and 458 facing the joint surface 440 are directly joined to each other so that the multilevel wiring layers 437 and 459 face each other. In this manner, the first semiconductor chip unit 426 and the second semiconductor chip unit 428 are electrically connected. The direct boning between the connection wiring lines 436 and 458 formed with Cu wiring lines is achieved through thermal diffusion bonding. As another method, it is also possible to form a thin insulating film (not shown) on the surfaces of the multilevel wiring layers 437 and 459, and the multilevel wiring layers 437 and 459 may be joined by plasma bonding or the like. The direct bonding between the connection wiring lines 436 and 458 formed with Cu wiring lines forms a Cu—Cu junction.

5. Fifth Embodiment

<5-1. First Example Configuration in which Three Chips are Stacked>

In the above described example, the imaging device 72 and the front camera ECU 73 are formed by stacking two chips formed with the lower chip 91 and the upper chip 92. However, the imaging device 72 and the front camera ECU 73 may be formed by stacking a larger number of chips, such as stacking three chips, for example.

Figure 32:
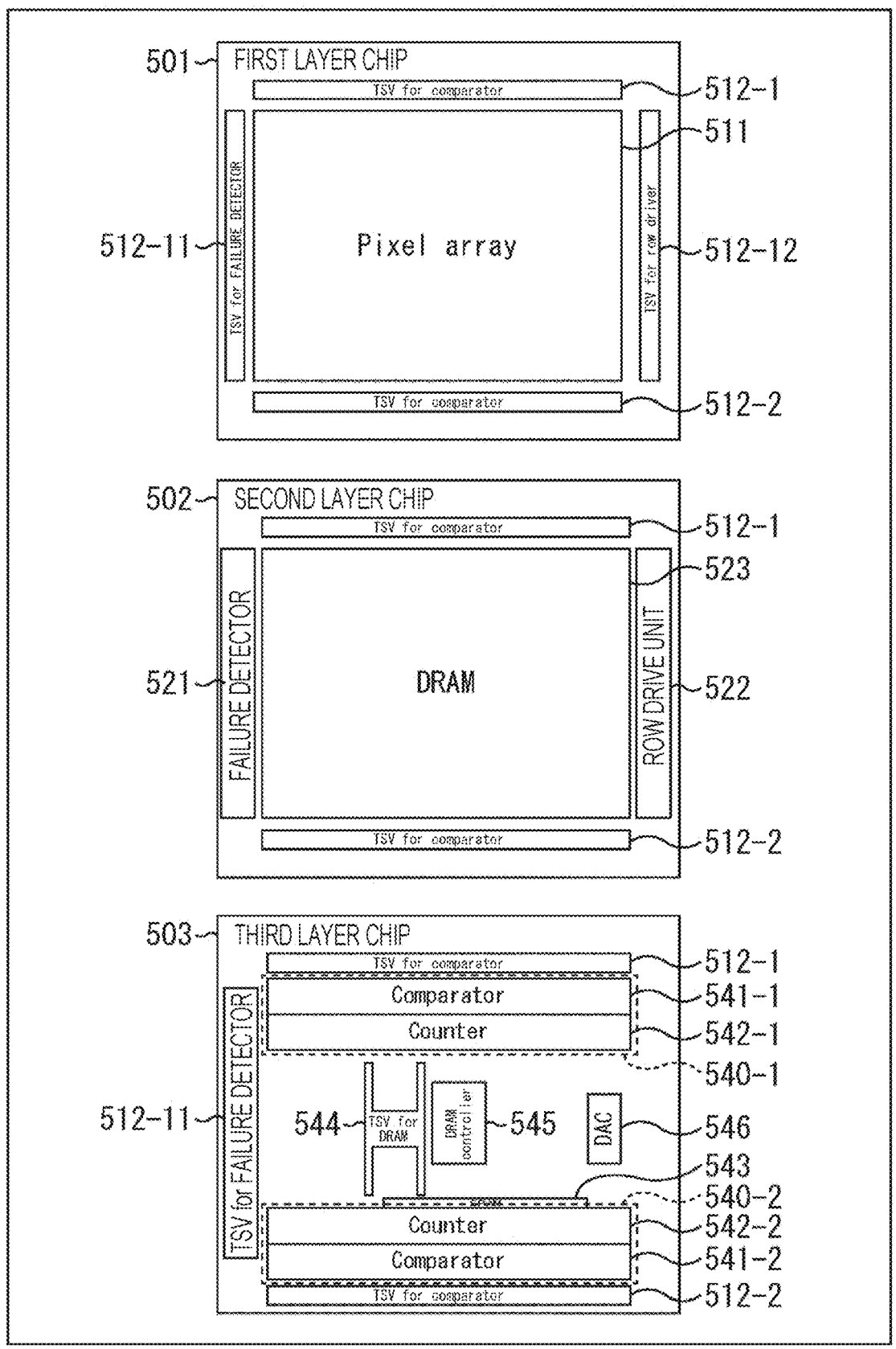
FIG. 32 is a diagram for explaining a first example configuration in which three chips are stacked to form a fifth embodiment.

FIG. 32 shows an example configuration of the imaging device 72 and the front camera ECU 73 that are formed by stacking three chips.

FIG. 32 shows a floor plan in which the imaging device 72 and the front camera ECU 73 are formed by stacking a first layer chip 501, a second layer chip 502, and a third layer chip 503 in this order from the top. The respective floor plans of the first layer chip 501, the second layer chip 502, and the third layer chip 503 are shown in this order from the top.

A pixel array (Pixel array) 511 is disposed at the center of the first layer chip 501, and a row control signal through silicon via (TSV) (TSV for row driver) 512-12 is disposed along a first side of the pixel array 511 (the right side of the pixel array 511 in this embodiment).

Meanwhile, a row drive unit (row decoder) 522 of the second layer chip 502 transmits a row control signal for driving pixels to the respective pixels in each pixel row in the first layer chip 501 via the row control signal TSV 512-12. Further, row control signal lines are connected to the respective pixels in each pixel row, and the row control signal lines are connected to the row drive unit 522 of the second layer chip 502 via the row control signal TSV 512-12.

Pixel signal TSVs 512-1 and 512-2 for connecting photoelectrically-converted pixel signals from the respective pixels to respective comparators 541-1 and 541-2 in a plurality of analog-to-digital (AD) converters 540-1 and 540-2 disposed in the third layer chip 503 are disposed along second and fourth sides of the pixel array 511 (the upper and lower sides of the pixel array 511 in the drawing in this embodiment).

Further, the AD converters 540-1 and 540-2 include the comparators 541-1 and 541-2, and counters 542-1 and 542-2, respectively, and convert pixel signals supplied from the pixel array 511 into digital signals.

Note that the AD converters 540-1 and 540-2 including the comparators 541-1 and 541-2 and the counters 542-1 and 542-2 may be disposed in the second layer chip 502.

The pixel signal TSVs (TSVs for comparator) 512-1 and 512-2 are connected to the vertical signal lines of the respective pixels. Further, in a case where a failure detector 521 for the row control signal lines is disposed in the second layer chip 502, a TSV (TSV for failure detector) 512-11 for the failure detector 521 is disposed along a third side of the pixel array 511 (the left side of the pixel array 511 in this embodiment). Note that the TSV (TSV for failure detector) 512-11 for the failure detector 521 is preferably disposed on the opposite side of the pixel array 511 from the row control signal line TSV (TSV for row driver) 512-12.

In the second layer chip 502, a plurality of DRAMs 523 are disposed at the center, and the row drive unit 522 is disposed along the first side of the DRAMs 523 (on the right side of the DRAMs 523 in this embodiment). Further, in a case where the comparators 541-1 and 541-2 are disposed in the third layer chip 503, the pixel signal TSVs 512-1 and 512-2 for transferring pixel signals are disposed along the second and fourth sides of the DRAMs 523 (the upper and lower sides of the pixel array 511 in the drawing in this embodiment).

Note that, in a case where the comparators 541-1 and 541-2 of the AD converters 540-1 and 540-2 are formed in the second layer chip 502, and the counters 542-1 and 542-2 are formed in the third layer chip 503, the comparators 541-1 and 541-2 are disposed on the upper and lower sides of the DRAMs 523 in the second layer chip 502, and the pixel signal TSVs 512-1 and 512-2 for transferring signals from the comparators 541-1 and 541-2 to the counters 542-1 and 542-2 in the third layer chip 503 are further disposed on the lower side of the plurality of comparators 541-1 and 541-2. Further, the failure detector 521 is disposed on the third side of the DRAMs 523 (the left side of the DRAMs 523 in the drawing in this embodiment). The row drive unit 522 is preferably disposed on the opposite side of the DRAMs 523 from the failure detector 521.

In the third layer chip 503, a DRAM control circuit (DRAM Controller) 545 for controlling the DRAMs 523 is disposed immediately below the DRAMs 523, and a DRAM control signal TSV (TSV for DRAM) 544 for transferring control signals from the DRAM control circuit 545 to the DRAMs 523 is disposed. Further, in a case where the comparators 541-1 and 541-2 of the AD converters 540-1 and 540-2 are formed in the second layer chip 502, and the counters 542-1 and 542-2 are formed in the third layer chip 503, signals from the comparators 541-1 and 541-2 are transferred to the counters 542-1 and 542-2 via the TSVs 512-1 and 512-2.

Also, in a case where there are a plurality of AD converters 540-1 and 540-2 in the third layer chip 503, the pixel signal TSVs 512-1 and 512-2 of the third layer chip 503 connected to the pixel signal TSVs 512-1 and 512-2 of the second layer chip 502 are disposed on the upper side and the lower side of the AD converters 540-1 and 540-2, respectively. Further, an SRAM memory 543 is disposed on the upper side of the counter 542-2 in the drawing. Note that, although FIG. 32 shows a configuration in which a plurality of AD converters 540-1 and 540-2 are provided in an upper portion and a lower portion. However, AD converters may be gathered to form one AD converter 540 in an upper portion or a lower portion in FIG. 32, and the AD converter 540 is designed to read all pixel signals. Further, a failure detector TSV for transferring detection signals from the failure detector 521 to a signal processing circuit (not shown) is disposed immediately below the failure detector 521.

Note that each of the TSVs 512 for electrically connecting the first layer chip 501, the second layer chip 502, and the third layer chip 503 described above may be a Cu—Cu junction. In addition, here, the pixel array 511 corresponds to the pixel array 101, and the TSVs 512 correspond to the TCVs 93.

<5-2. Second Example Configuration in which Three Chips are Stacked>

In the above described example, the failure detector 521 is provided in the second layer chip 502. However, the failure detector 521 may be provided in the third layer chip 503.

Figure 33:
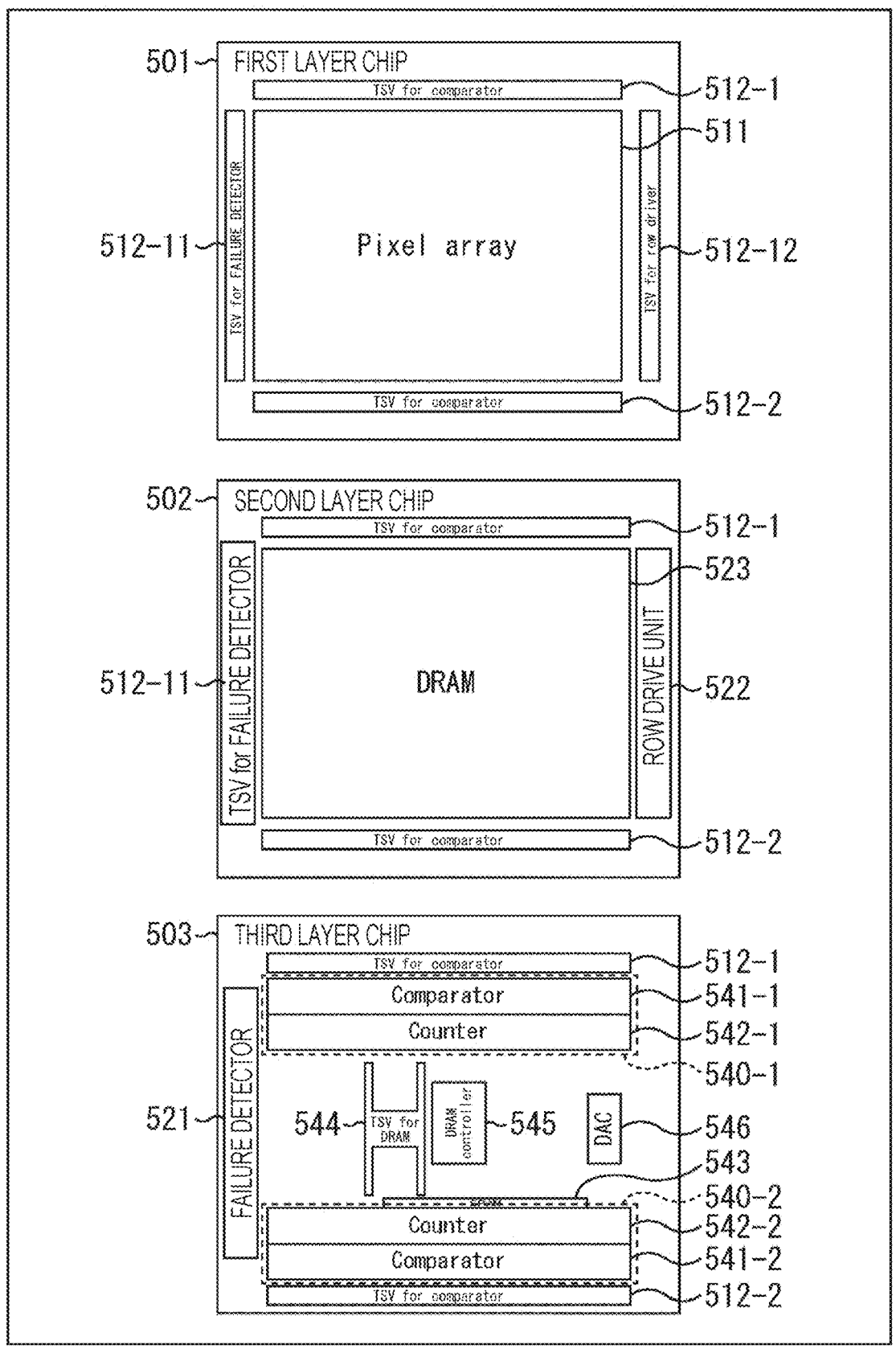
FIG. 33 is a diagram for explaining a second example configuration in which three chips are stacked to form the fifth embodiment.

FIG. 33 shows an example configuration in which the failure detector 521 is provided in the third layer chip 503. Note that, in FIG. 33, components having the same functions as those shown in FIG. 32 are denoted by the same reference numerals as those in FIG. 32, and explanation of them will not be repeated as appropriate.

Specifically, in FIG. 33, the failure detector 521 is disposed at the left end portion of the third layer chip 503 in the drawing. Because of this, the failure detector TSV 512-11 is provided on the left side of the DRAMs 523 of the second layer chip 503.

<5-3. Third Example Configuration in which Three Chips are Stacked>

In the above described example, the row drive unit 522 is provided in the second layer chip 502. However, the row drive unit 522 may be provided in the third layer chip 503.

Figure 34:
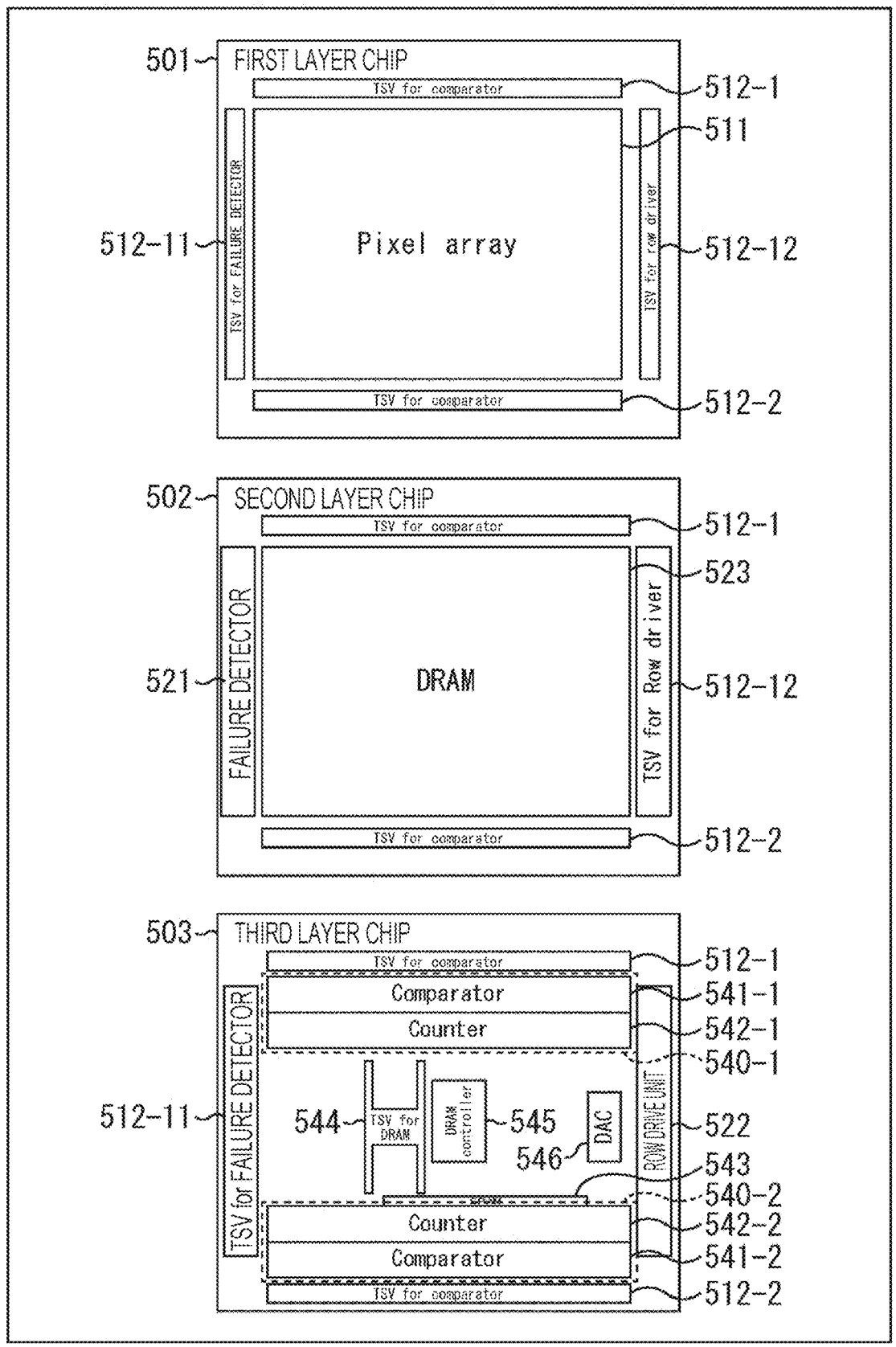
FIG. 34 is a diagram for explaining a third example configuration in which three chips are stacked to form the fifth embodiment.

The floor plan in FIG. 34 is an example configuration in which the row drive unit 522 of the second layer chip 502 in FIG. 32 is provided in the third layer chip 503. In this case, the row drive unit 522 in the third layer chip 503 needs to transmit control signals to the respective pixels in the pixel array 511. Therefore, instead of the row drive unit 522, the row drive unit TSV 512-12 is provided on the right side of the DRAMs 523 in the second layer chip 502.

<5-4. Fourth Example Configuration in which Three Chips are Stacked>

In the above described example, the row drive unit 522 is provided in the third layer chip 503. However, the failure detector 521 may also be provided in the third layer chip 503.

Figure 35:
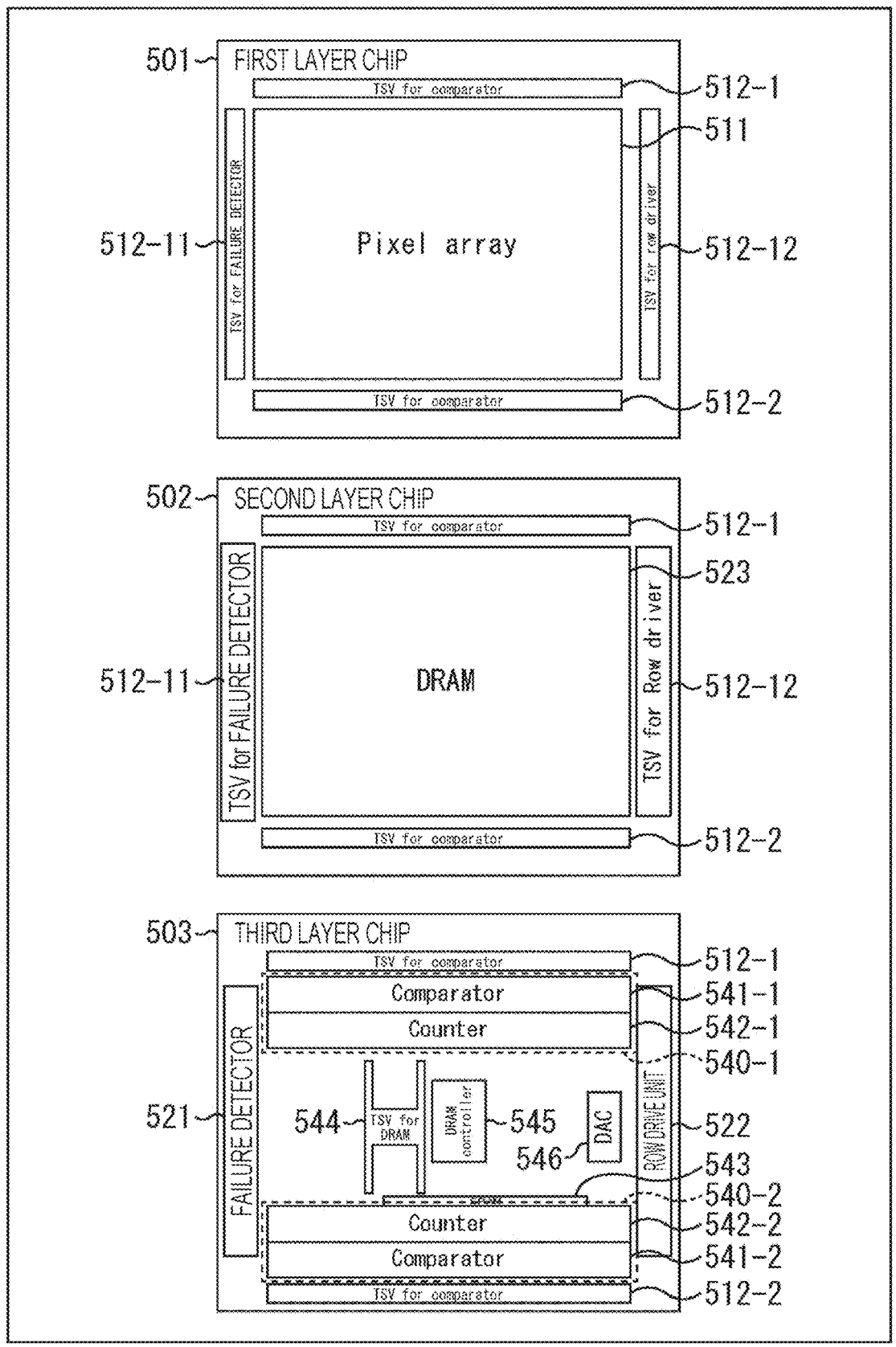
FIG. 35 is a diagram for explaining a fourth example configuration in which three chips are stacked to form the fifth embodiment.

The floor plan in FIG. 35 is an example configuration in which both the row drive unit 522 and the failure detector 521 of the second layer chip 502 in FIG. 32 are provided in the third layer chip 503. In this case, the failure detector 521 and the row drive unit 522 in the third layer chip 503 need to transmit and receive control signals to and from the respective pixels in the pixel array 511. Therefore, instead of the failure detector 521 and the row drive unit 522, the failure detector TSV 512-11 and the row drive unit TSV 512-12 are provided on the left side and the right side of the DRAMs 523, respectively, in the second layer chip 502.

<5-5. Fifth Example Configuration in which Three Chips are Stacked>

In the above described example, the DRAMs 523 are provided in the second layer chip 502. However, the configuration in the floor plan of the second layer chip 502 and the configuration in the floor plan of the third layer chip 503 shown in FIG. 35 may be replaced with each other, for example.

Figure 36:
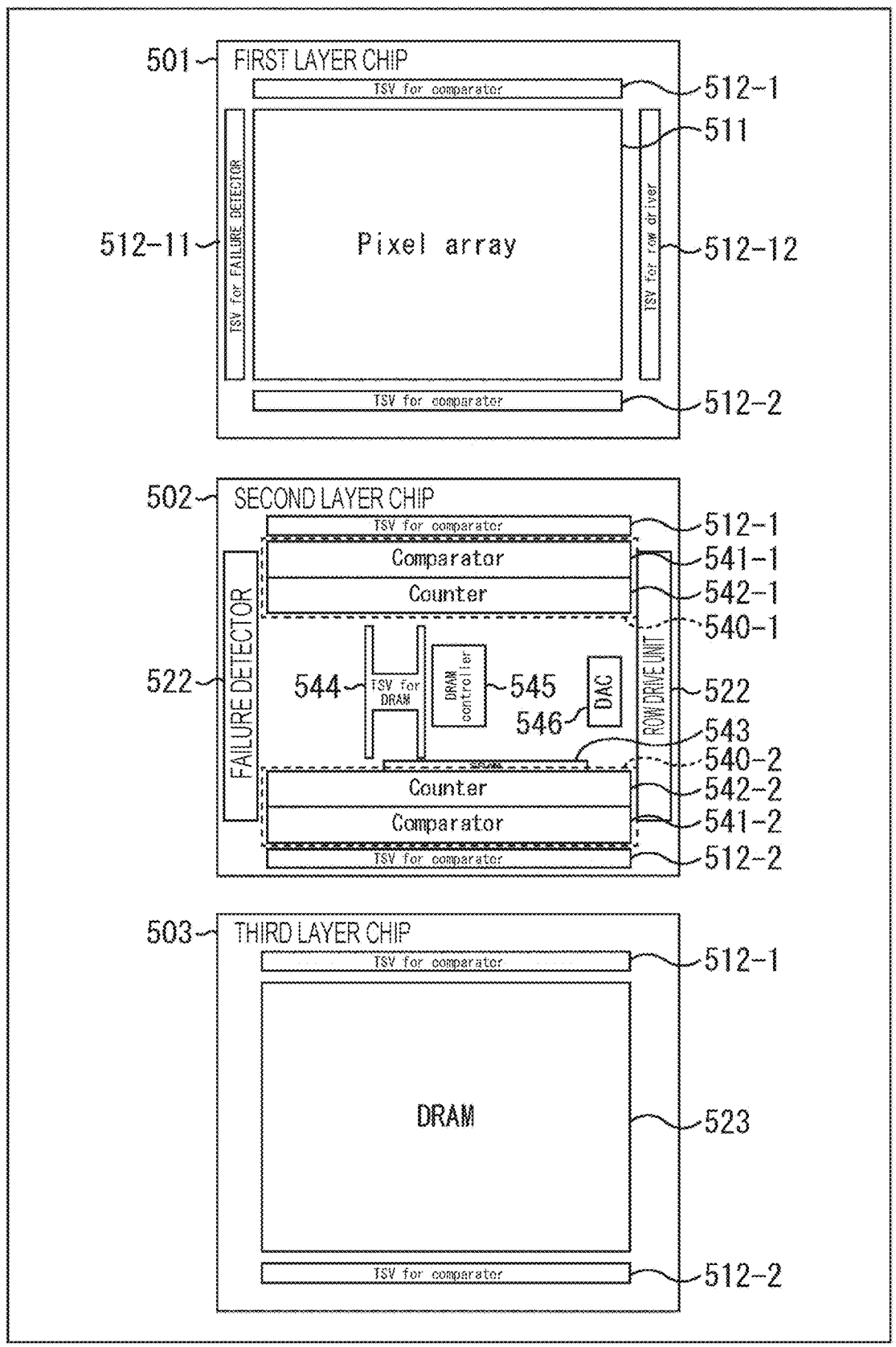
FIG. 36 is a diagram for explaining a fifth example configuration in which three chips are stacked to form the fifth embodiment.

FIG. 36 shows an example configuration in which the DRAMs 523 in the second layer chip 502 shown in FIG. 35 are provided in the third layer chip 503, and the AD converters 540-1 and 540-2, the TSV 544, the DRAM control unit 545, and the DAC 546 in the third layer chip 503 are provided in the second layer chip 502.

However, as the failure detector 521 and the row drive unit 522 are provided in the second layer chip 502, the third layer chip 503 does not need to include the failure detector TSV 512-11 and the row drive unit TSV 512-12.

6. Pixel Signal TSVs

<6-1. Pixel Signal TSVs in a Case where Comparators and Counters are Disposed in the Same Chip>

Next, an example configuration of pixel signal TSVs is described.

In the above examples in which three chips are stacked as described with reference to FIGS. 32 through 35, the comparators 541-1 and 541-2 and the counters 542-1 and 542-2 that constitute the AD converters 540-1 and 540-2 are formed in the same third chip 503.

Therefore, pixel signals of the respective pixels in the pixel array 511 are transferred from the first chip 501 directly to the third chip 503, without passing through the second chip 502.

Figure 37:
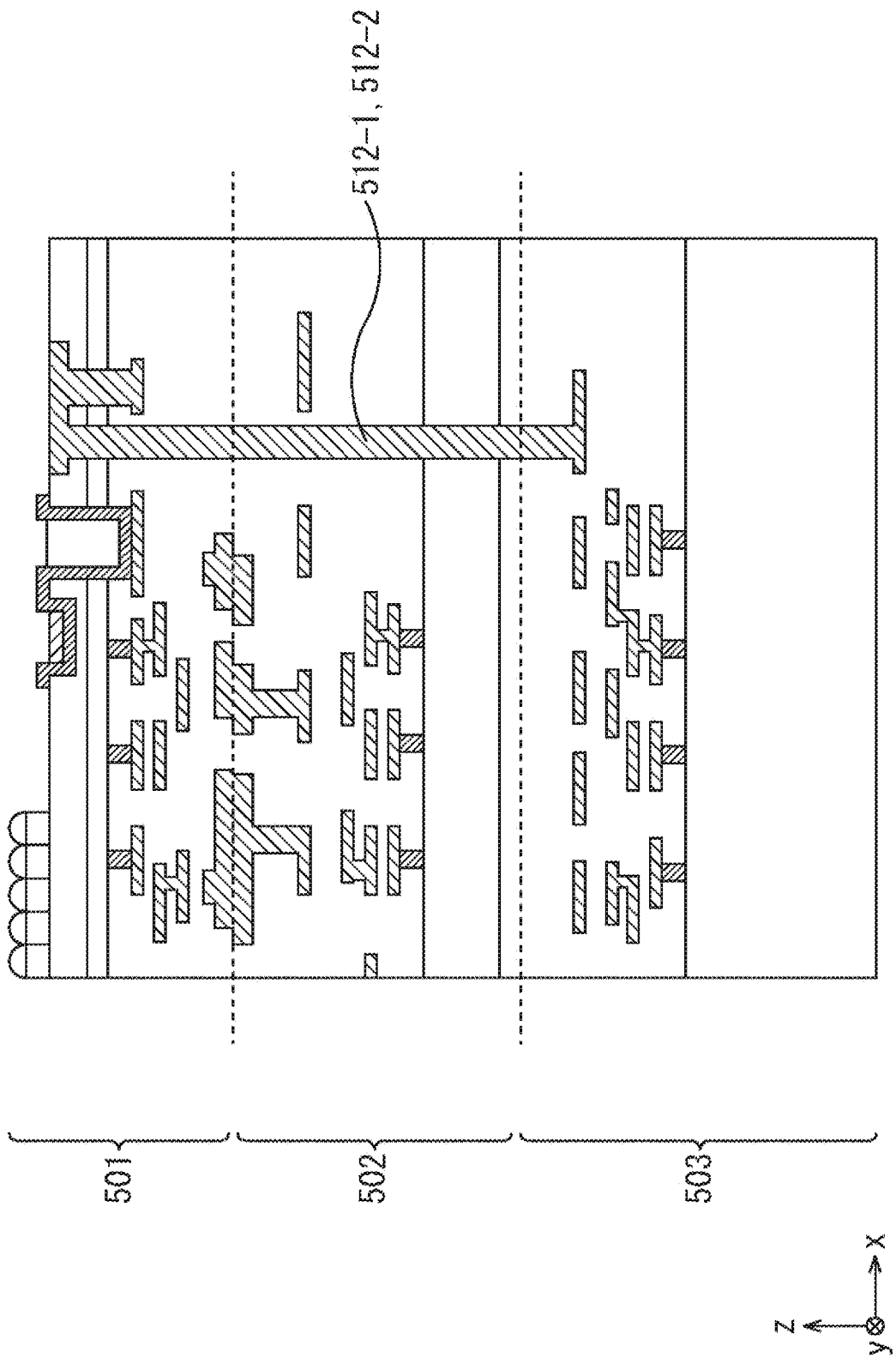
FIG. 37 is a diagram for explaining an example configuration of pixel signal TSVs in a case where comparators and counters are disposed in the same chip.

In view of this, the pixel signal TSVs 512-1 and 512-2 are designed as shown in FIG. 37, for example.

In FIG. 37, the pixel signal TSVs 512-1 and 512-2 are formed with contacts by which the first layer chip 501 and the third layer chip 503 are electrically connected. The contacts forming the pixel signal TSVs 512-1 and 512-2 are connected to contacts of the first layer chip 501 and to aluminum pads of the third layer chip 503.

The pixel signals of the pixels constituting the pixel array 511 in the first layer chip 501 are transferred to the AD converters 540-1 and 540-2 of the third layer chip 503 via the pixel signal TSVs 512-1 and 512-2 designed as shown in FIG. 37.

Note that, although the pixel signal TSVs 512-1 and 512-2 have been described above, the failure detector TSV 512-11 and the row drive unit TSV 512-12 may also be designed similarly to the pixel signal TSVs 512-1 and 512-2 shown in FIG. 37 in a case where the failure detector 521 and the row drive unit 522 are provided in the third layer chip 503.

<6-2. Pixel Signal TSVs in a Case where Comparators and Counters are Disposed in Different Chips>

In the above described example, the comparators 541-1 and 541-2 and the counters 542-1 and 542-2, which constitute the AD converters 540-1 and 540-2, are formed in the same third layer chip 503. However, the comparators 541-1 and 541-2, and the counters 542-1 and 542-2 may be formed in different chips.

Specifically, in a case where the comparators 541-1 and 541-2 are provided in the second layer chip 502, the counters 542-1 and 542-2 are provided in the third layer chip 503, and the AD converters 540-1 and 54-2 are formed, for example, the pixel signals from the respective pixels in the pixel array 511 formed in the first layer chip 501 are output to the comparators 541-1 and 541-2 of the second layer chip 502, and comparison results from the comparators 541-1 and 541-2 are transferred to the counters 542-1 and 542-2 of the third layer chip 503.

Figure 38:
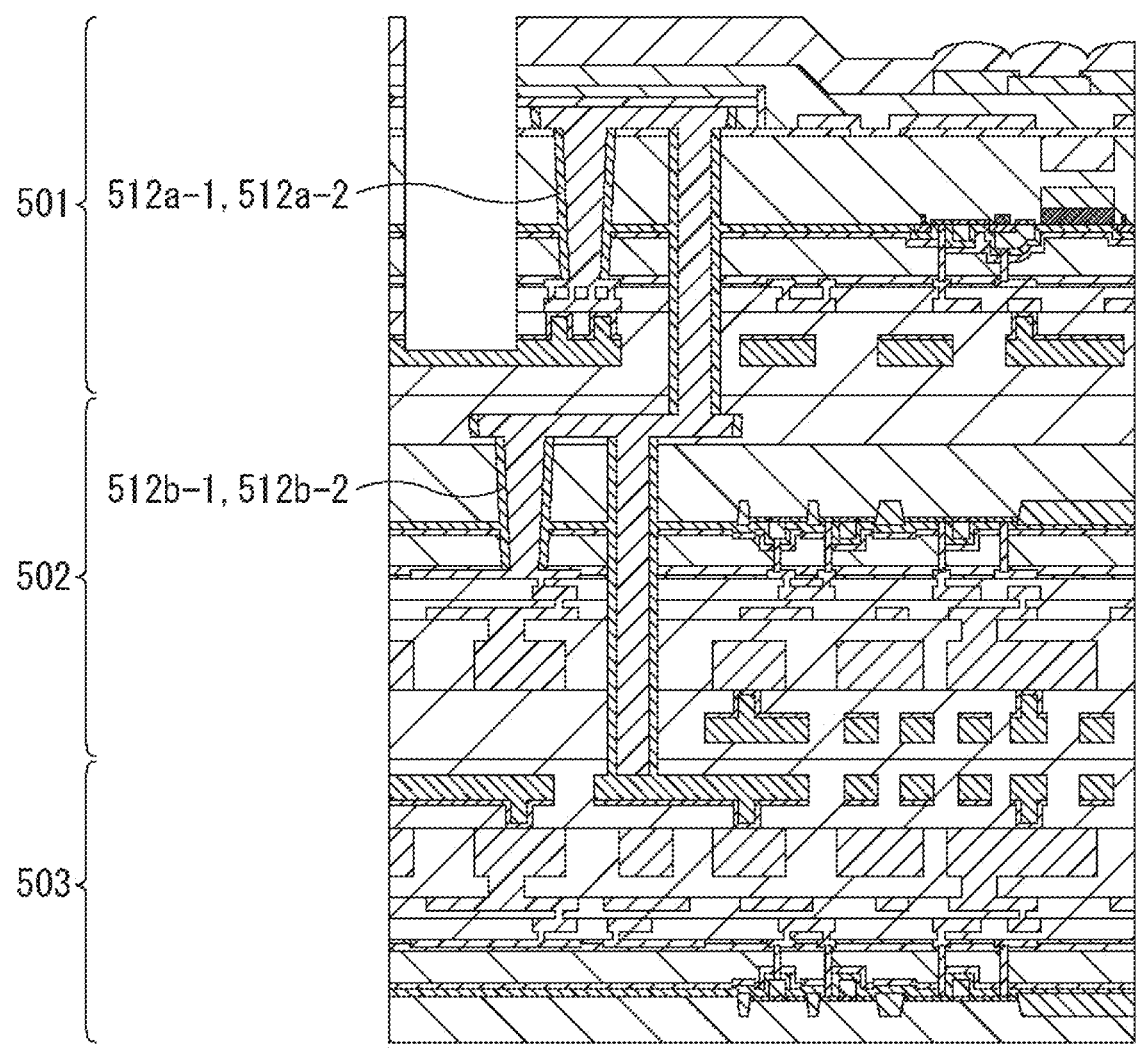
FIG. 38 is a diagram for explaining an example configuration of pixel signal TSVs in a case where comparators and counters are disposed in different chips.

Therefore, as shown in FIG. 38, the pixel signal TSVs 512-1 and 512-2 include pixel signal TSVs 512a-1 and 512a-2 formed with contacts that electrically connect the first layer chip 501 and the second layer chip 502, and pixel signal TSVs 512b-1 and 512b-2 formed with contacts that electrically connect the second layer chip 502 and the third layer chip 503, for example.

In such a configuration, the pixel signals from the respective pixels in the pixel array 511 formed in the first layer chip 501 are output to the comparators 541-1 and 541-2 of the second layer chip 502 via the pixel signal TSVs 512a-1 and 512a-2. Meanwhile, comparison results from the comparators 541-1 and 541-2 are transferred to the counters 542-1 and 542-2 of the third layer chip 503 via the pixel signal TSVs 512b-1 and 512b-2.

Note that, although the pixel signal TSVs 512-1 and 512-2 have been described above, the failure detector TSV 512-11 may also be designed similarly to the pixel signal TSVs 512-1 and 512-2 shown in FIG. 38 in a case where the failure detector 521 is provided in the second layer chip 503.

7. Types of ADCs

7-1. Column ADC

Figure 39:
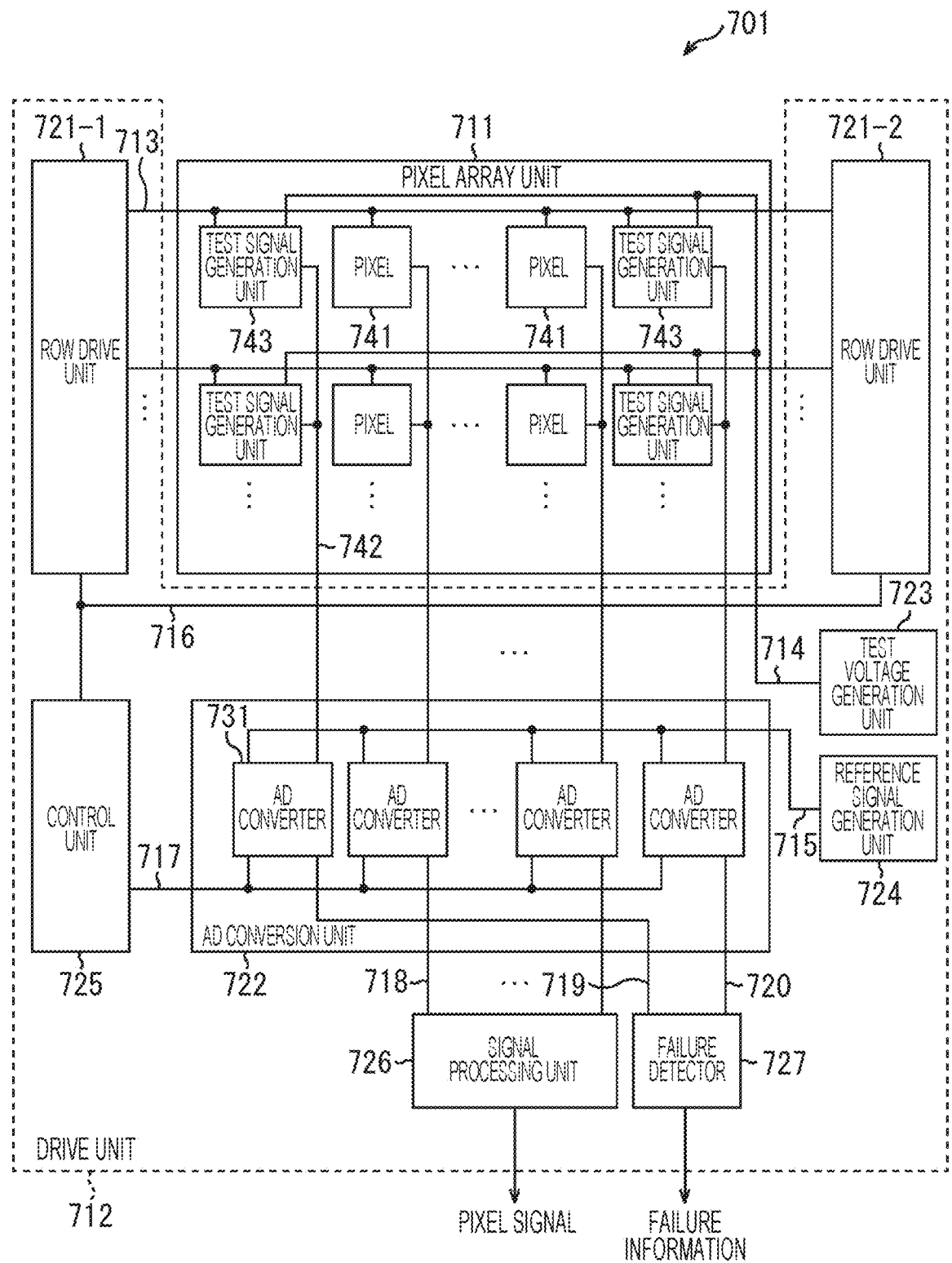
FIG. 39 is a diagram for explaining an example configuration of a column ADC.

Next, types of ADCs are described. Referring to FIG. 39, column ADCs among the ADCs are first described.

FIG. 39 is a diagram showing an example configuration of an imaging device for explaining a column ADC. The imaging device 701 in FIG. 39 includes a pixel array unit 711 and a drive unit 712. Further, the drive unit 712 includes a row drive unit 721-1 and a row drive unit 721-2, an analog-to-digital (AD) conversion unit 722, a test voltage generation unit 723, a reference signal generation unit 724, a control unit 725, a signal processing unit 726, and a failure detector 727.

In the pixel array unit 711, pixels 741 that generate image signals corresponding to emitted light are arranged in a matrix form. Also, in the pixel array unit 711, signal lines 713 that transmit control signals to the pixels 741 are provided for the respective rows, and are shared among the pixels 741 disposed in the respective rows. Each signal line 713 includes a transfer control signal line for transmitting a transfer control signal, a reset control signal line for transmitting a reset control signal, and a pixel selection control signal line for controlling the output of image signals from the pixels 741. Also, in the pixel array unit 711, signal lines 742 for transmitting image signals generated by the pixels 741 are provided for the respective columns, and are shared among the pixels 741 disposed in the respective columns.

Further, in the pixel array unit 711, test signal generation units 743 that generate a test signal for detecting a failure in the signal lines 713 are provided for the respective rows. The test signal generation units 743 are disposed at both ends of the respective rows, and are provided with the signal lines 742 and 713, like the pixels 741. A signal line 714 for transmitting test voltages is further connected to the test signal generation units 743. Here, the test voltages are signals for detecting failures in the transfer control signal line and the reset control signal line described above. The test signal generation units 743 generate a transfer test signal and a reset test signal as test signals. The transfer test signal is generated in accordance with a test voltage and the transfer control signal, and the reset test signal is generated in accordance with a test voltage and the reset control signal.

The row drive units 721-1 and 721-2 generate control signals for the pixels 741, and output the controls signals via the signal lines 713. The row drive units 721-1 and 721-2 generate the above transfer control signal, the above reset control signal, and a pixel selection control signal as the control signals. The row drive units 721-1 and 721-2 also generate the same control signals, and simultaneously output the control signals to the signal lines 713. This is to provide redundancy in the generation of the control signals.

The analog-to-digital conversion unit 722 converts the image signals generated by the pixels 741 into digital image signals. In the analog-to-digital conversion unit 722, analogto-digital converters 731 that perform analog-to-digital conversion are provided for the respective columns of the pixel array unit 711, and the signal lines 742 are connected to the respective analog-to-digital converters 731. Also, in the analog-to-digital conversion unit 722, analog-to-digital converters 731 for performing analog-to-digital conversion on the test signals generated by the test signal generation units 743 or the like are further provided. The digital image signals generated through analog-to-digital conversion are output to the signal processing unit 726. Meanwhile, the digital test signals are output to the failure detector 727.

The test voltage generation unit 723 generates test voltages, and outputs the test voltages to the test signal generation units 743 via the signal line 714. The test voltage generation unit 723 generates a transfer test voltage and a reset test voltage as the test voltages. The transfer test voltage and the reset test voltage are test voltages with different voltages. The transfer test voltage is a test voltage generated when the transfer test signal is generated in the test signal generation units 743 or the like, and the reset test voltage is a test voltage generated when the reset test signal is generated in the test signal generation units 743 or the like.

The reference signal generation unit 724 generates a reference signal, and outputs the reference signal to the analog-to-digital conversion unit 722. This reference signal is output via a signal line 715. A signal that has a voltage dropping in a ramp fashion can be used as the reference signal. The reference signal generation unit 724 starts generation of the reference signal in synchronization with the start of analog-to-digital conversion.

The control unit 725 controls the entire imaging device 701. The control unit 725 generates a common control signal for controlling the row drive units 721-1 and 721-2, and outputs the control signal to the row drive units 721-1 and 721-2 via a signal line 716. The control unit 725 also generates a common control signal for controlling the analog-to-digital converters 731 disposed in the analog-to-digital conversion unit 722, and outputs the control signal to all the analog-to-digital converters 731 via a signal line 717.

The failure detector 727 detects a failure in the signal lines 713, in accordance with a failure signal that is output from the test signal generation units 743 or the like. The failure detector 727 detects a failure in the transfer test signal line, the reset test signal line, and the pixel selection control signal line, in accordance with the transfer test signal and the reset test signal. It is possible to detect a failure by comparing a test signal output from the test signal generation units 743 or the like with a test signal generated in a normal state. The configuration of the failure detector 727 will be described later in detail.

In the imaging device 701 in the drawing, the pixel array unit 711 and the drive unit 712 are formed in different semiconductor chips. The pixel array unit 711 operates with a relatively high power supply voltage, to generate image signals. On the other hand, the drive unit 712 performs digital signal processing. Therefore, the drive unit 712 is required to perform high-speed processing, and is supplied with a relatively low power supply voltage. In this manner, the pixel array unit 711 and the drive unit 712 are formed with circuits having different properties. Therefore, the pixel array unit 711 and the drive unit 712 are separated, and are formed in semiconductor chips manufactured through processes suitable for the respective units. After that, these semiconductor chips are bonded to each other, so that the imaging device 701 is formed. In this manner, the cost performance of the imaging device 701 can be improved. In this case, the signal lines 742, 713, and 714 perform signal transmission between different semiconductor chips.

Note that the pixel array unit 711, the row drive units 721-1 and 721-2, the analog-to-digital conversion unit 722, the test voltage generation unit 723, the reference signal generation unit 724, the control unit 725, the signal processing unit 726, and the failure detector 727 constitute the imaging device 701.

Also, in the example shown FIG. 39, the row drive units 721-1 and 721-2 are provided, and two row drive units 721 having the same functions are provided in the imaging device 701. However, the imaging device 701 may include only one of the row drive units 721.

Further, the signal processing unit 726 processes digital image signals output from the analog-to-digital converters 731. In this process, it is possible to perform horizontal transfer for sequentially transferring the digital image signals output from a plurality of analog-to-digital converters 731, for example.

In the analog-to-digital conversion unit 722 in the imaging device 701 in FIG. 39, a plurality of analog-to-digital converters 731 that perform analog-to-digital conversion are provided for the respective columns of the pixel array unit 711, and analog-to-digital conversion is performed on image signals row by row. These analog-to-digital circuits are called column ADC circuits.

The column ADCs 111 in FIG. 4 of the present disclosure, the image signal output unit 103 in FIG. 5, and the ADC 242 in FIG. 18 may be formed with the column ADC circuits described above with reference to FIG. 39. Further, the AD converters 540 in FIG. 32 and FIGS. 35 through 38 may be column ADC circuits.

7-2. Area ADC

Figure 40:
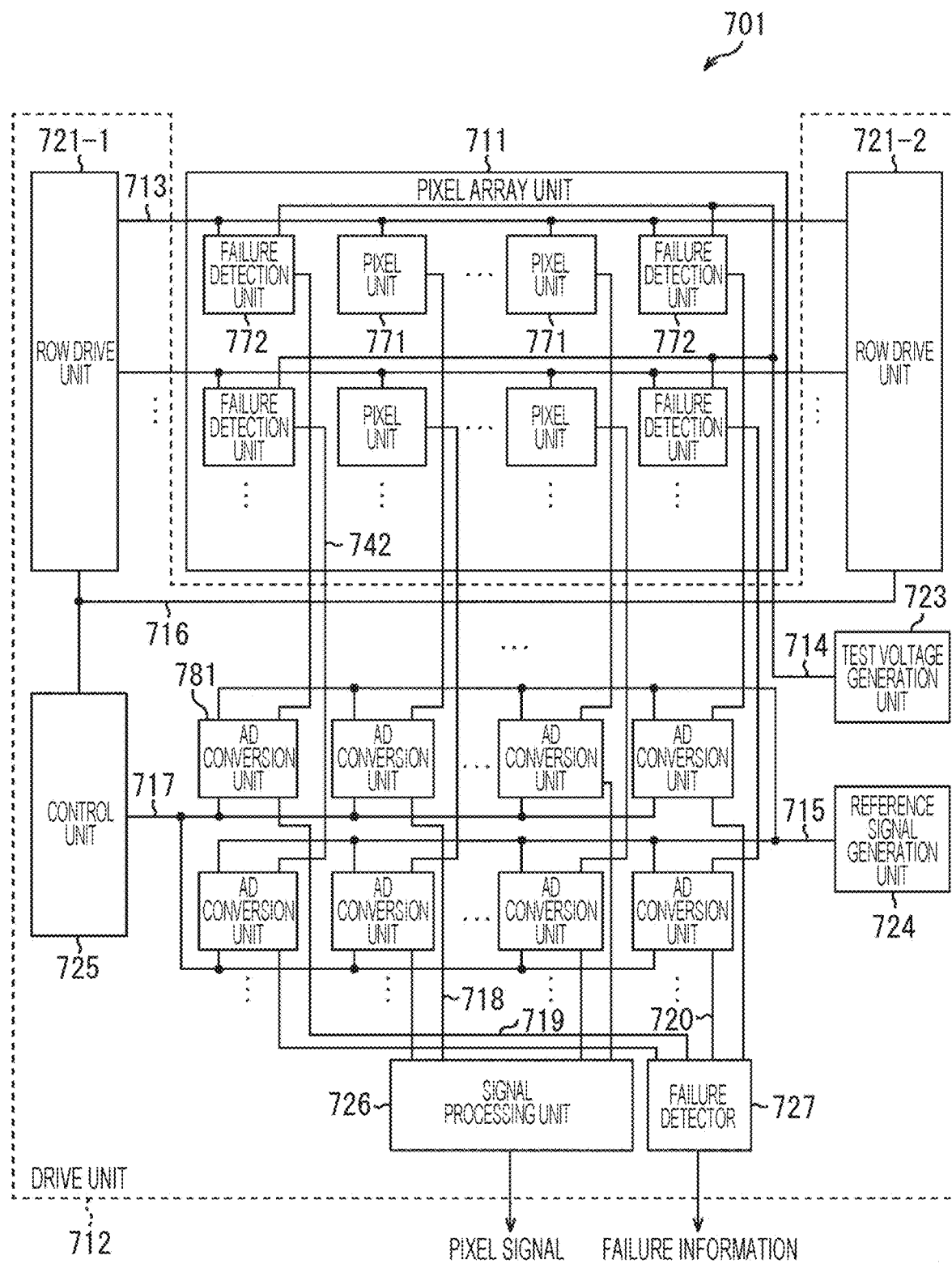
FIG. 40 is a diagram for explaining an example configuration of an area ADC.

Referring now to FIG. 40, an area ADC is described. FIG. 40 is a diagram showing an example configuration of an imaging device 701 for explaining an area ADC. Note that, in FIG. 40, components having the same functions as those of the imaging device 701 shown in FIG. 39 are denoted by the same reference numerals as those in FIG. 39, and explanation of them will not be repeated as appropriate. Specifically, the imaging device 701 in FIG. 40 differs from the imaging device 701 in FIG. 39 in including a plurality of analog-to-digital conversion units 781.

In the pixel array unit 711 of the imaging device 701 in FIG. 40, pixel units 771, instead of the pixels 741, are arranged in a matrix form. Also, instead of the test signal generation units 743, failure detection units 772 are provided for the respective rows. Further, signal lines 713 and 714 are connected to the pixel units 771 and the failure detection units 772, as in the pixel array unit 711 described with reference to FIG. 39.

In the imaging device 701 in FIG. 40, the analog-to-digital conversion units 781 is provided for the respective pixel units 771 and the respective failure detection units 772 disposed in the pixel array unit 711, perform analog-to-digital conversion on image signals or the like, and output each converted image signal or the like to the signal processing unit 726 or the failure detector 727. The pixel units 771 and the failure detection units 772, and the corresponding analog-to-digital conversion units 781 are individually connected by signal lines 742.

Note that, in the example shown FIG. 40, the row drive units 721-1 and 721-2 are provided, and two row drive units 721 having the same functions are provided in the imaging device 701. However, the imaging device 701 may include only one of the row drive units 721.

Like the analog-to-digital conversion units 781 of the imaging device 701 in FIG. 40, analog-to-digital conversion circuits are provided for the respective pixel units 771 formed with a plurality of pixels in a predetermined area, and perform analog-to-digital conversion on image signals area by area. These analog-to-digital conversion circuits are called area ADC circuits.

Instead of the column ADCs 111 in FIG. 4, the image signal output unit 103 in FIG. 5, and the ADC 242 in FIG. 18 of the present disclosure, the area ADC circuits described with reference to FIG. 40 may be used. Further, the AD converters 540 in FIG. 32 and FIGS. 35 through 38 may be area ADC circuits.

Note that, in a case where each of the pixel units 771 is formed with one pixel, the analog-to-digital conversion units 781 are referred to particularly as pixel ADC circuits. That is, the analog-to-digital conversion units 781 are formed a pixel-by-pixel basis in this case.

8. Example Structure of WCSP 8-1. Outline of an Example Structure of WCSP

Figure 41:
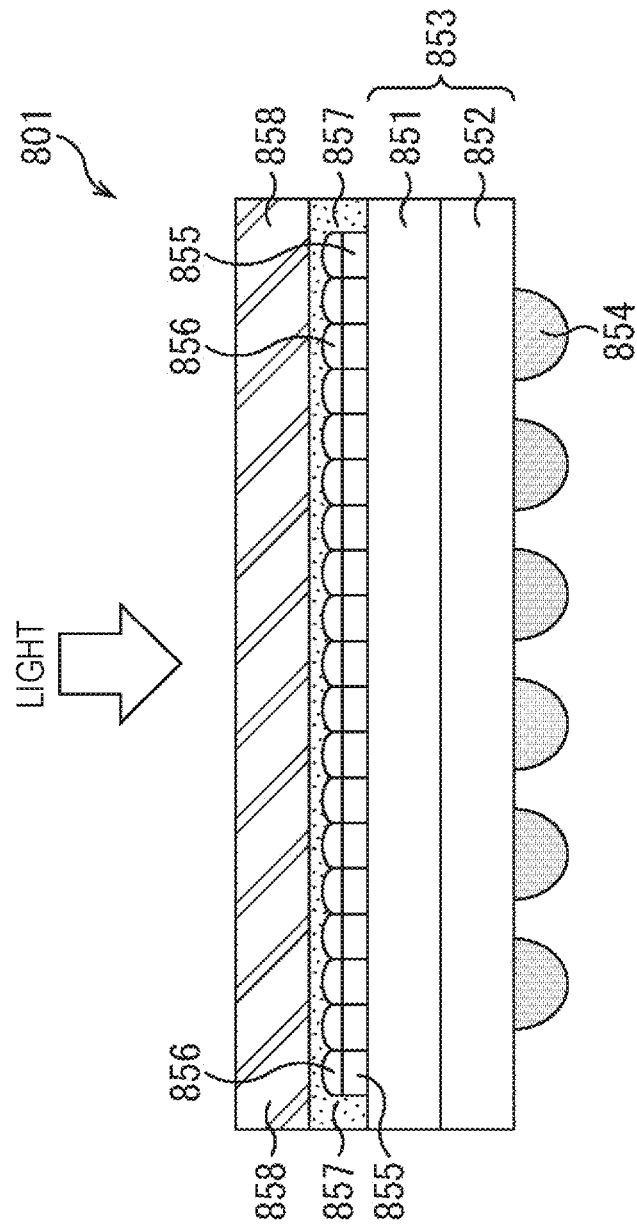
FIG. 41 is a diagram for explaining a schematic example structure in a case where an imaging device having a two-layer structure is formed with a WCSP.

FIG. 41 schematically shows an example structure in a case where a wafer-level chip size package (WCSP) is adopted as an imaging device that is a semiconductor device according to the present technology.

The imaging device 801 shown in FIG. 41 converts light or electromagnetic waves entering the device from the direction indicated by an arrow in the drawing, into an electrical signal. In the description below in the present disclosure, for ease of explanation, light is the current object to be converted into an electrical signal, and an apparatus that converts light into an electrical signal will be described as an example.

The imaging device 801 includes a stack structure 853 in which a first structure 851 and a second structure 852 are stacked, external terminals 854, and a protective substrate 858 formed on the upper side of the first structure 851. Note that, in the description below, the side of the incidence surface through which light enters the device will be referred to as the upper side, and the side of the other surface on the opposite side from the incidence surface will be referred to as the lower side in FIG. 41, for the sake of convenience. In view of this, the first structure 851 will be referred to as the upper structure 851, and the second structure 852 will be referred to as the lower structure 852.

As will be described later, the imaging device 801 is formed in the following manner. A semiconductor substrate (a wafer) forming part of the upper structure 851, a semiconductor substrate (a wafer) forming part of the lower structure 852, and the protective substrate 858 are bonded to one another at the wafer level. The resultant structure is then divided into individual imaging devices 801.

The upper structure 851 before divided into individual devices is a structure in which pixels for converting incident light into electrical signals are formed in a semiconductor substrate (a wafer). The pixels each includes a photodiode (PD) for photoelectric conversion and a plurality of pixel transistors that control photoelectric conversion operations and operations of reading photoelectrically-converted electrical signals, for example. The upper structure 851 included in the imaging device 801 after the division may be referred to as an upper chip, an image sensor substrate, or an image sensor chip in some cases.

The pixel transistors included in the imaging device 801 are preferably MOS transistors, for example.

On the upper surface of the upper structure 851, color filters 855 of red (R), green (G), or blue (B) and on-chip lenses 856 are formed, for example. On the upper side of the on-chip lenses 856, the protective substrate 858 for protecting components in the imaging device 801, particularly the on-chip lenses 856 and the color filters 855, is disposed. The protective substrate 858 is a transparent glass substrate, for example. Where the hardness of the protective substrate 858 is higher than the hardness of the on-chip lenses 856, the effect to protect the on-chip lenses 856 is greater.

The lower structure 852 before the division is a structure in which a semiconductor circuit including transistors and wiring lines is formed in a semiconductor substrate (a wafer). The lower structure 852 included in the imaging device 801 after the division may be referred to as a lower chip, a signal processing substrate, or a signal processing chip in some cases. In the lower structure 852, a plurality of external terminals 854 for electrically connecting to wiring lines (not shown) outside the device are formed. The external terminals 854 are solder balls, for example.

The imaging device 801 has a cavity-less structure in which the protective substrate 858 is secured onto the upper side of the upper structure 851 or the upper side of the on-chip lenses 856 via a glass seal resin 857 provided on the on-chip lenses 856. The hardness of the glass seal resin 857 is lower than the hardness of the protective substrate 858. Accordingly, the stress that is applied from the outside of the imaging device 801 to the protective substrate 858, and propagates to the inside of the device can be made lower than in a case where there is no seal resin.

Note that the imaging device 801 may have a different structure from the cavity-less structure, or have a cavity structure in which a columnar or wall-like structure is formed on the upper surface of the upper structure 851, and the protective substrate 858 is secured by the above columnar or wall-like structure so as to be kept with some space left above the on-chip lenses 856.

8-2. Example Circuit Layout in the Imaging Device

The following is a description of the circuit layout in the imaging device 801, or how the respective blocks in the imaging device 801 shown in FIG. 41 are divided into the upper structure 851 and the lower structure 852.

Figure 42:
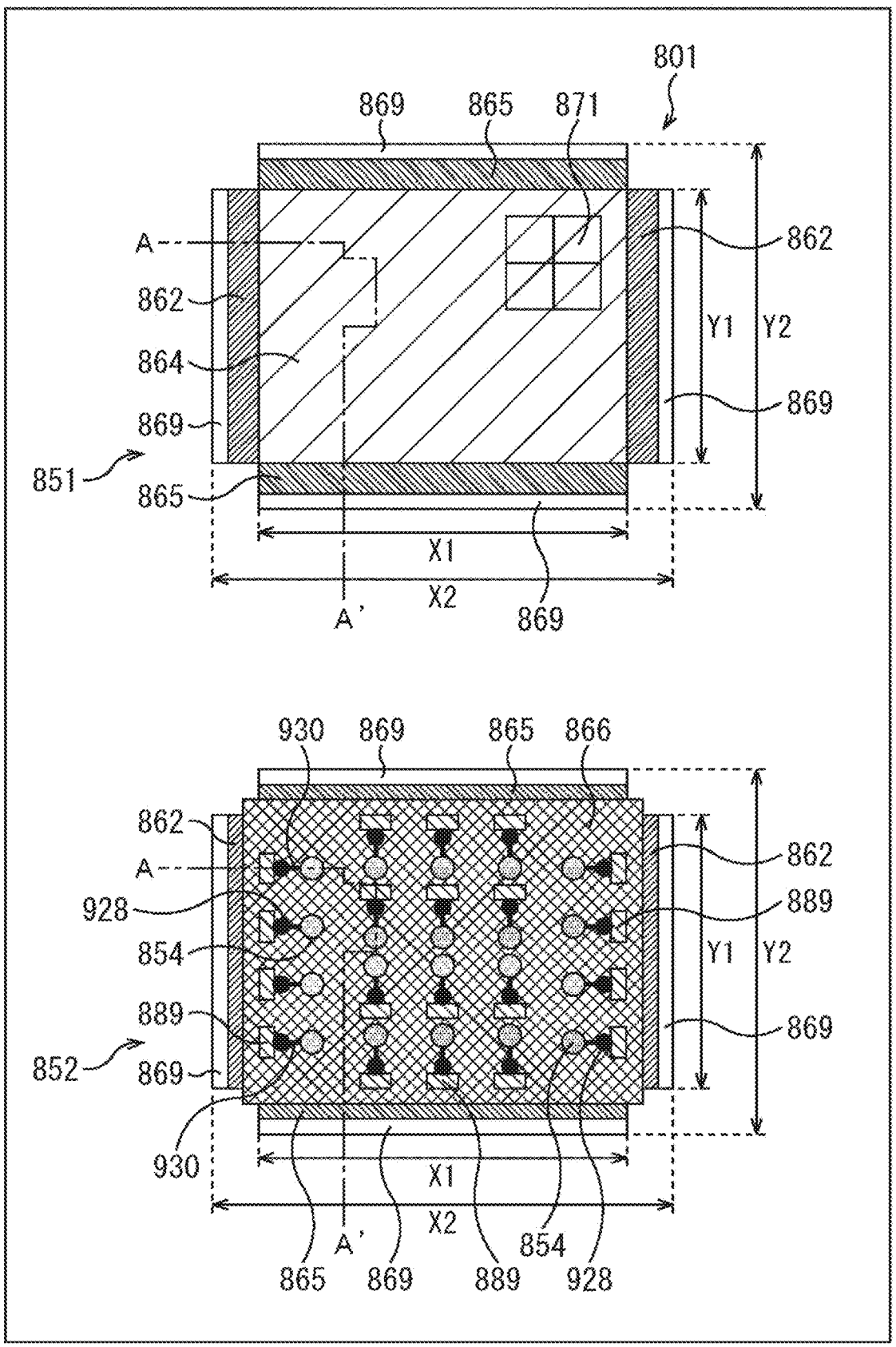
FIG. 42 is a diagram for explaining an example circuit layout configuration of the imaging device shown in FIG. 41.

FIG. 42 is a diagram showing an example configuration of the circuit layout in the imaging device 801.

In the example circuit layout, a pixel array unit 864 formed with a plurality of pixels 871 arranged in an array is disposed in the upper structure 851.

Of the pixel peripheral circuit units included in the imaging device 801, part of a row drive unit 862 is disposed in the upper structure 851, and part of the row drive unit 862 is disposed in the lower structure 852. For example, of the row drive unit 862, a row drive circuit unit is disposed in the upper structure 851, and a row decoder unit is disposed in the lower structure 852.

The row drive unit 862 disposed in the upper structure 851 is located outside the pixel array unit 864 in the row direction, and at least part of the row drive unit 862 disposed in the lower structure 852 is located below the row drive unit 862 included in the upper structure 851.

Of the pixel peripheral circuit units included in the imaging device 801, part of a column signal processing unit 865 is disposed in the upper structure 851, and part of the column signal processing unit 865 is disposed in the lower structure 852. For example, of the column signal processing unit 865, a load circuit unit, an amplification circuit unit, a noise processing unit, and an ADC comparator unit are disposed in the upper structure 851, and an ADC counter unit is disposed in the lower structure 852.

The column signal processing unit 865 disposed in the upper structure 851 is located outside the pixel array unit 864 in the column direction, and at least part of the column signal processing unit 865 disposed in the lower structure 852 is located below the column signal processing unit 865 included in the upper structure 851.

Wiring line connection units 869 for connecting the wiring lines of the two row drive units 862 are provided on the outer sides of the row drive unit 862 disposed in the upper structure 851 and on the outer sides of the row drive unit 862 disposed in the lower structure 852.

Figure 43:
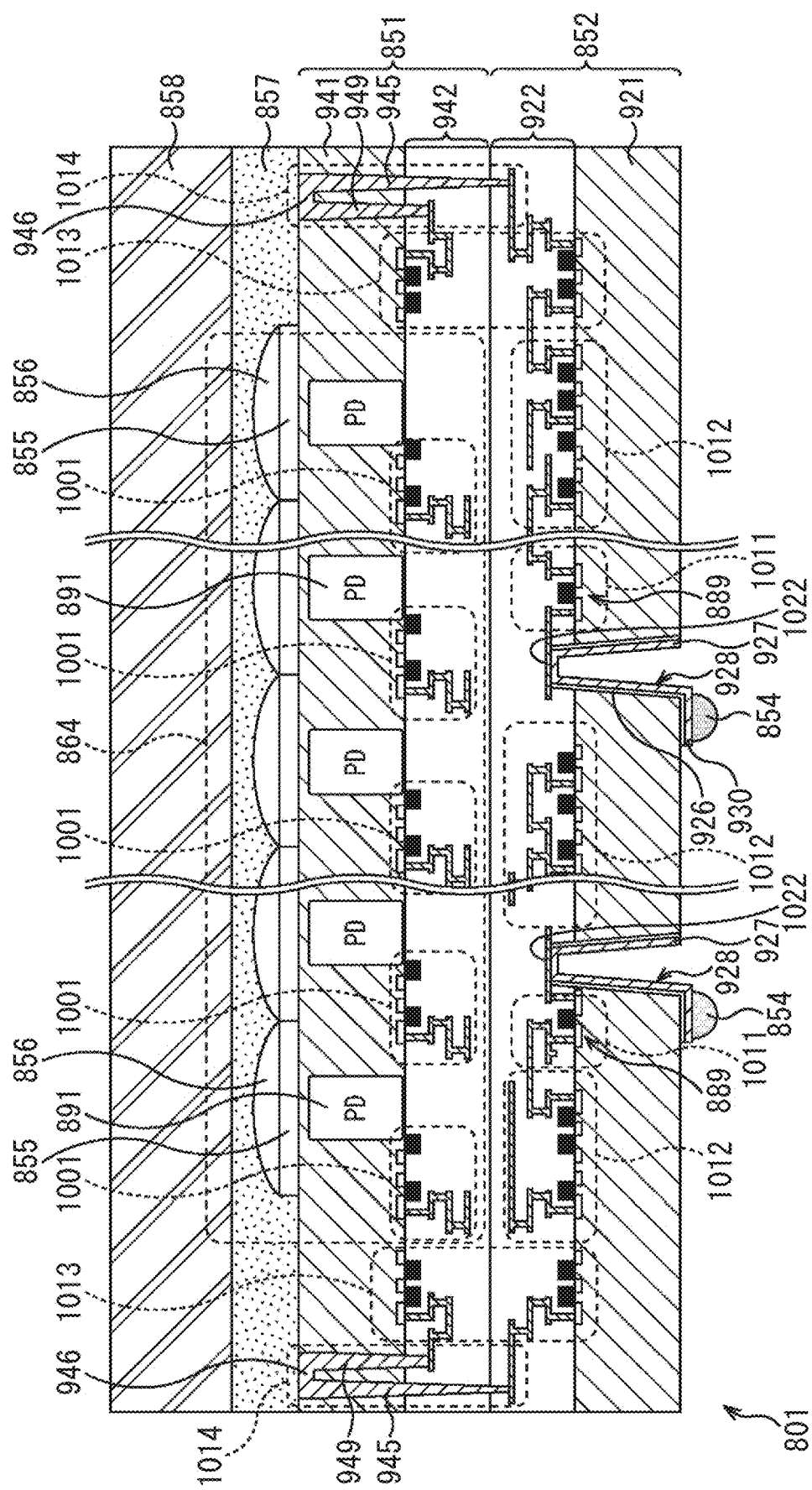
FIG. 43 is a diagram for explaining an example cross-section structure of the imaging device shown in FIG. 41.

Wiring line connection units 869 for connecting the wiring lines of the two column signal processing units 865 are also provided on the outer sides of the column signal processing unit 865 disposed in the upper structure 851 and on the outer sides of the column signal processing unit 865 disposed in the lower structure 852. The wiring line connection structures that will be described later with reference to FIG. 43 are used In these wiring line connection units 869.

An image signal processing unit 866 is disposed on the inner sides of the row drive unit 862 and the column signal processing unit 865 disposed in the lower structure 852.

In the lower structure 852, input/output circuit units 889 are disposed in a region located below the pixel array unit 864 in the upper structure 851.

The input/output circuit units 889 are circuit units each including an input circuit unit and/or an output circuit unit. In a case where each input/output circuit unit 889 is formed with both an input circuit unit and an output circuit unit, a plurality of input/output circuit units 889 are provided for the respective external terminals 854, and are disposed in the lower structure 852. In a case where each input/output circuit unit 889 is formed with only an input circuit unit, a plurality of input circuit units are provided for the respective external terminals 854 (input terminals), and are disposed in the lower structure 852. In a case where each input/output circuit unit 889 is formed with only an output circuit unit, a plurality of output circuit units are provided for the respective external terminals 854 (output terminals), and are disposed in the lower structure 852. An image signal processing unit is disposed around the respective input/output circuit units 889 divided in plural. In other words, the input/output circuit units 889 are disposed in the regions where the image signal processing unit is disposed.

Note that, in the lower structure 852, the input/output circuit units 889 may be disposed in a region below the row drive unit 862 in the upper structure 851 or below the column signal processing unit 865 of the upper structure 851.

In other words, the input/output circuit units 889 can be disposed in any appropriate region on the side of the lower structure 852 having the external terminals 854 formed thereon, and below the region of the pixel array unit 864 of the upper structure 851, or below the pixel peripheral circuit units of the upper structure 851 (the circuit units formed in the upper structure 851 in the pixel peripheral circuit regions 1013 shown in FIG. 4).

8-3. Cross-Section Structure of the Imaging Device

A cross-section structure of and the circuit layout in the imaging device 801 according to this embodiment are further described, with reference to FIG. 43.

FIG. 43 is a diagram showing a cross-section structure of the imaging device 801 taken along the line A-A' defined in FIG. 42.

At a portion including the upper structure 851 in the imaging device 801 and a portion above the upper structure 851, the pixel array unit 864 in which a plurality of pixels 871 (FIG. 42) each including an on-chip lens 856, a color filter 855, a pixel transistor, and a photodiode 891 are arranged in an array is disposed. In the region of the pixel array unit 864 (the pixel array region), pixel transistor regions 1001 are also formed. Each pixel transistor region 1001 is a region in which at least one pixel transistor among a transfer transistor, an amplification transistor, and a reset transistor is formed.

A plurality of external terminals 854 are disposed in a region that is located on the lower surface of a semiconductor substrate 921 included in the lower structure 852 and is located below the pixel array unit 864 included in the upper structure 851.

Note that, in the description with reference to FIG. 43, the "region that is located on the lower surface of the semiconductor substrate 921 included in the lower structure 852 and is located below the pixel array unit 864 included in the upper structure 851" is referred to as a first specific region, and the "region that is located on the upper surface of the semiconductor substrate 921 included in the lower structure 852 and is located below the pixel array unit 864 included in the upper structure 851" is referred to as a second specific region.

At least a part of the plurality of external terminals 854 disposed in the first specific region is a signal input terminal for inputting a signal from the outside to the imaging device 801, or a signal output terminal 854B for outputting a signal from the imaging device 801 to the outside. In other words, signal input terminals 854A and signal output terminals 854B are the external terminals 854 excluding the power supply terminal and the ground terminal from the external terminals 854. These signal input terminals 854A or signal output terminals 854B are referred to as signal input/output terminals 854C.

Through vias 928 penetrating through the semiconductor substrate 921 are disposed in the first specific region and in the vicinity of the signal input/output terminals 854C. Note that a via hole penetrating through the semiconductor substrate 921 and a via wiring line formed in the via hole are also collectively referred to as a through via 928.

This through via hole is preferably designed to extend from the lower surface of the semiconductor substrate 921 to a conductive pad 1022 (hereinafter also referred to as a via pad 1022) that is part of a multilevel wiring layer 922 disposed above the upper surface of the semiconductor substrate 921 and forms the terminal end (the bottom portion) of the via hole.

The signal input/output terminals 854C disposed in the first specific region are electrically connected to the through vias 928 (more specifically, the via wiring lines formed in the through via holes) that are also disposed in the first specific region.

The input/output circuit units 889 including input circuit units or output circuit units are disposed in the second specific region and in a region near the signal input/output terminals 854C and the through vias.

The signal input/output terminals 854C disposed in the first specific region are electrically connected to the input/output circuit units 889 via the through vias 928 and the via pads 1022, or part of the multilevel wiring layer 922.

The regions in which the input/output circuit units 889 are disposed are referred to as input/output circuit regions 1011. Signal processing circuit regions 1012 are formed adjacent to the input/output circuit regions 1011 on the upper surface of the semiconductor substrate 921 included in the lower structure 852. The signal processing circuit regions 1012 are regions in which the image signal processing unit is formed.

The regions in which pixel peripheral circuit units including all or some of the row drive units for driving the respective pixels of the pixel array unit 864 and the column signal processing units are arranged are called pixel peripheral circuit regions 1013. On the lower surface of a semiconductor substrate 941 included in the upper structure 861 and on the upper surface of the semiconductor substrate 921 included in the lower structure 852, the pixel peripheral circuit regions 1013 are formed in the regions outside the pixel array unit 864.

The signal input/output terminals 854C may be disposed in regions located below the input/output circuit regions 1011 formed in the lower structure 852, or may be disposed in regions located below the signal processing circuit regions 1012. Alternatively, the signal input/output terminals 854C may be disposed below the pixel peripheral circuit units such as row drive units or column signal processing units disposed in the lower structure 852.

The wiring line connection structure for connecting the wiring lines included in the multilevel wiring layer 942 of the upper structure 851 and the wiring lines included in the multilevel wiring layer 922 of the lower structure 852 is also referred to as an upper-lower wiring line connection structure, and the regions in which this structure is disposed is also referred to as upper-lower wiring line connection regions 1014.

The upper-lower wiring line connection structure is formed with first through electrodes (silicon through vias) 949 that penetrate through the semiconductor substrate 941 from the upper surface of the upper structure 851 to the multilevel wiring layer 942, second through electrodes (chip through vias) 945 that penetrate through the semiconductor substrate 941 and the multilevel wiring layer 942 from the upper surface of the upper structure 851 to the multilevel wiring layer 922 of the lower structure 852, and through electrode connection wiring lines 946 for connecting these two kinds of through electrodes (through silicon vias: TSVs). Such an upper-lower wiring line connection structure is also called a twin contact structure.

The upper-lower wiring line connection regions 1014 are formed outside the pixel peripheral circuit regions 1013.

In this embodiment, the pixel peripheral circuit regions 1013 are formed in both the upper structure 851 and the lower structure 852. However, the pixel peripheral circuit regions 1013 may be formed only in one of the structures.

Also, the upper-lower wiring line connection regions 1014 are formed outside the pixel array unit 864 and outside the pixel peripheral circuit regions 1013. However, the upper-lower wiring line connection regions 1014 may be formed outside the pixel array unit 864 and inside the pixel peripheral circuit regions 1013.

Further, a twin contact structure connecting the two kinds of through electrodes that are the silicon through vias 949 and the chip through vias 945 is adopted as the structure that electrically connects the multilevel wiring layer 942 of the upper structure 851 and the multilevel wiring layer 922 of the lower structure 852.

A shared contact structure that connects a wiring layer 943 of the upper structure 851 and a wiring layer 923 of the lower structure 852 to a single through electrode may be adopted as a structure that electrically connects the multilevel wiring layer 942 of the upper structure 851 and the multilevel wiring layer 922 of the lower structure 852, for example.

<8-4. Circuit Layout in an Imaging Device in a Case where a Different Upper-Lower Wiring Line Connection Structure is Used>

Figure 44:
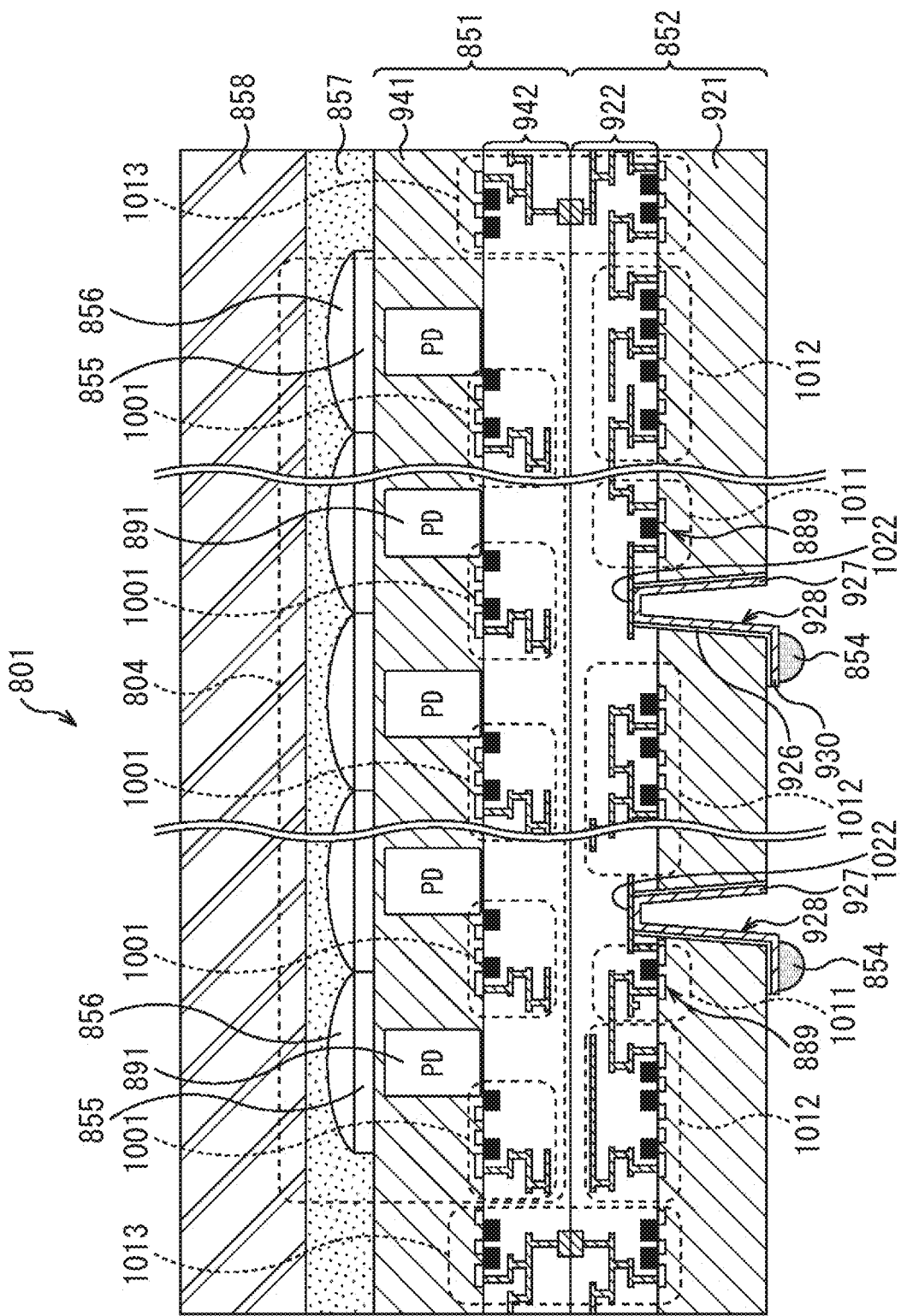
FIG. 44 is a diagram for explaining an example circuit layout in a case where a different upper-lower wiring line connection structure of the imaging device in FIG. 41 is used.

The circuit layout and a cross-section structure of the imaging device 801 in a case where some other upper-lower wiring line connection structure is used are now described, with reference to FIG. 44.

FIG. 44 is a diagram showing a cross-section structure of the imaging device 801 taken along the line A-A' defined in FIG. 42 in a case where a structure different from the upper-lower wiring line connection structure shown in FIG. 42 is used.

In the pixel peripheral circuit regions 1013 in FIG. 44, one of the wiring lines in the multilevel wiring layer 942 of the upper structure 851 is disposed in the lowermost plane of the multilevel wiring layer 942, or, in other words, in the junction plane between the upper structure 851 and the lower structure 852. One of the wiring lines in the multilevel wiring layer 922 of the lower structure 852 is also disposed in the uppermost plane of the multilevel wiring layer 922, or, in other words, in the junction plane between the upper structure 851 and the lower structure 852. Furthermore, the one of the wiring lines of the multilevel wiring layer 942 and the one of the wiring lines of the multilevel wiring layer 922 are disposed at substantially the same position in the junction plane, and are electrically connected to each other. The mode for electrically connecting wiring lines may be a mode for brining two wiring lines into direct contact with each other, or a mode in which a thin insulating film or a thin high-resistance film is formed between the two wiring lines, and part of the formed film is electrically conductive. Alternatively, a thin insulating film or a thin high-resistance film may be formed between two wiring lines, and the two wiring lines may transmit an electrical signal through capacitive coupling.

Where one of the wiring lines of the multilevel wiring layer 942 of the upper structure 851 and one of the wiring lines of the multilevel wiring layer 922 of the lower structure 852 are formed at substantially the same position in the above described junction plane, a structure that electrically connects the two wiring lines is generally referred to as an upper-lower wiring line direct connection structure or simply as a wiring line direct connection structure.

A specific example of the substantially same position is a position at which the electrically-connected two wiring lines at least partially overlap each other in a case where the imaging device 801 is viewed from above in a plan view, for example. In a case where copper (Cu) is used as the material of the two connected wiring lines, for example, the connection structure may be referred to as a Cu—Cu direct junction structure or simply as a Cu—Cu junction structure.

In a case where an upper-lower wiring line direct connection structure is used, this connection structure can be disposed outside the pixel array unit 864. Alternatively, this connection structure can be disposed inside the pixel peripheral circuit region 1013 in the upper structure 851 and inside the pixel peripheral circuit region 1013 in the lower structure 852. More specifically, among the wiring lines constituting the upper-lower wiring line direct connection structure, the wiring lines disposed in the junction plane on the side of the upper structure 851 can be disposed below a circuit included in the pixel peripheral circuit region 1013 in the upper structure 851. Also, among the wiring lines constituting the upper-lower wiring line direct connection structure, the wiring lines disposed in the junction plane on the side of the lower structure 852 can be disposed above a circuit included in the pixel peripheral circuit region 1013 in the lower structure 852. Alternatively, the wiring lines disposed in the pixel array unit 864 (the pixel transistor regions 1001) may be used as the wiring lines of the upper structure 851, and an upper-lower wiring line direct connection structure formed with these wiring lines and the wiring lines of the lower structure 852 may be disposed below the pixel array unit 864 (the pixel transistor regions 1001).

8-5. Structure of the Imaging Device in Detail

Figure 45:
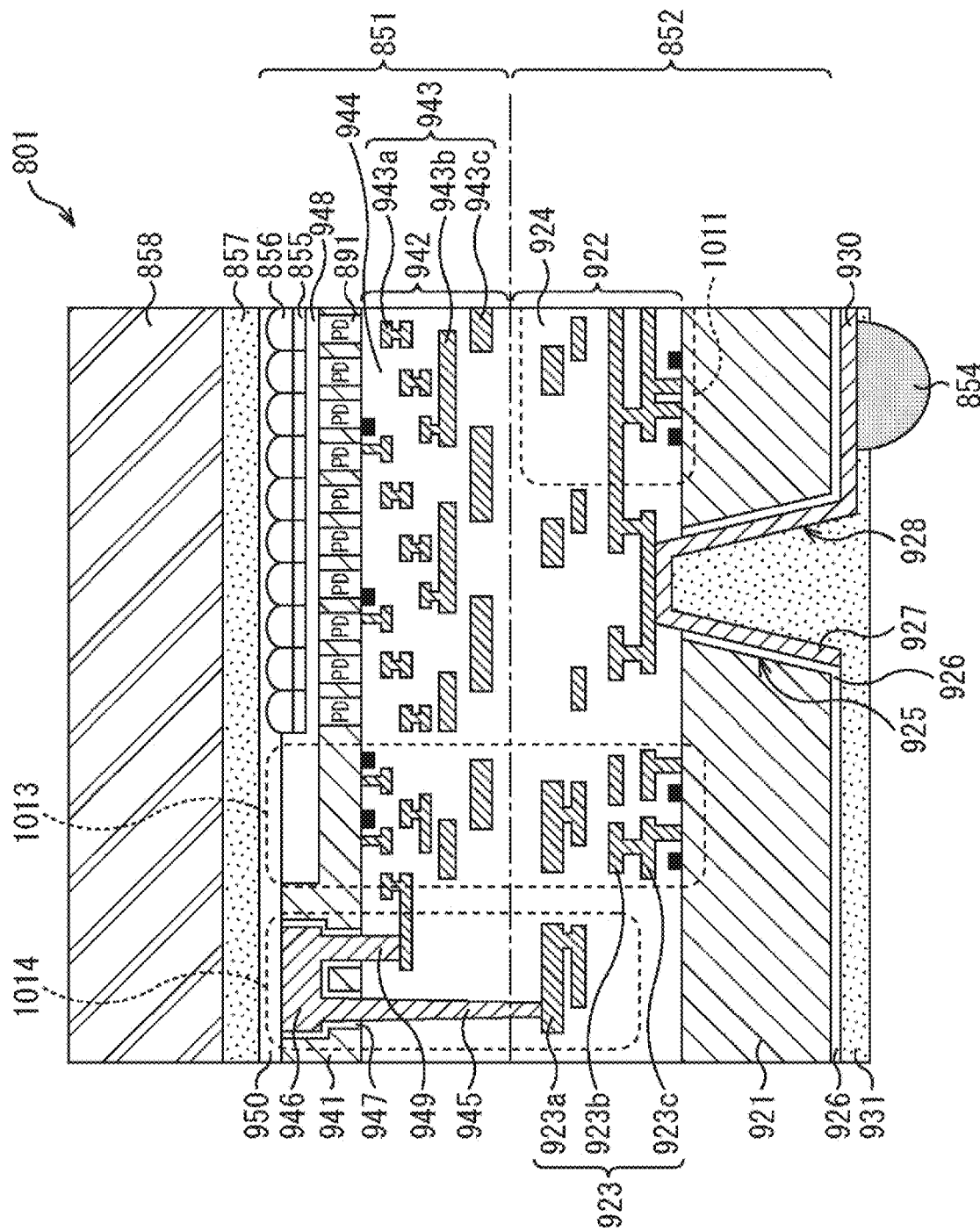
FIG. 45 is a diagram for explaining the structure of the imaging device in FIG. 41 in detail.

Referring now to FIG. 45, the structure of the imaging device 801 is described in detail. FIG. 45 is an enlarged cross-sectional view of a portion in the vicinity of the outer periphery of the imaging device 801 having a twin contact structure.

In the lower structure 852, the multilevel wiring layer 922 is formed on the upper side (the side of the upper structure 851) of the semiconductor substrate 921 including silicon (Si), for example. The multilevel wiring layer 922 forms the input/output circuit regions 1011, the signal processing circuit regions 1012 (not shown in FIG. 45), the pixel peripheral circuit regions 1013, and the like, which are shown in FIG. 42.

The multilevel wiring layer 922 includes a plurality of wiring layers 923 and an interlayer insulating film 924 formed between the wiring layers 923. The wiring layers 923 include an uppermost wiring layer 923*a* closest to the upper structure 851, an intermediate wiring layer 923*b*, a lowermost wiring layer 923*c* closest to the semiconductor substrate 921, and the like.

The plurality of wiring layers 923 are formed with copper (Cu), aluminum (Al), tungsten (W), or the like, for example. The interlayer insulating film 924 is formed with a silicon oxide film, a silicon nitride film, or the like, for example. Each of the plurality of wiring layers 923 and the interlayer insulating film 924 may be formed with the same material in all the layers, or may be formed with two or more materials in different layers.

At a predetermined position in the semiconductor substrate 921, a silicon through hole 925 penetrating through the semiconductor substrate 921 is formed, and a connection conductor 927 is buried in the inner wall of the silicon through hole 925 with an insulating film 926 interposed in between, to form a through via (through silicon via: TSV) 928. The insulating film 926 may be formed with an SiO2 film, a SiN film, or the like, for example. In this embodiment, the through via 928 has an inversely tapered shape in which the plane area on the side of the wiring layers 923 is smaller than that on the side of the external terminals 854. However, the through via 928 may have a forward tapered shape in which the plane area on the side of the external terminals 854 is smaller, or a non-tapered shape in which the area on the side of the external terminals 854 and the area on the side of the wiring layers 923 are substantially the same.

The connection conductor 927 of the through via 928 is connected to a rewiring line 930 formed on the lower surface side of the semiconductor substrate 921, and the rewiring line 930 is connected to the external terminal 854. The connection conductor 927 and the rewiring line 930 may be formed with copper (Cu), tungsten (W), titanium (Ti), tantalum (Ta), titanium tungsten alloy (TiW), polysilicon, or the like, for example.

Further, on the lower surface side of the semiconductor substrate 921, a solder mask (solder resist) 931 is formed so as to cover the rewiring line 930 and the insulating film 926, except for the region where the external terminal 854 is formed.

Meanwhile, in the upper structure 851, the multilevel wiring layer 942 is formed on the lower side (the side of the lower structure 852) of the semiconductor substrate 941 including silicon (Si), for example. The circuits of the pixels 871 are formed with this multilevel wiring layer 942.

The multilevel wiring layer 942 includes a plurality of wiring layers 943 and an interlayer insulating film 944 formed between the wiring layers 943. The wiring layers 943 include an uppermost wiring layer 943*a* closest to the semiconductor substrate 941, an intermediate wiring layer 943*b*, a lowermost wiring layer 943*c* closest to the lower structure 852, and the like.

The material used for the plurality of wiring layers 943 and the interlayer insulating film 944 may be the same as the above mentioned material of the wiring layers 923 and the interlayer insulating film 924. Also, the plurality of wiring layers 943 and the interlayer insulating film 944 may be formed with one or more materials, like the wiring layers 923 and the interlayer insulating film 924 described above.

Note that, in the example shown in FIG. 45, the multilevel wiring layer 942 of the upper structure 851 is formed with five wiring layers 943, and the multilevel wiring layer 922 of the lower structure 852 is formed with four wiring layers 923. However, the total number of wiring layers is not limited to this, and each multilevel wiring layer can be formed with any appropriate number of wiring layers.

In the semiconductor substrate 941, photodiodes 891 formed with PN junctions are formed for the respective pixels 871.

Although not specifically shown in the drawing, a plurality of pixel transistors such as a transfer transistor and an amplification transistor, a floating diffusion (FD), and the like are also formed in the multilevel wiring layer 942 and the semiconductor substrate 941.

A silicon through via 949 connected to a predetermined wiring layer 943 of the upper structure 851, and a chip through via 945 connected to a predetermined wiring layer 923 of the lower structure 852 are formed at a predetermined position in the semiconductor substrate 941 at which the color filters 855 and the on-chip lenses 856 are not formed.

The chip through via 945 and the silicon through via 949 are connected by a connection wiring line 946 formed in the upper surface of the semiconductor substrate 941. An insulating film 947 is also formed between each of the silicon through via 949 and the chip through via 945 and the semiconductor substrate 941.

A planarizing film 948 is formed between the photodiodes 891 and the color filters 855 in the semiconductor substrate 941, and a planarizing film 950 is also formed between the on-chip lenses 856 and the glass sealing resin 857.

As described above, the stack structure 853 of the imaging device 801 shown in FIG. 41 is a stack structure in which the multilevel wiring layer 922 of the lower structure 852 and the multilevel wiring layer 942 of the upper structure 851 are joined to each other. In FIG. 45, the junction plane between the multilevel wiring layer 922 of the lower structure 852 and the multilevel wiring layer 942 of the upper structure 851 is indicated by a dot-and-dash line.

Further, in the stack structure 853 of the imaging device 801, a wiring layer 943 of the upper structure 851 and a wiring layer 923 of the lower structure 852 are connected by the two through electrodes, the silicon through via 949 and the chip through via 945. A wiring layer 923 of the lower structure 852 and an external terminal (back surface electrode) 854 are connected by the through via 928 and the rewiring line 930. As a result, pixel signals generated by the pixels 871 of the upper structure 851 are transmitted to the lower structure 852, are subjected to signal processing in the lower structure 852, and are output from the external terminals 854 to the outside of the device.

8-6. Modifications

First Modification

Figure 46:
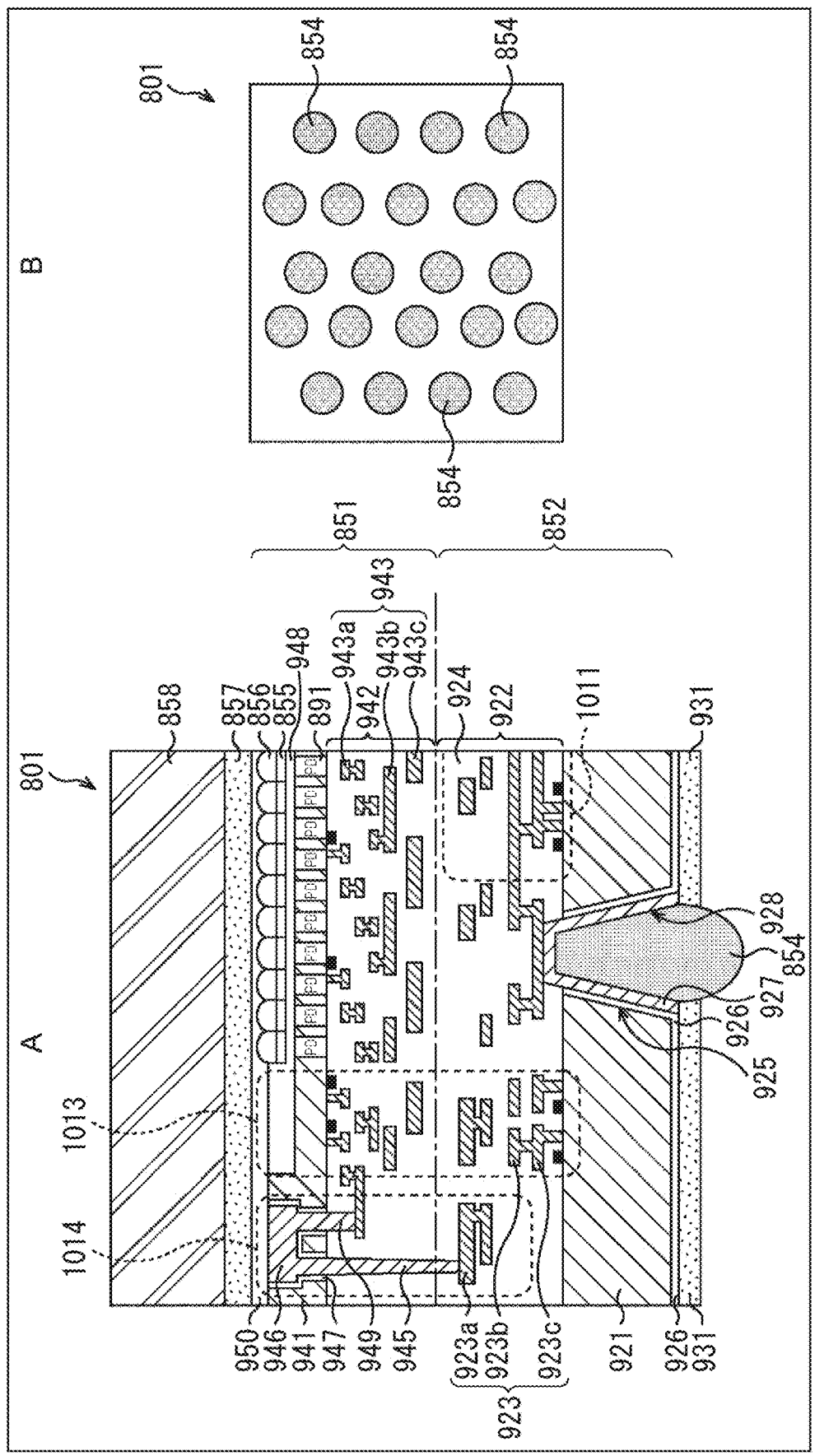
FIG. 46 is a diagram for explaining a first modification of the imaging device shown in FIG. 41.

Referring now to FIG. 46, a first modification of the imaging device 801 is described.

A of FIG. 46 is a cross-sectional view of a portion in the vicinity of the outer periphery of the imaging device 801 according to the first modification. B of FIG. 46 is a plan view of the imaging device 801 of the first modification on the side of the external terminals 854.

In the first modification, as shown in A of FIG. 46, the external terminals 854 are formed immediately above the through vias 928 so as to overlap with the positions of the through vias 928 in a plan view. Because of this, the area for forming the rewiring line 930 on the back side of the imaging device 801 becomes unnecessary, as shown in B of FIG. 46. Thus, a shortage in the area for forming input/output units can be avoided.

Second Modification

Figure 47:
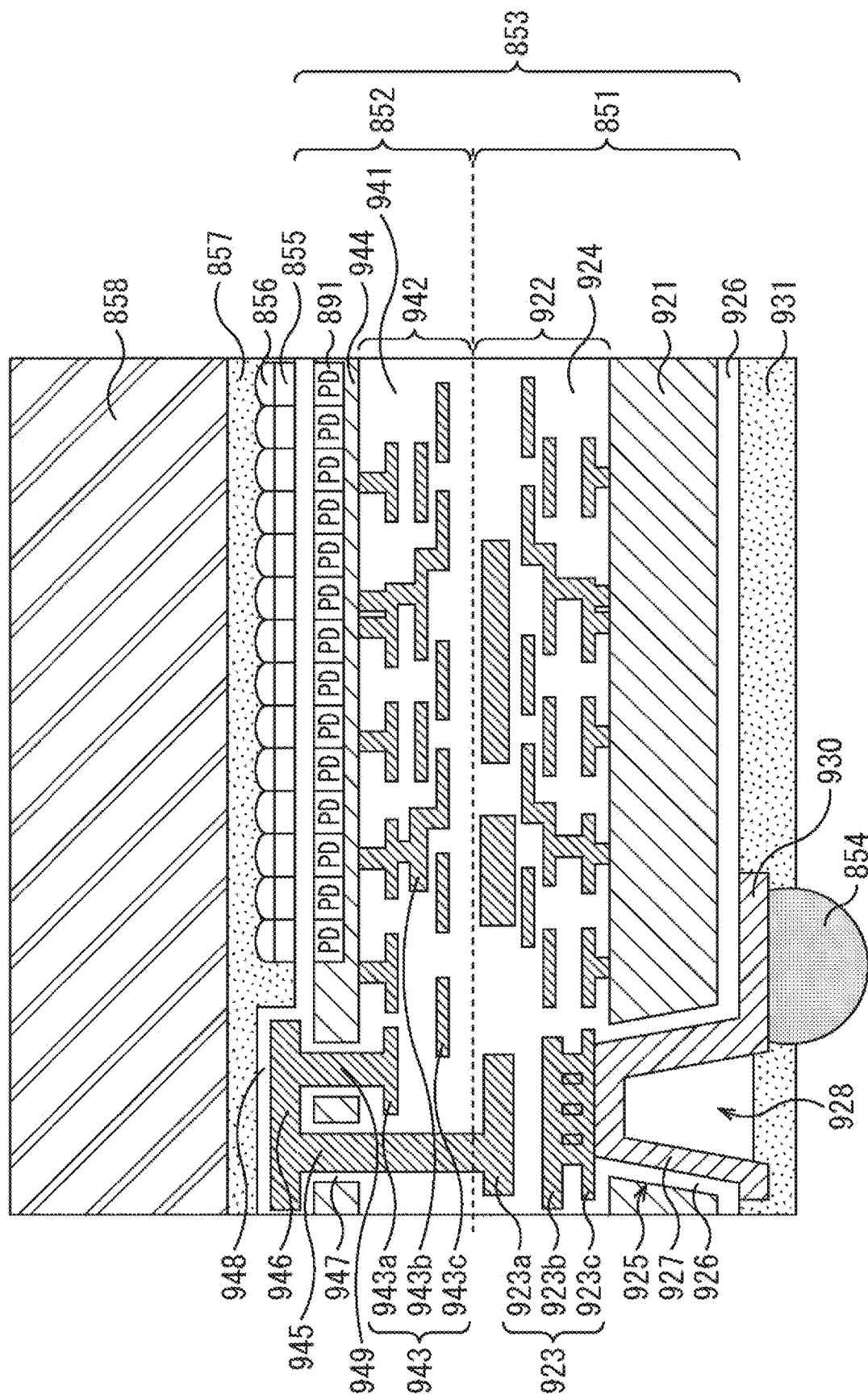
FIG. 47 is a diagram for explaining a second modification of the imaging device shown in FIG. 41.

Referring now to FIG. 47, a second modification of the imaging device 801 is described.

In the stack structure 853 in the second modification, a wiring layer 943 of the lower structure 852 and a wiring layer 923 of the upper structure 851 are connected by two through electrodes: a silicon through via 949 and a chip through via 945. A wiring layer 923 of the upper structure 851 and a solder ball (back surface electrode) 854 are connected by a through via (silicon through via) 928 and a rewiring line 930. With this arrangement, the plane area of the imaging device 801 can be minimized.

Further, the portion between the stack structure 853 and the glass protective substrate 858 is turned into a cavity-less structure, and the stack structure 853 and the protective substrate 858 are bonded to each other with the glass seal resin 857. Thus, the height can also be reduced.

Accordingly, with the imaging device 801 shown in FIG. 41, a smaller semiconductor device (semiconductor package) can be obtained.

Third Modification

Figure 48:
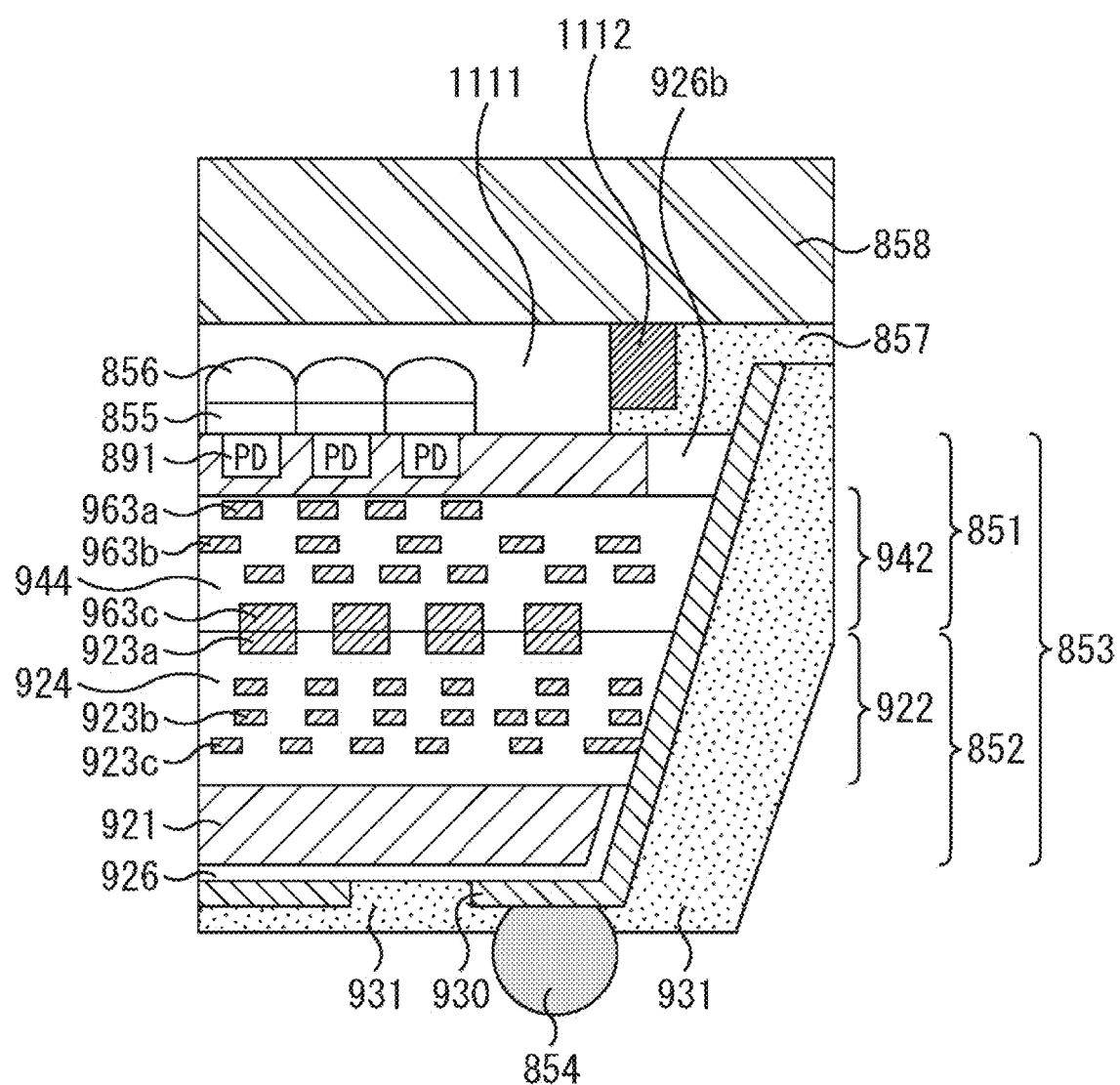
FIG. 48 is a diagram for explaining a third modification of the imaging device shown in FIG. 41.

Referring now to FIG. 48, a third modification of the imaging device 801 is described.

As shown in FIG. 48, the penetrating vias 928 are not necessarily required, and the penetrating vias 928 may be filled with a solder mask (solder resist) 931, and dicing may be performed at the formation positions of the through via 928.

The solder mask (solder resist) 931 and the rewiring line 930 are insulated from each other by an insulating film 926b. However, as long as the solder mask (solder resist) 931 and the rewiring line 930 are insulated from each other, a component other than the insulating film 926b may be used, and the glass seal resin 857 may be used for filling, for example.

Also, the glass seal resin 857, the insulating film 926b, and the solder mask (solder resist) 931 may all be formed with the same material, or some of them may be formed with the same material.

Further, the wiring layer 923c and the rewiring line 930 are electrically connected, but the rewiring line 930 may be connected to any wiring layer.

Note that, in the example shown in FIG. 48, a spacer 1112 is provided between the stack structure 853 and the glass protective substrate 858 so as to form a cavity (a hollow or a space) 1111. However, the spacer 1112 is not necessarily provided, and the cavity 1111 may be formed by the glass seal resin 857. Alternatively, the space of the cavity 1111 and the spacer 1112 may be filled with the glass seal resin 857, to obtain a cavity-less structure.

Also, in each imaging device 801 in FIGS. 41 through 48, the upper structure 851 and the lower structure 852 correspond to the lower chip 91 and the upper chip 92 in FIGS. 4 and 5. Accordingly, the imaging device 72 and the front camera ECU 73 may be formed with the imaging device 801 that is the WCSP described with reference to FIGS. 41 through 48.

8-7. Example of a Three-Layer Stack Structure

In each of the examples described above, the stack structure 853 of the imaging device 801 is formed with the two layers: the lower structure 852 and the upper structure 851. However, the stack structure 853 may be formed with three or more layers.

Figure 49:
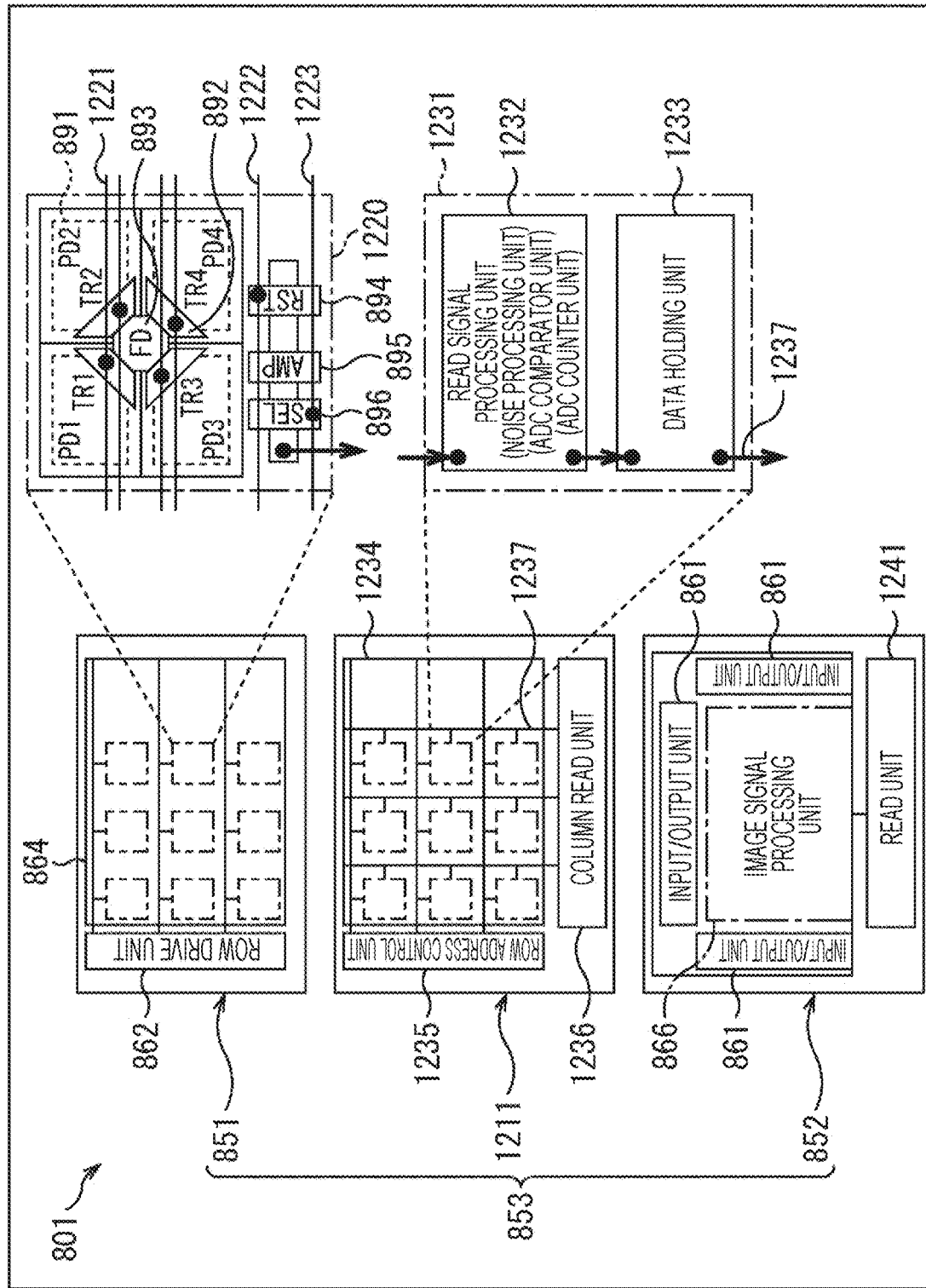
FIG. 49 is a diagram for explaining a schematic example structure in a case where an imaging device having a three-layer structure is formed with a WCSP.
Figure 50:
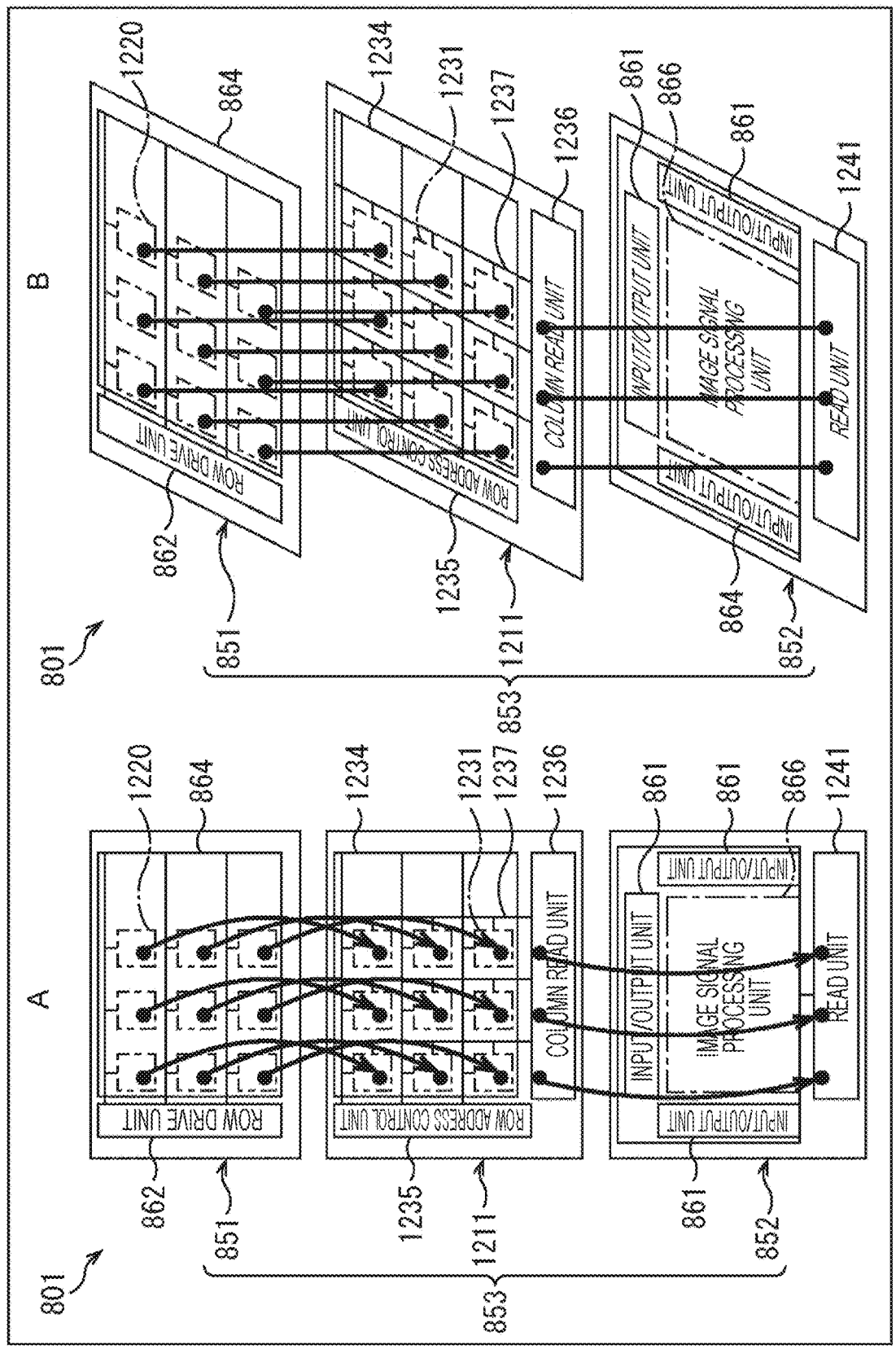
FIG. 50 is a diagram for explaining a schematic example structure in a case where an imaging device having a three-layer structure is formed with a WCSP.

Referring now to FIGS. 49 and 50, an example of the stack structure 853 formed with three layers is described. In this stack structure 853, a third structure 1211 is provided between the lower structure 852 and the upper structure 851.

FIG. 49 shows a configuration in which the pixel array unit 864 has a pixel sharing structure.

In the pixel sharing structure, each pixel 871 includes a photodiode (PD) 891 and a transfer transistor 892, but a floating diffusion (FD) 893, an amplification transistor 895, a reset transistor 894, and a selection transistor 896 are shared by a plurality of pixels.

FIG. 49 shows a sharing unit 1220 in which the four pixels including two pixels in the row direction and two pixels in the column direction (2×2) share a FD 893, an amplification transistor 895, a reset transistor 894, and a selection transistor 896.

Transfer transistor drive signal lines 1221 extending in the row direction are connected to the gate electrodes of four transfer transistors 892 one by one. The four transfer transistor drive signal lines 1221 that are connected to the gate electrodes of the four transfer transistors 892 and extend in the row direction are arranged in parallel in the column direction.

The FD 893 is connected to the gate electrode of the amplification transistor 895 and the diffusion layer of the reset transistor 894 via wiring lines (not shown). A reset transistor drive signal line 1222 extending in the row direction is connected to the gate electrode of the reset transistor 894.

A selection transistor drive signal line 1223 extending in the row direction is connected to the gate electrode of the selection transistor 896. The selection transistor 896 may be omitted in some cases.

The imaging device 801 having the three-layer stack structure 853 shown in FIG. 49 includes an area signal processing unit 1231 in the third structure 1211 between the lower structure 852 and the upper structure 851.

The area signal processing unit 1231 includes a read signal processing unit 1232 including a noise processing unit and an ADC, and a data holding unit 1233 that holes digital data subjected to AD conversion.

For example, in a case where each of the pixels 871 of the sharing unit 1220 outputs data represented by 16 bits after AD conversion, the data holding unit 1233 includes data holding means such as latches and shift registers for 64 bits, to hold the data.

The area signal processing unit 1231 further includes an output signal wiring line 1237 for outputting the data held in the data holding unit 1233 to the outside of the area signal processing unit 1231. This output signal wiring line may be a 64-bit signal line for outputting 64-bit data held in the data holding unit 1233 in parallel, may be a 16-bit signal line for outputting the data of four pixels held in the data holding unit 1233 pixel by pixel, or may be an 8-bit signal line for outputting half the data of one pixel or a 32-bit signal line for outputting the data of two pixels, for example. Alternatively, the output signal wiring line may be a 1-bit signal line for reading the data held in the data holding unit 1233 bit by bit.

In the imaging device 801 shown in FIG. 49, one sharing unit 1220 of the upper structure 851 is connected to one area signal processing unit 1231 of the third structure 1211. In other words, the sharing units 1220 and the area signal processing units 1231 have one-to-one correspondence. Therefore, as shown in FIG. 49, the third structure 1211 has an area signal processing unit array 1234 in which a plurality of area signal processing units 1231 are arranged in both the row direction and the column direction.

The third structure 1211 also includes a row address control unit 1235 that reads the data in the data holding units 1233 included in the respective area signal processing units 1231 arranged in plural in both the row direction and the column direction. The row address control unit 1235 determines a read position in the row direction, like a conventional semiconductor memory device.

The area signal processing units 1231 arranged in the row direction of the area signal processing unit array 1234 are connected to control signal lines extending in the row direction from the row address control unit 1235, and operations of the area signal processing units 1231 are controlled by the row address control unit 1235.

The area signal processing units 1231 arranged in the column direction of the area signal processing unit array 1234 are connected to column read signal lines 1237 extending in the column direction, and the column read signal lines are connected to a column read unit 1236 disposed ahead of the area signal processing unit array 1234.

As for the data held in the data holding units 1233 of the respective area signal processing units 1231 of the area signal processing unit array 1234, the data in the data holding units 1233 of all the area signal processing units 1231 arranged in the row direction may be simultaneously read out to the column read unit 1236, or only the data in a specific area signal processing unit 1231 designated from the column read unit 1236 may be read out.

A wiring line for outputting data read from the area signal processing units 1231 to the outside of the third structure 1211 is connected to the column readout unit 1236.

The lower structure 852 includes a read unit 1241 for receiving data output from the column read unit 1236, with a wiring line from the column read unit 1236 of the third structure 1211 being connected to the read unit 1241.

The lower structure 852 also includes an image signal processing unit for performing image signal processing on data received from the third structure 1211.

The lower structure 852 further includes an input/output unit for outputting data received from the third structure 1211 via the image signal processing unit or outputting the data not having passed through the image signal processing unit. This input/output unit may include not only an output circuit unit but also an input circuit unit for inputting the timing signal to be used in the pixel array unit 864 and the characteristic data to be used in the image signal processing unit, for example, from the outside of the imaging device 801 into the device.

As shown in B of FIG. 50, each sharing unit 1220 formed in the upper structure 851 is connected to the area signal processing unit 1231 of the third structure 1211 disposed immediately below the sharing unit 1220. The wiring connection between the upper structure 851 and the third structure 1211 can be achieved by the Cu—Cu direct junction structure shown in FIG. 44, for example.

Also, as shown in B of FIG. 50, the column read unit 1236 outside the area signal processing unit array 1234 formed in the third structure 1211 is connected to the read unit 1241 of the lower structure 852 disposed immediately below the column read unit 1236. The wiring connection between the third structure 1211 and the lower structure 852 can be achieved by the Cu—Cu direct junction structure shown in FIG. 44 or the twin contact structure shown in FIG. 43, for example.

Accordingly, as shown in A of FIG. 50, pixel signals of the respective sharing units 1220 formed in the upper structure 851 are output to the corresponding area signal processing units 1231 of the third structure 1211. The data held in the data holding units 1233 of the area signal processing units 1231 is output from the column reading unit 1236, and is supplied to the read unit 1241 of the lower structure 852. In the image signal processing unit, various kinds of signal processing (a tone curve correction process, for example) are then performed on the data, and the resultant data is output from the input/output unit to the outside of the device.

Note that, in the imaging device 801 with the three-layer stack structure 853, the input/output unit formed in the lower structure 852 may be disposed below the row address control unit 1235 of the third structure 1211.

Also, in the imaging device 801 with the three-layer stack structure 853, the input/output unit formed in the lower structure 852 may be disposed below the area signal processing units 1231 of the third structure 1211.

Further, in the imaging device 801 with the three-layer stack structure 853, the input/output unit formed in the lower structure 852 may be disposed below the pixel array unit 864 of the upper structure 851.

Note that the imaging device 801 having the three-layer stack structure 853 formed with the lower structure 852, the upper structure 851, and the third structure 1211 shown in FIGS. 49 and 50 corresponds to the first through third layer chips 501 through 503 shown in FIGS. 32 through 35. Accordingly, the imaging device 72 and the front camera ECU 73 with the three stacked chips shown in FIGS. 32 through 35 may be formed with the imaging device 801 that is a WCSP formed with the three-layer stack structure 853 described above with reference to FIGS. 49 and 50.

Note that the above embodiments can be appropriately combined. Specifically, the Cu—Cu junction described with reference to the fourth embodiment can also be applied to the TSVs 512 in another embodiment such as the floor plan of the fifth embodiment in which three chips are stacked, for example.

9. Example Application to an Electronic Apparatus

The above described imaging device 72 and front camera ECU 73 shown in FIGS. 5 and 18, or the imaging device 72 that includes some of the functions of the front camera ECU 73 and is capable of failure detection independently can be used in various kinds of electronic apparatuses, such as imaging apparatuses like digital still cameras and digital video cameras, portable telephone devices having imaging functions, and other apparatuses having imaging functions, for example.

Figure 51:
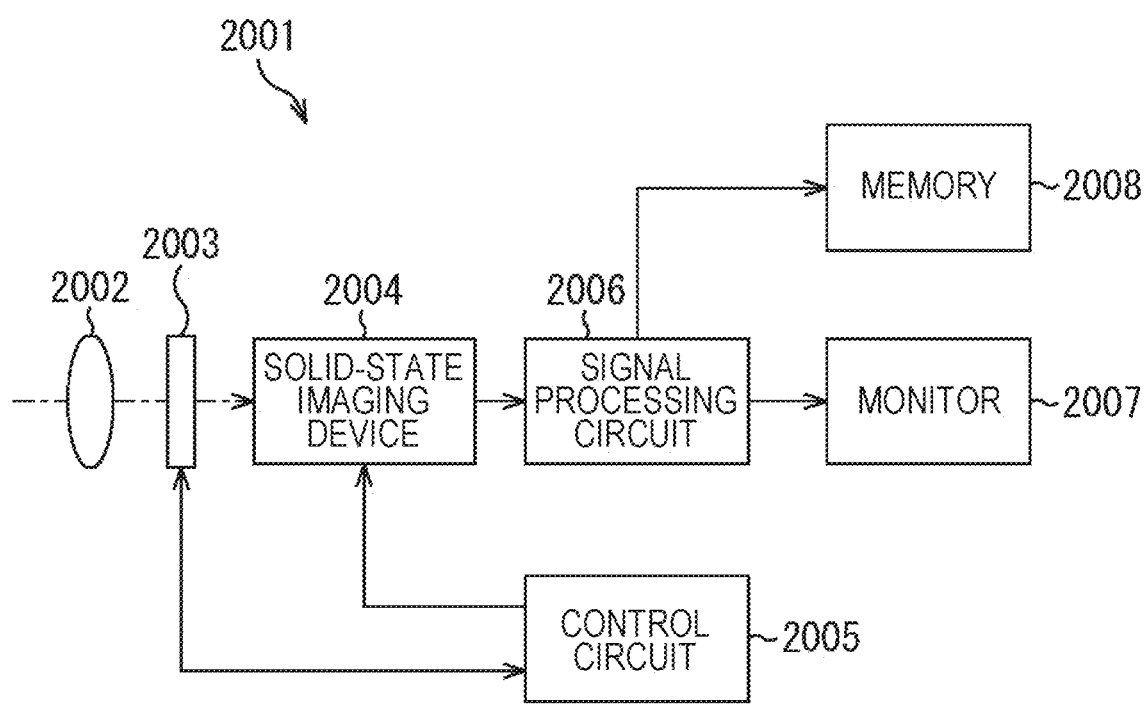
FIG. 51 is a block diagram showing an example configuration of an imaging apparatus as an electronic apparatus in which a front camera module according to the present disclosure is used.

FIG. 51 is a block diagram showing an example configuration of an imaging apparatus as an electronic apparatus to which the present technology is applied.

The imaging apparatus 2001 shown in FIG. 51 includes an optical system 2002, a shutter device 2003, a solid-state imaging device 2004, a control circuit 2005, a signal processing circuit 2006, a monitor 2007, and a memory 2008, and can take still images and moving images.

The optical system 2002 includes one or more lenses to guide light (incident light) from an object to the solid-state imaging device 2004, and form an image on the light receiving surface of the solid-state imaging device 2004.

The shutter device 2003 is placed between the optical system 2002 and the solid-state imaging device 2004, and, under the control of the control circuit 2005, controls the light emission period and the light blocking period for the solid-state imaging device 2004.

The solid-state imaging device 2004 is formed with a package containing the above described solid-state imaging device. In accordance with light that is emitted to form an image on the light receiving surface via the optical system 2002 and the shutter device 2003, the solid-state imaging device 2004 accumulates signal charges for a certain period of time. The signal charges accumulated in the solid-state imaging device 2004 are transferred in accordance with a drive signal (timing signal) supplied from the control circuit 2005.

The control circuit 2005 outputs the drive signal that controls the transfer operation of the solid-state imaging device 2004 and the shutter operation of the shutter device 2003, to drive the solid-state imaging device 2004 and the shutter device 2003.

The signal processing circuit 2006 performs various kinds of signal processing on signal charges that are output from the solid-state imaging device 2004. The image (image data) obtained through the signal processing performed by the signal processing circuit 2006 is supplied to and displayed on the monitor 2007, or is supplied to and stored (recorded) into the memory 2008.

In the imaging apparatus 2001 designed as above, the imaging device 72 and the front camera ECU 73 shown in FIGS. 5 and 18 can also be used in place of the above described solid-state imaging device 2004 and signal processing circuit 2006, or the imaging device 72 that includes some of the functions of the front camera ECU 73 and is capable of failure detection independently can also be used in place of the solid-state imaging device 2004. Thus, the imaging apparatus 2001 becomes capable of failure detection independently.

10. Examples of Use of the Imaging Device

Figure 52:
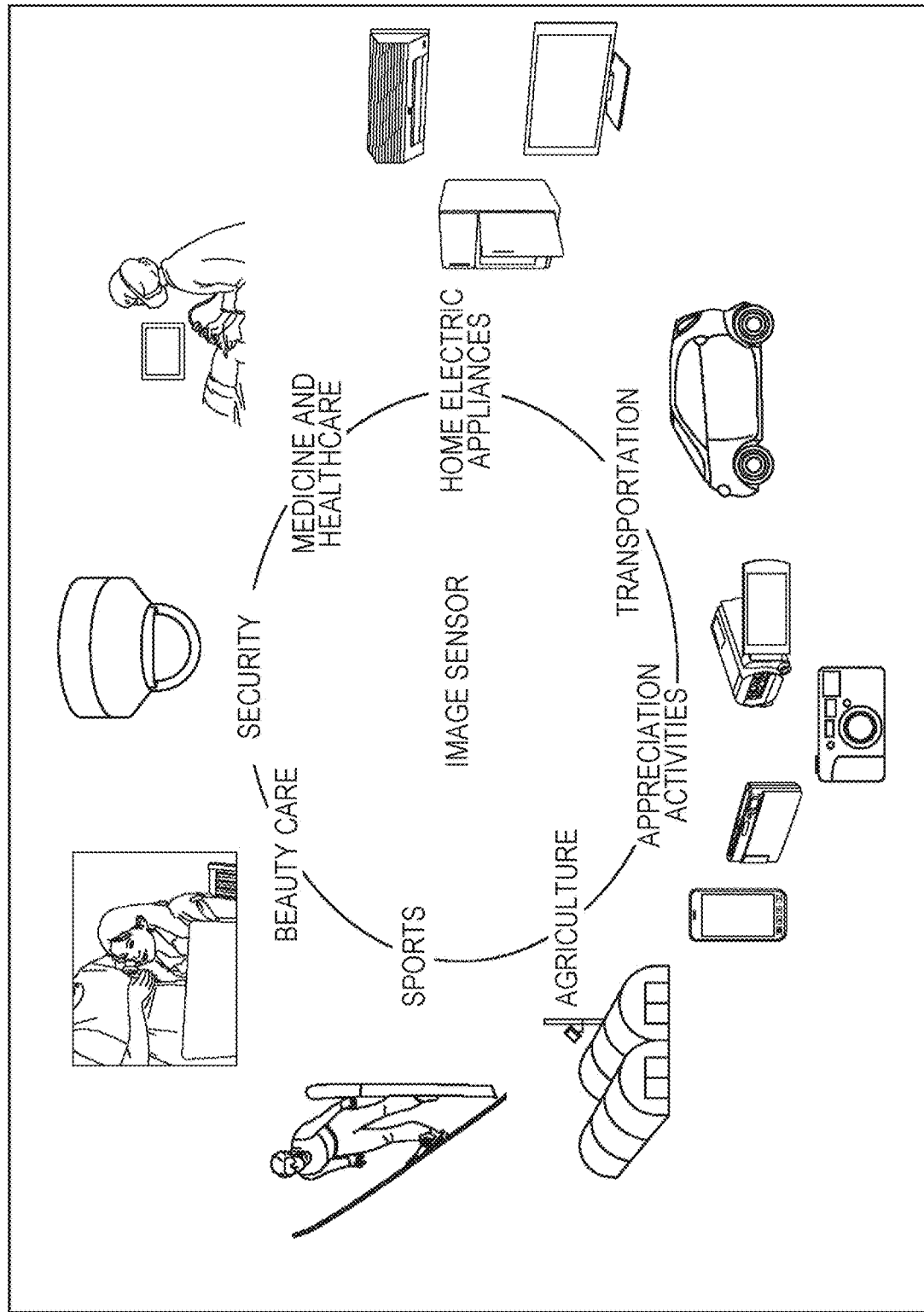
FIG. 52 is a diagram for explaining examples of use of a front camera module to which the technique of the present disclosure is applied.

FIG. 52 is a diagram showing examples of use of the imaging device 72 and the front camera ECU 73 shown in FIGS. 5 and 18, or the imaging device 72 that includes some of the functions of the front camera ECU 73 and is capable of failure detection independently.

The above described camera module can be used in various cases where light such as visible light, infrared light, ultraviolet light, or an X-ray is sensed, as described below, for example.

- Devices configured to take images for appreciation activities, such as digital cameras and portable devices with camera functions.
- Devices for transportation use, such as vehicle-mounted sensors configured to take images of the front, the back, the surroundings, the inside, and the like of an automobile to perform safe driving like an automatic stop, recognize a driver's condition and the like, surveillance cameras for monitoring running vehicles and roads, and ranging sensors for measuring distances between vehicles or the like.
- Devices to be used in conjunction with home electric appliances, such as television sets, refrigerators, and air conditioners, to take images of gestures of users and operate the appliances in accordance with the gestures.
- Devices for medical care use and health care use, such as endoscopes and devices for receiving infrared light for angiography.
- Devices for security use, such as surveillance cameras for crime prevention and cameras for personal authentication.
- Devices for beauty care use, such as skin measurement devices configured to image the skin and microscopes for imaging the scalp.
- Devices for sporting use, such as action cameras and wearable cameras for sports or the like.
- Devices for agricultural use such as cameras for monitoring conditions of fields and crops.

11. Example Applications to Moving Objects

The technology according to the present disclosure (the present technology) can be applied to various products. For example, the technology according to the present disclosure may be embodied as an apparatus mounted on any type of moving object, such as an automobile, an electrical vehicle, a hybrid electrical vehicle, a motorcycle, a bicycle, a personal mobility device, an airplane, a drone, a vessel, or a robot.

Figure 53:
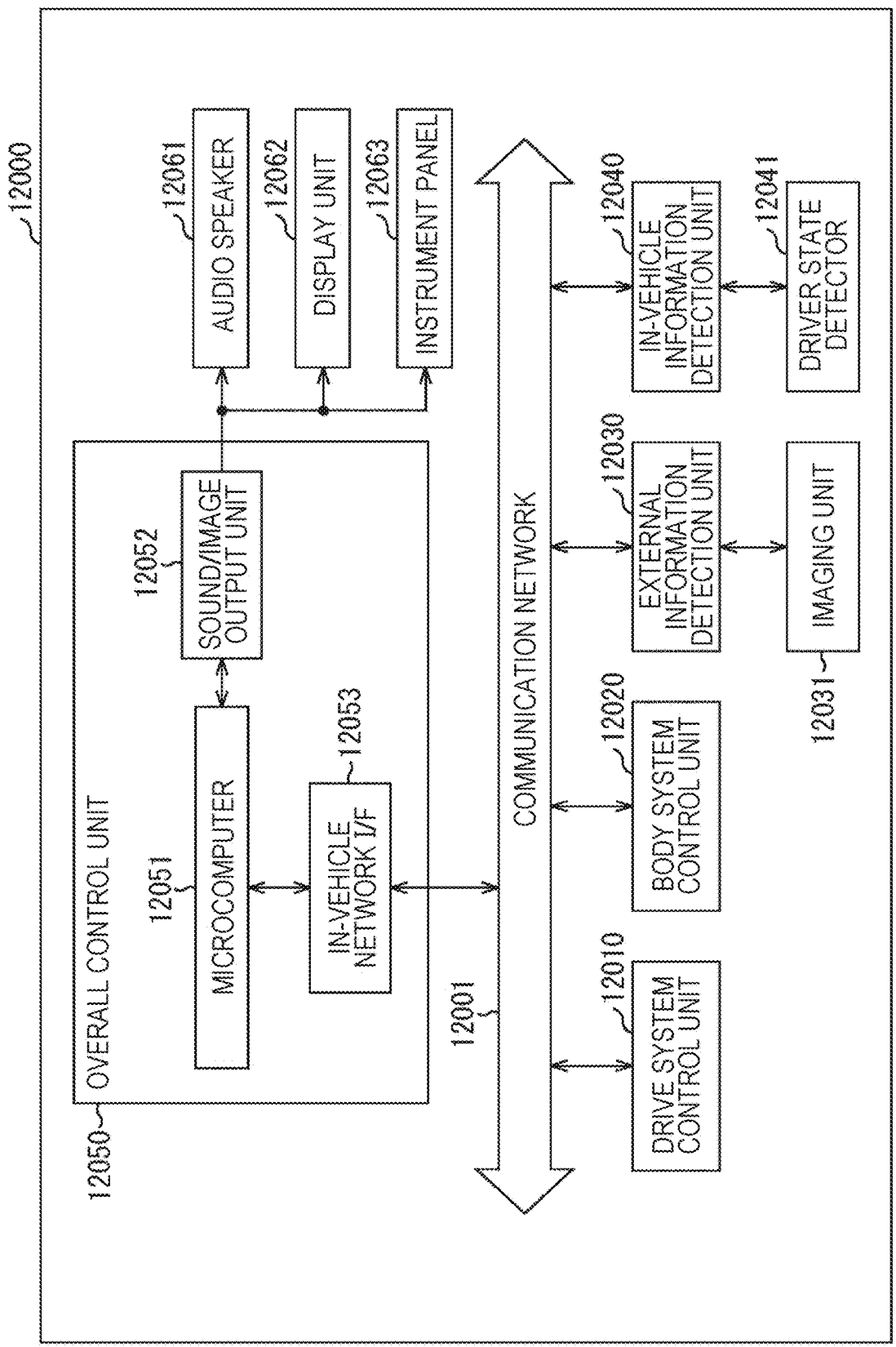
FIG. 53 is a block diagram schematically showing an example configuration of a vehicle control system.

FIG. 53 is a block diagram schematically showing an example configuration of a vehicle control system that is an example of a moving object control system to which the technology according to the present disclosure can be applied.

The vehicle control system 12000 includes a plurality of electronic control units connected via a communication network 12001. In the example shown in FIG. 53, the vehicle control system 12000 includes a drive system control unit 12010, a body system control unit 12020, an external information detection unit 12030, an in-vehicle information detection unit 12040, and an overall control unit 12050. A microcomputer 12051, a sound/image output unit 12052, and an in-vehicle network interface (I/F) 12053 are also shown as the functional components of the overall control unit 12050.

The drive system control unit 12010 controls operations of the devices related to the drive system of the vehicle according to various programs. For example, the drive system control unit 12010 functions as control devices such as a driving force generation device for generating a driving force of the vehicle such as an internal combustion engine or a driving motor, a driving force transmission mechanism for transmitting the driving force to the wheels, a steering mechanism for adjusting the steering angle of the vehicle, and a braking device for generating a braking force of the vehicle.

The body system control unit 12020 controls operations of the various devices mounted on the vehicle body according to various programs. For example, the body system control unit 12020 functions as a keyless entry system, a smart key system, a power window device, or a control device for various lamps such as a headlamp, a backup lamp, a brake lamp, a turn signal lamp, and a fog lamp. In this case, the body system control unit 12020 can receive radio waves transmitted from a portable device that substitutes for a key, or signals from various switches. The body system control unit 12020 receives inputs of these radio waves or signals, and controls the door lock device, the power window device, the lamps, and the like of the vehicle.

The external information detection unit 12030 detects information outside the vehicle equipped with the vehicle control system 12000. For example, an imaging unit 12031 is connected to the external information detection unit 12030. The external information detection unit 12030 causes the imaging unit 12031 to capture an image of the outside of the vehicle, and receives the captured image. In accordance with the received image, the external information detection unit 12030 may perform an object detection process for detecting a person, a vehicle, an obstacle, a sign, characters on the road surface, or the like, or perform a distance detection process.

The imaging unit 12031 is an optical sensor that receives light, and outputs an electrical signal corresponding to the amount of received light. The imaging unit 12031 can output an electrical signal as an image, or output an electrical signal as distance measurement information. Further, the light to be received by the imaging unit 12031 may be visible light, or may be invisible light such as infrared light.

The in-vehicle information detection unit 12040 detects information about the inside of the vehicle. For example, a driver state detector 12041 that detects the state of the driver is connected to the in-vehicle information detection unit 12040. The driver state detector 12041 includes a camera that captures an image of the driver, for example, and, in accordance with detected information input from the driver state detector 12041, the in-vehicle information detection unit 12040 may calculate the degree of fatigue or the degree of concentration of the driver, or determine whether the driver is dozing off.

In accordance with the external/internal information acquired by the external information detection unit 12030 or the in-vehicle information detection unit 12040, the microcomputer 12051 can calculate the control target value of the driving force generation device, the steering mechanism, or the braking device, and output a control command to the drive system control unit 12010. For example, the microcomputer 12051 can perform cooperative control to achieve the functions of an advanced driver assistance system (ADAS), including vehicle collision avoidance or impact mitigation, follow-up running based on the distance between vehicles, vehicle speed maintenance running, vehicle collision warning, vehicle lane deviation warning, or the like.

The microcomputer 12051 can also perform cooperative control to conduct automatic driving or the like for autonomously running not depending on the operation of the driver, by controlling the driving force generation device, the steering mechanism, the braking device, or the like in accordance with information about the surroundings of the vehicle, the information having being acquired by the external information detection unit 12030 or the in-vehicle information detection unit 12040.

The microcomputer 12051 can also output a control command to the body system control unit 12020, in accordance with the external information acquired by the external information detection unit 12030. For example, the microcomputer 12051 controls the headlamp in accordance with the position of the leading vehicle or the oncoming vehicle detected by the external information detection unit 12030, and performs cooperative control to achieve an anti-glare effect by switching from a high beam to a low beam, or the like.

The sound/image output unit 12052 transmits an audio output signal and/or an image output signal to an output device that is capable of visually or audibly notifying the passenger(s) of the vehicle or the outside of the vehicle of information. In the example shown in FIG. 53, an audio speaker 12061, a display unit 12062, and an instrument panel 12063 are shown as output devices. The display unit 12062 may include an on-board display and/or a head-up display, for example.

Figure 54:
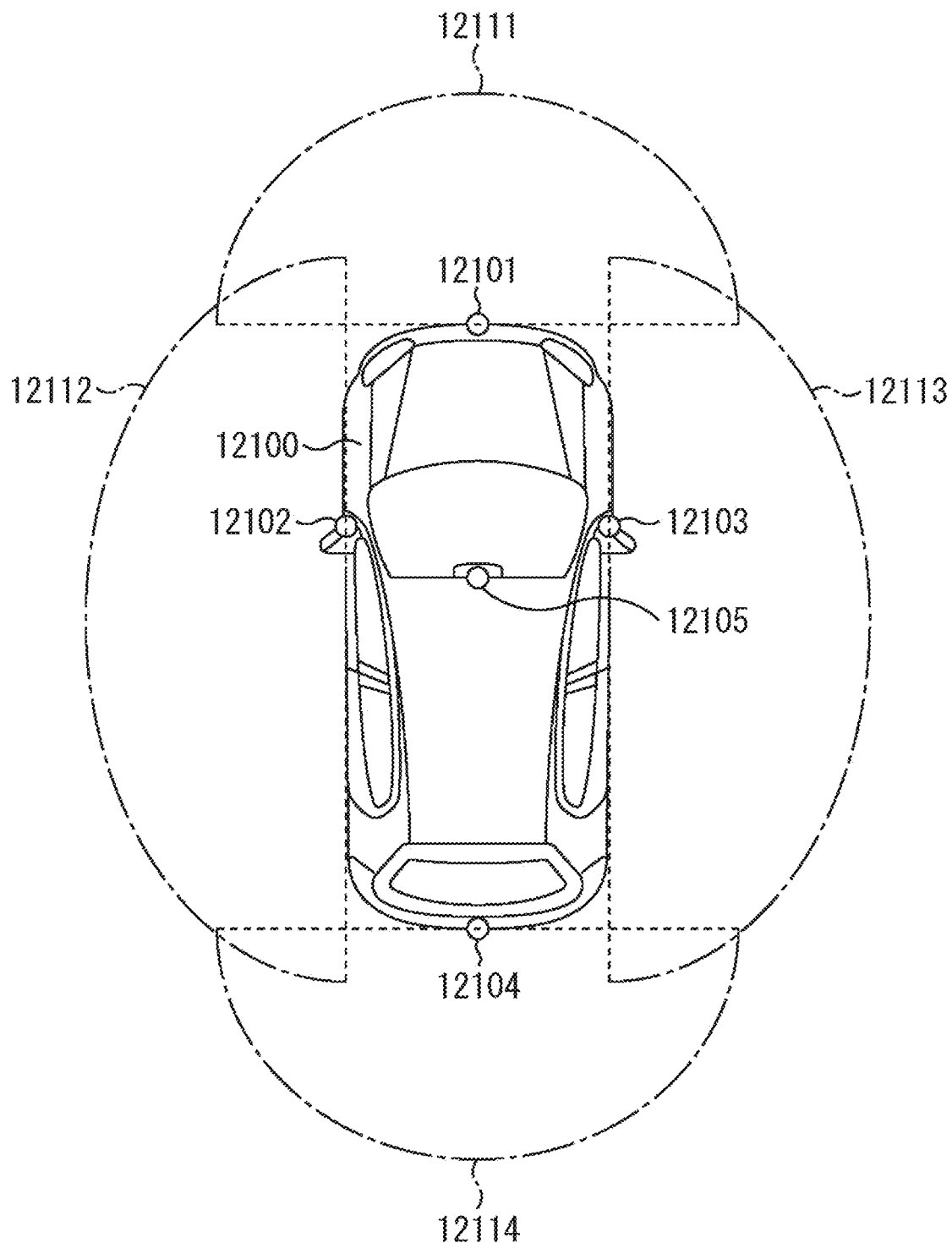
FIG. 54 is an explanatory diagram showing an example of the installation positions of imaging units.

FIG. 54 is a diagram showing an example of the installation position of the imaging unit 12031.

In FIG. 54, imaging units 12101, 12102, 12103, 12104, and 12105 are included as the imaging unit 12031.

Imaging units 12101, 12102, 12103, 12104, and 12105 are provided at the following positions: the front end edge of a vehicle 12100, a side mirror, the rear bumper, a rear door, an upper portion of the front windshield inside the vehicle, and the like, for example. The imaging unit 12101 provided on the front end edge and the imaging unit 12105 provided on the upper portion of the front windshield inside the vehicle mainly capture images ahead of the vehicle 12100. The imaging units 12102 and 12103 provided on the side mirrors mainly capture images on the sides of the vehicle 12100. The imaging unit 12104 provided on the rear bumper or a rear door mainly captures images behind the vehicle 12100. The imaging unit 12105 provided on the upper portion of the front windshield inside the vehicle is mainly used for detection of a vehicle running in front of the vehicle, a pedestrian, an obstacle, a traffic signal, a traffic sign, a lane, or the like.

Note that FIG. 54 shows an example of the imaging ranges of the imaging units 12101 through 12104. An imaging range 12111 indicates the imaging range of the imaging unit 12101 provided on the front end edge, imaging ranges 12112 and 12113 indicate the imaging ranges of the imaging units 12102 and 12103 provided on the respective side mirrors, and an imaging range 12114 indicates the imaging range of the imaging unit 12104 provided on the rear bumper or a rear door. For example, image data captured by the imaging units 12101 through 12104 are superimposed on one another, so that an overhead image of the vehicle 12100 viewed from above is obtained.

At least one of the imaging units 12101 through 12104 may have a function of acquiring distance information. For example, at least one of the imaging units 12101 through 12104 may be a stereo camera including a plurality of imaging devices, or may be an imaging device having pixels for phase difference detection.

For example, in accordance with distance information obtained from the imaging units 12101 through 12104, the microcomputer 12051 calculates the distances to the respective three-dimensional objects within the imaging ranges 12111 through 12114, and temporal changes in the distances (the speeds relative to the vehicle 12100). In this manner, the three-dimensional object that is the closest three-dimensional object on the traveling path of the vehicle 12100 and is traveling at a predetermined speed (0 km/h or higher, for example) in substantially the same direction as the vehicle 12100 can be extracted as the vehicle running in front of the vehicle 12100. Further, the microcomputer 12051 can set beforehand an inter-vehicle distance to be maintained in front of the vehicle running in front of the vehicle 12100, and can perform automatic brake control (including follow-up stop control), automatic acceleration control (including follow-up start control), and the like. In this manner, it is possible to perform cooperative control to conduct automatic driving or the like to autonomously travel not depending on the operation of the driver.

For example, in accordance with the distance information obtained from the imaging units 12101 through 12104, the microcomputer 12051 can extract three-dimensional object data concerning three-dimensional objects under the categories of two-wheeled vehicles, regular vehicles, large vehicles, pedestrians, utility poles, and the like, and use the three-dimensional object data in automatically avoiding obstacles. For example, the microcomputer 12051 classifies the obstacles in the vicinity of the vehicle 12100 into obstacles visible to the driver of the vehicle 12100 and obstacles difficult to visually recognize. The microcomputer 12051 then determines collision risks indicating the risks of collision with the respective obstacles. If a collision risk is equal to or higher than a set value, and there is a possibility of collision, the microcomputer 12051 outputs a warning to the driver via the audio speaker 12061 and the display unit 12062, or can perform driving support for avoiding collision by performing forced deceleration or avoiding steering via the drive system control unit 12010.

At least one of the imaging units 12101 through 12104 may be an infrared camera that detects infrared light. For example, the microcomputer 12051 can recognize a pedestrian by determining whether or not a pedestrian exists in images captured by the imaging units 12101 through 12104. Such pedestrian recognition is carried out through a process of extracting feature points from the images captured by the imaging units 12101 through 12104 serving as infrared cameras, and a process of performing a pattern matching on the series of feature points indicating the outlines of objects and determining whether or not there is a pedestrian, for example. If the microcomputer 12051 determines that a pedestrian exists in the images captured by the imaging units 12101 through 12104, and recognizes a pedestrian, the sound/image output unit 12052 controls the display unit 12062 to display a rectangular contour line for emphasizing the recognized pedestrian in a superimposed manner. The sound/image output unit 12052 may also control the display unit 12062 to display an icon or the like indicating the pedestrian at a desired position.

An example of a vehicle control system to which the technique according to the present disclosure can be applied has been described above. The technique according to the present disclosure can be applied to the imaging unit 12031 and the external information detection unit 12030 in the above described configuration. Specifically, the imaging device 72 and the front camera ECU 73 shown in FIGS. 5 and 18, or the imaging device 72 that includes some of the functions of the front camera ECU 73 and is capable of failure detection independently can be used as the imaging unit 12031 and the external information detection unit 12030. As the technology according to the present disclosure is applied to the imaging unit 12031 and the external information detection unit 12030, it becomes possible to detect a failure. Accordingly, it becomes possible to stop driving support based on information from the imaging unit 12031 having a failure therein or the external information detection unit 12030 having a failure therein. Thus, it becomes possible to avoid a dangerous situation caused by wrong driving support based on wrong information.

It should be noted that the present disclosure may also be embodied in the configurations described below.

<1> An imaging apparatus including:

a first substrate including a pixel and a pixel control line; and a second substrate, the first substrate and the second substrate being stacked on each other, in which the second substrate includes a row drive unit and a failure detector, one end of the pixel control line is connected to the row drive unit via a first connection electrode, the other end of the pixel control line is connected to the failure detector via a second connection electrode, the row drive unit supplies a control signal for controlling operation of the pixel to the pixel control line via the first connection electrode, and the failure detector detects a failure in accordance with the control signal supplied via the first connection electrode, the pixel control line, and the second connection electrode.

<2> The imaging apparatus according to <1>, in which the first connection electrode and the second connection electrode are formed with through electrodes penetrating through the first substrate and the second substrate, and the first substrate and the second substrate are stacked and are electrically connected by the through electrodes.

<3> The imaging apparatus according to <1> or <2>, in which the pixels are arranged in an array, the imaging apparatus further includes a control unit that outputs address information about a current target among the pixels and information about timing at which the pixel specified by the address information is controlled, and the failure detector includes:

a detector that detects the control signal for controlling operation of the pixel and outputs a detection signal, the control signal being supplied from the row drive unit specified by the address information output from the control unit; and a pulse output failure detector that detects a failure in a pulse output of the control signal, depending on whether or not the detection signal is output when the control signal for controlling operation of the pixel specified by the address information output from the control unit is detected by the detector at the timing at which the pixel specified by the address information is controlled.

<4> The imaging apparatus according to <3>, in which the detector includes a switching gate that detects the control signal for controlling operation of the pixel, the switching gate being specified by the address information output from the control unit, and supplies electric power only to the switching gate specified by the address information output from the control unit, when having detected the control signal for controlling operation of the pixel, the switching gate outputs a Hi signal to a bus set for each corresponding control signal, and the pulse output failure detector includes a plurality of holding units that hold a value for each control signal, the value depending on a signal output to the bus set for each control signal and a signal indicating the timing at which the pixel specified by the address information is controlled, and detects a failure in a pulse output of the control signal, in accordance with the value held by the holding units.

<5> The imaging apparatus according to <4>, in which the plurality of holding units hold a value for each control signal, the value depending on a signal output to the bus set for each control signal and a fixed signal indicating that the pixel specified by the address information is in a controlled state, and the pulse output failure detector detects a failure in a pulse output of the control signal, in accordance with the value held by the holding units.

<6> The imaging apparatus according to <3>, in which the row drive unit and the first substrate are connected by the first connection electrode formed with a through electrode, and the detector and the first substrate are electrically connected by the second connection electrode formed with another through electrode different from the through electrode.

<7> The imaging apparatus according to <3>, in which the control unit outputs the address information about the current target among the pixels to the row drive unit and the detector, the row drive unit outputs selection information about an address of the row drive unit, the selection information corresponding to the address information, the detector outputs selection information about an address of the detector, the selection information corresponding to the address information, the failure detector includes an address select function failure detector that compares the selection information about the address of the row drive unit and the selection information about the address of the detector with the address information output from the control unit, and, in accordance with a result of the comparison, detects a failure in an address select function in the row drive unit and the detector.

<8> An imaging method implemented in an imaging apparatus including:

a first substrate including a pixel and a pixel control line; and a second substrate, the first substrate and the second substrate being stacked on each other, the second substrate including a row drive unit and a failure detector, one end of the pixel control line being connected to the row drive unit via a first connection electrode, the other end of the pixel control line being connected to the failure detector via a second connection electrode, the imaging method including the steps of:

the row drive unit supplying a control signal for controlling operation of the pixel to the pixel control line via the first connection electrode; and the failure detector detecting a failure in accordance with the control signal supplied via the first connection electrode, the pixel control line, and the second connection electrode.

<9> A camera module including:

a first substrate including a pixel and a pixel control line; and a second substrate, the first substrate and the second substrate being stacked on each other, in which the second substrate includes a row drive unit and a failure detector, one end of the pixel control line is connected to the row drive unit via a first connection electrode, the other end of the pixel control line is connected to the failure detector via a second connection electrode, the row drive unit supplies a control signal for controlling operation of the pixel to the pixel control line via the first connection electrode, and the failure detector detects a failure in accordance with the control signal supplied via the first connection electrode, the pixel control line, and the second connection electrode.

<10> An electronic apparatus including:

a first substrate including a pixel and a pixel control line; and a second substrate, the first substrate and the second substrate being stacked on each other, in which the second substrate includes a row drive unit and a failure detector, one end of the pixel control line is connected to the row drive unit via a first connection electrode, the other end of the pixel control line is connected to the failure detector via a second connection electrode, the row drive unit supplies a control signal for controlling operation of the pixel to the pixel control line via the first connection electrode, and the failure detector detects a failure in accordance with the control signal supplied via the first connection electrode, the pixel control line, and the second connection electrode.

<11> An imaging apparatus including:

a first substrate including a pixel and a vertical signal line connected to the pixel; and a second substrate, the first substrate and the second substrate being stacked on each other, in which the second substrate includes a signal supply circuit, an analog-to-digital conversion circuit, and a failure detector, one end of the vertical signal line is connected to the signal supply circuit via a first connection electrode, the other end of the vertical signal line is connected to the analog-to-digital conversion circuit via a second connection electrode, the signal supply circuit supplies a dummy pixel signal to the vertical signal line via the first connection electrode, the analog-to-digital conversion circuit outputs a digital signal in accordance with the dummy pixel signal, and the failure detector detects a failure in accordance with the digital signal.

<12> An imaging apparatus including:

a first substrate on which a pixel is mounted; and a second substrate on which a signal processing unit that performs signal processing on an image captured by the pixel is mounted, in which the first substrate and the second substrate are stacked and are electrically connected, and the signal processing unit detects a failure through the signal processing.

REFERENCE SIGNS LIST

11 Vehicle
31 ECU
32 Front camera module
33 Steering wheel
34 Headlamp
35 Motor
36 Engine
37 Brake
38 Display unit
71 Lens
72 Imaging device
73 Front camera ECU 74 MCU
91 Lower chip
92 Upper chip
93, 93-1, 93-2, 93-11, 93-12 TCV
101 Pixel array
102 Row drive unit
103 Image signal output unit
121 Control unit
122 Image processing unit
123 Output unit
124 Failure detector
141 Row address selecting function failure detector
142 Pulse output failure detector
143 Control line gate
161 Address decoder
162 Shutter address latch
163 Read address latch
164 to 168 Switching gate
169, 170 Inverter
181 Failure determination unit
182 to 186 Latch
191 to 195 Latch
201 Failure detection column
202 Pixel control line failure detector
230 Photodiode
231 Transfer transistor
232 Reset transistor
233 FD
234 Amplification transistor
235 Selection transistor
241 Load MOS
242 ADC
243 Horizontal transfer unit
250 DSF circuit
251 Switch transistor
252 DSF transistor
261 Comparator
262 Counter
263 DAC
271 ADC+TCV failure detector

The invention claimed is:

1. A light detecting device comprising:
first and second substrates;
an array of imaging pixels in the first substrate, wherein each imaging pixel comprises a photodiode;
row drive circuitry in the second substrate, wherein the row drive circuitry is configured to provide row control signals to the array of imaging pixels; and
failure detection circuitry in the first substrate configured to receive the row control signals from the row drive circuitry via a first connection portion,
wherein first circuitry of the failure detection circuitry does not include a photodiode and includes a first transistor coupled between a voltage supply line and a column signal line.

2. The light detecting device of claim 1, wherein an output signal of the first circuitry is inputted to an analog-to-digital converter in the second substrate via the column signal line, wherein the analog-to-digital converter is configured to convert an output signal of the failure detection circuitry into a digital signal.

3. The light detecting device of claim 2, wherein the digital signal is checked, to determine whether it has a predetermined value, by a failure detector in the second substrate.

4. The light detecting device of claim 1, wherein the first transistor is a select transistor.

5. The light detecting device of claim 4, wherein a gate of the select transistor is configured to receive a row select control signal of the row control signals.

6. The light detecting device of claim 4, wherein the first circuitry includes a second transistor coupled to the first transistor, and
a gate of the second transistor is configured to receive a transfer control signal of the row control signals.

7. The light detecting device of claim 4, wherein at least one of the imaging pixels includes a floating diffusion region, a transfer transistor coupled between the photodiode and the floating diffusion region, a source follower transistor coupled to the floating diffusion region, a reset transistor coupled to the floating diffusion region, and a row select transistor coupled to the source follower transistor.

8. The light detecting device of claim 1, wherein the failure detection circuitry is disposed along a column of the array of imaging pixels.

9. The light detecting device of claim 1, wherein a plurality of connection portions including the first connection portion is disposed along a column of the array of imaging pixels.

10. The light detecting device of claim 1, further comprising output circuitry configured to output an error signal.

11. A light detecting device comprising:
first and second substrates;
an array of imaging pixels in the first substrate, wherein each imaging pixel comprises a photodiode;
row drive circuitry in the second substrate, wherein the row drive circuitry is configured to provide row control signals to the array of imaging pixels; and
failure detection circuitry in the first substrate configured to receive the row control signals from the row drive circuitry via a first connection portion,
wherein first circuitry of the failure detection circuitry includes first and second transistors coupled between a voltage supply line and a column signal line.

12. The light detecting device of claim 11, wherein an output signal of the first circuitry is inputted to an analog-to-digital converter in the second substrate via the column signal line, wherein the analog-to-digital converter is configured to convert an output signal of the failure detection circuitry into a digital signal.

13. The light detecting device of claim 12, wherein the digital signal is checked, to determine whether it has a predetermined value, by a failure detector in the second substrate.

14. The light detecting device of claim 11, wherein the first transistor is a select transistor, and the second transistor is a source follower transistor.

15. The light detecting device of claim 14, wherein a gate of the select transistor is configured to receive a row select control signal of the row control signals.

16. The light detecting device of claim 14, wherein a gate of the second transistor is configured to receive a transfer control signal of the row control signals.

17. The light detecting device of claim 11, wherein at least one of the imaging pixels includes a floating diffusion region, a transfer transistor coupled between the photodiode and the floating diffusion region, a source follower transistor coupled to the floating diffusion region, a reset transistor coupled to the floating diffusion region, and a row select transistor coupled to the source follower transistor.

18. The light detecting device of claim 11, wherein the failure detection circuitry is disposed along a column of the array of imaging pixels.

19. The light detecting device of claim 11, wherein a plurality of connection portions including the first connection portion is disposed along a column of the array of imaging pixels.

20. The light detecting device of claim 11, further comprising output circuitry configured to output an error signal.

* * * * *